(12) United States Patent
Kortunov et al.

(10) Patent No.: US 11,156,570 B2
(45) Date of Patent: Oct. 26, 2021

(54) METHODS USING ADVANCED NMR ANALYSIS FOR CORE SAMPLES

(71) Applicant: ExxonMobil Upstream Research Company, Spring, TX (US)

(72) Inventors: Pavel Kortunov, Flemington, NJ (US); Hubert E. King, Flemington, NJ (US); Harry W. Deckman, Clinton, NJ (US)

(73) Assignee: ExxonMobil Upstream Research Company, Spring, TX (US)

(*) Notice: Subject to any disclaimer, the term of this patent is extended or adjusted under 35 U.S.C. 154(b) by 8 days.

(21) Appl. No.: 16/824,006

(22) Filed: Mar. 19, 2020

(65) Prior Publication Data

US 2020/0363356 A1    Nov. 19, 2020

Related U.S. Application Data

(60) Provisional application No. 62/847,000, filed on May 13, 2019, provisional application No. 62/847,001, (Continued)

(51) Int. Cl.
*G01N 24/08* (2006.01)
*G01V 3/14* (2006.01)
(Continued)

(52) U.S. Cl.
CPC ........... *G01N 24/081* (2013.01); *G01R 33/44* (2013.01); *G01V 3/14* (2013.01); *G01V 3/38* (2013.01); *G01R 33/34092* (2013.01)

(58) Field of Classification Search
CPC .......... G01N 24/081; G01V 3/14; G01V 3/38; G01V 3/32; G01R 33/34092; G01R 33/44; G01R 33/448; Y02A 90/30
See application file for complete search history.

(56) References Cited

U.S. PATENT DOCUMENTS

2018/0306940 A1    10/2018   Basler-Reeder et al.
2019/0064378 A1    2/2019    Liu et al.
2020/0231858 A1*   7/2020    Arshad ............... C09K 8/03

FOREIGN PATENT DOCUMENTS

CN     106990131 B  *  8/2019  ........... G01N 24/081

OTHER PUBLICATIONS

Chen et al.; Evaluation of light hydrocarbon composition, pore size, and tortuosity in organic rich chalks using NMR core analysis and logging; Jun. 2019; SPWLA 60th Annual Logging Symposium; pp. 1-21.*

(Continued)

*Primary Examiner* — Jay Patidar
(74) *Attorney, Agent, or Firm* — Leandro Arechederra, III

(57) ABSTRACT

A method for determining the fluid mobility of a core sample can include: determining a porosity of a core sample having a permeability of 10 mD or less; saturating the core sample with a NMR saturation fluid; taking a first NMR measurement of fluids in the core sample; diffusionally exchanging a hydrophobic fluid or a hydrophilic fluid in the core sample in a hydrophobic NMR exchange fluid or a hydrophilic NMR exchange fluid, respectively; taking a second NMR measurement of the fluid in the core sample after diffusional exchange; and deriving a property of the core sample based on the porosity, a NMR signal to fluid volume calibration, and a comparison between the first and the second NMR measurements, the property being selected from the group consisting of a mobile oil volume, an immobile hydrocarbon volume, a mobile water volume, an immobile water volume, and a combination thereof.

22 Claims, 14 Drawing Sheets

Related U.S. Application Data filed on May 13, 2019, provisional application No. 62/847,008, filed on May 13, 2019, provisional application No. 62/847,003, filed on May 13, 2019, provisional application No. 62/847,014, filed on May 13, 2019, provisional application No. 62/847,012, filed on May 13, 2019.

(51) Int. Cl.
*G01V 3/38* (2006.01)
*G01R 33/44* (2006.01)
*G01R 33/34* (2006.01)

(56) References Cited

OTHER PUBLICATIONS

Hirasaki, G. J., et al. (2003) "NMR properties of petroleum reservoir fluids", Magnetic Resonance Imaging, vol. 21, No. 3, pp. 269-277.
Kausik, R., et al. (2016) "NMR Relaxometry in Shale and Implications for Logging", Petrophysics, vol. 57, No. 4, pp. 339-350.
King, H., et al. (2018) "Microstructural Investigation of Stress-Dependent Permeability in Tight-Oil Rocks", Petrophysics, vol. 59, No. 1, pp. 35-43.

\* cited by examiner

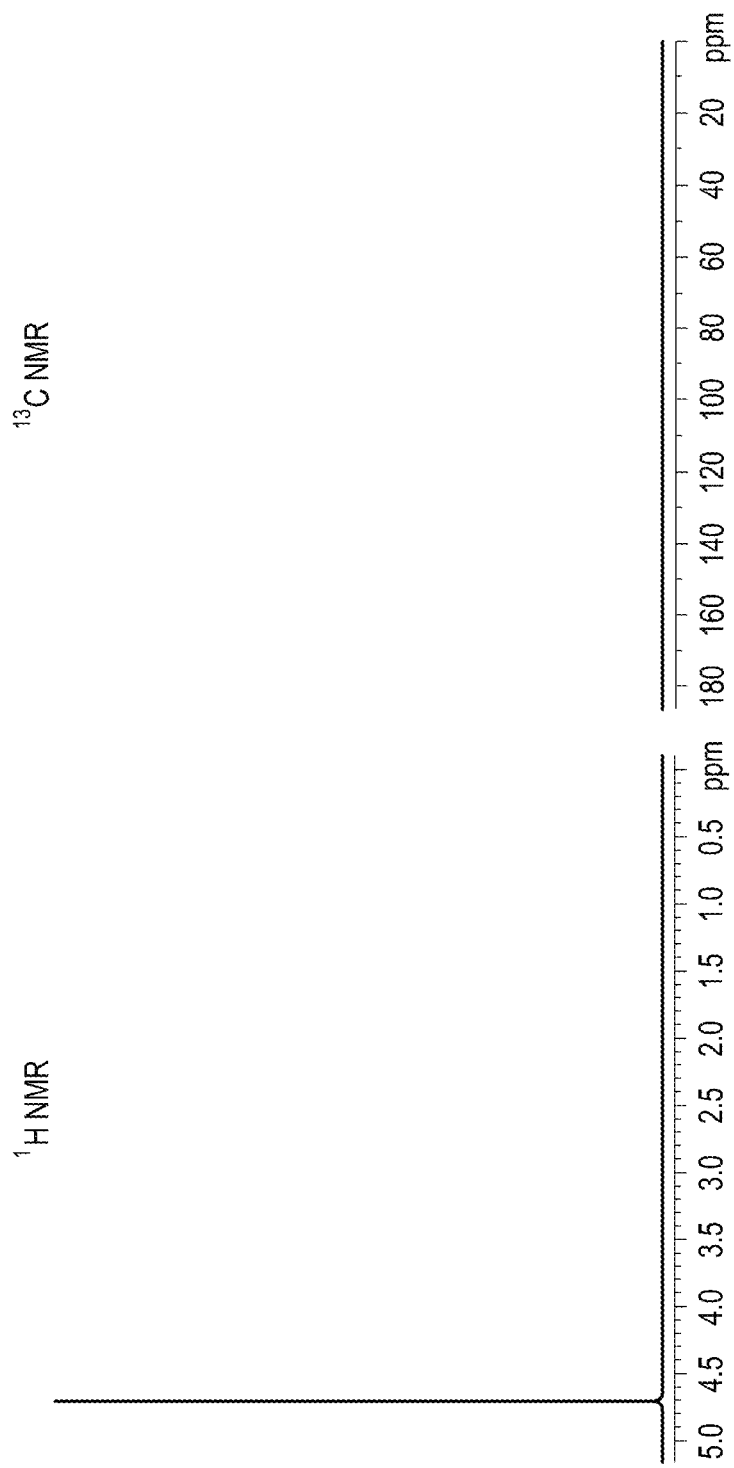

METHODS USING ADVANCED NMR ANALYSIS FOR CORE SAMPLES

CROSS REFERENCE TO RELATED APPLICATIONS

This application claims priority to U.S. Provisional Application Nos. 62/847,000, 62/847,001, 62/847,003, 62/847,008, 62/847,012, and 62/847,014 all filed May 13, 2019, the disclosures of which are incorporated herein by reference in its entirety.

BACKGROUND

The present disclosure relates to nuclear magnetic resonance (NMR) analysis of core samples.

During oil and gas exploration, zones with higher concentrations of oil and gas can be identified as target zones. One method of identifying target zones is using NMR analysis with core samples and/or logging techniques. NMR logging has shown promise in some formations. However, the NMR signals from water overlap with the NMR signals from oil in small pores. Therefore, NMR logging in tight shale (and similar formations that comprise a substantial amount of small pores) has been unreliable, to date, for identifying target zones.

Additionally, in many formations, the oil and gas is typically readily produced from target zones. However, in tight shale formations, the pore network may not be conducive to production. That is, a target zone may be identified and the formation stimulated for enhanced oil recovery. Initially, the production is quite quick after stimulation but can decline rapidly because the oil and gas located in smaller pores is more difficult to extract. Identifying properties that relate to potential oil recovery (e.g., pore connectivity) for target zones in tight shale would be highly beneficial to the industry.

SUMMARY OF THE INVENTION

The present disclosure relates to nuclear magnetic resonance (NMR) analysis of core samples. More specifically, the NMR analyses described herein relate to determining properties of core samples having a permeability of 10 milliDarcy (mD) or less. These core samples are from formations like tight shale.

A first nonlimiting exemplary embodiment is a method comprising: submerging a core sample in a NMR saturation fluid, wherein the core sample has a permeability of 10 mD or less; exposing the fluid to a vacuum while the core sample is submerged the NMR saturation fluid for a sufficient period of time to saturate the core sample; removing the vacuum while maintaining the core sample submerged the NMR saturation fluid; taking a NMR measurement of fluids in the core sample; and determining a porosity of the core sample based on a correlation between the NMR measurement and a NMR signal to fluid volume calibration.

A second nonlimiting exemplary embodiment is a method comprising: determining a porosity of a core sample, wherein the core sample has a permeability of 10 mD or less; saturating the core sample with a NMR saturation fluid; taking a first NMR measurement of fluids in the core sample; diffusionally exchanging a hydrophobic fluid or a hydrophilic fluid in the core sample in a hydrophobic NMR exchange fluid or a hydrophilic NMR exchange fluid, respectively; taking a second NMR measurement of the fluid in the core sample after diffusional exchange; and deriving a property of the core sample based on the porosity, a NMR signal to fluid volume calibration, a comparison between the first NMR measurement and the second NMR measurement, wherein the property of the core sample is selected from a first group consisting of a mobile oil volume, an immobile hydrocarbon volume, and a combination thereof when using the hydrophobic NMR exchange fluid or is selected from the second group consisting of a mobile water volume, an immobile water volume, and a combination thereof when using the hydrophilic NMR exchange fluid.

A third nonlimiting exemplary embodiment is a method comprising: determining a porosity of a core sample, wherein the core sample has a permeability of 10 mD or less; saturating the core sample with a NMR saturation fluid to achieve a saturated core sample; taking a NMR measurement of fluids in the saturated core sample; and deriving a volume for a pore type based on the porosity based on a correlation between the NMR measurement and a NMR signal to fluid volume calibration, wherein the pore type is selected from the group consisting of a nanopore, a micropore, a macropore, and any combination thereof.

A fourth nonlimiting exemplary embodiment is a method comprising: determining a porosity of a core sample, wherein the core sample has a permeability of 10 mD or less; taking a first NMR measurement of fluid in the core sample that is saturated; diffusionally exchanging a first fluid in the core sample in a first NMR exchange fluid, wherein (1) the first fluid is a hydrophobic fluid and the first NMR exchange fluid is a hydrophobic NMR exchange fluid or (2) the first fluid is a hydrophilic fluid and the second NMR exchange fluid is a hydrophilic NMR exchange fluid; taking a first plurality NMR measurement over time of the fluid in the core sample during diffusional exchange with the first NMR exchange fluid; analyzing a pore connectivity based on the porosity, a NMR signal to fluid volume calibration, and a comparison between the first NMR measurement and the first plurality of NMR measurements, wherein when using the hydrophobic NMR exchange fluid the pore connectivity analysis includes pore types selected from the group consisting of a nanopore oil volume, a micropore oil volume, a macropore oil volume, and any combination thereof, and wherein when using the hydrophilic NMR exchange fluid the pore connectivity analysis includes pore types selected from the group consisting of a nanopore water volume, a micropore water volume, a macropore water volume, and any combination thereof.

A fifth nonlimiting exemplary embodiment is a method comprising: determining a porosity of a core sample, wherein the core sample has a permeability of 100 mD or less; saturating the core sample with a NMR saturation fluid to achieve a saturated core sample; taking a first NMR measurement of the fluid in the saturated core sample; diffusionally exchanging a first fluid in the core sample in a first NMR exchange fluid, wherein (1) the first fluid is a hydrophobic fluid and the first NMR exchange fluid is a hydrophobic NMR exchange fluid or (2) the first fluid is a hydrophilic fluid and the second NMR exchange fluid is a hydrophilic NMR exchange fluid; taking a second NMR measurement of the fluid in the core sample after diffusional exchange; and deriving a property of the core sample based on the porosity, a NMR signal to fluid volume calibration, and a comparison between the first NMR measurement and the second NMR measurement, wherein when using the hydrophobic NMR exchange fluid the property is selected from the group consisting of a mobile nanopore oil volume, an immobile nanopore oil volume, a mobile micropore oil volume, an immobile micropore oil volume, a mobile macropore oil volume, an immobile macropore oil volume, and any combination thereof, and wherein when using a hydrophilic NMR exchange fluid the property is selected from the group consisting of a mobile nanopore water volume, an immobile nanopore water volume, a mobile micropore water volume, an immobile micropore water volume, a mobile macropore water volume, an immobile macropore water volume, and any combination thereof.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

FIGS. 7 and 8 are $^1H$ NMR and $^{13}C$ NMR spectrographs, respectively, performed on the fluid outside the core sample after diffusional exchange of fluids from FIG. 5 to FIG. 6.

DETAILED DESCRIPTION

Figure 1:
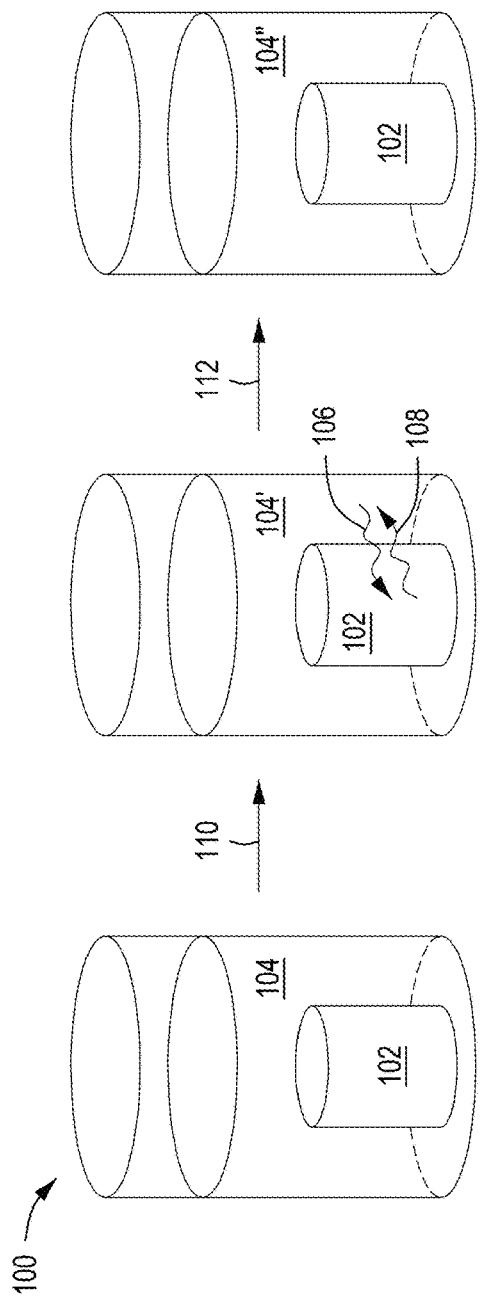
FIG. 1 illustrates a diagram for a process of diffusional exchange.

The present disclosure relates to nuclear magnetic resonance (NMR) analysis of core samples. More specifically, the NMR analyses described herein relate to determining properties of core samples from ultra-low permeability formations having a permeability of 10 milliDarcy (mD) or less, alternatively 1 mD or less, or alternatively 10 microDarcy or less. Examples of ultra-low permeability formations are shales, carbonates, tight shale, mudstones, and formations with mixtures thereof.

The transport of fluids through ultra-low permeability formations is typically controlled by a pore network, which has characteristic dimensions that are much smaller than those that control flow of fluids through conventional formations. Conventional formations often have a matrix permeability greater than 0.1 Darcy and pore sizes greater than 0.5 microns. In contrast, the pore sizes in ultra-low permeability formations can be 5 to 2,000 times smaller. Transport through the matrix in conventional formations is typically controlled by pressure driven hydraulic flow and can be modeled with multicomponent relative permeability relationships. The gas to oil ratio changes significantly over the life of a well. This is partially due to hydrodynamic flow instabilities that develop as gas that tries to hydraulically push oil out of a large pore matrix. However, for ultra-low permeability formations, the gas to oil ratio, in many instances, changes only modestly over the life of a well. Without being limited by theory, it is believed that transport through the small pore network forming the majority of the matrix in ultra-low permeability formations can be dominated by diffusive transport. In these ultra-low permeability formations, some of the transport may also occur hydraulically along a secondary pore network that occupies a small fraction of the matrix. Therefore, the hydraulic flood analysis methods used to assess fluid mobility in core samples from conventional reservoirs do not adequately describe fluid exchange in samples from ultra-low permeability formations.

The methods of the present invention evaluate, among other things, the fluid mobility and production potential of formations having ultra-low permeability by using diffusional exchange techniques. The methods described herein can also estimate potential gas production, which is especially relevant to ultra-low permeability formations.

Definitions

As used herein, the term "ultra-low permeability" when referring to a formation or core sample indicates that it has as permeability 10 mD or less (e.g., 1 mD or less or 10 microDarcy or less).

As used herein, the term "fluid" refers to a combination of liquid and gases.

As used herein, the term "hydrocarbon" refers to organic compounds composed predominantly of hydrogen and carbon. Hydrocarbons include, but are not limited to, alkanes (e.g., methane, ethane, propane, and paraffins), cycloalkanes, aromatic hydrocarbons, asphaltenes, nitrogen-containing aromatics, oxygen-containing aromatics, and sulfur-containing aromatics, and mixtures thereof.

As used herein, the term "oil" refers to liquid hydrocarbons at ambient conditions. As used herein, the term "ambient conditions" refers to 20° C. temperature and 101.3 kPa pressure.

As used herein, the term "water" is used generally to describe an aqueous fluid and can include fresh water, salt water, brine, brackish water, and the like. Examples of salts that may be present include, but are not limited to, inorganic salts (e.g., chloride, sulfates, and carbonates) of Group I and II elements and organic salts (e.g., citrates, acetates, formates, and lactates) of Group I and II elements.

As used herein, the terms "diffusional exchange," "diffusionally exchanging," and grammatical variations thereof relative to a core sample refer to the replacement of a first fluid into the pore structure of with a second fluid where the first and second fluids move by natural movement of the molecule. The natural movement can be driven, for example, by a concentration difference as opposed to hydraulic movement where pressure dominates the mechanism of molecule movement.

As used herein, the terms "bulk volume percent" and "BV %" is volume of fluid per volume of core sample expressed in a percentage. As used herein, the terms "pore volume percent" and "PV %" is volume of fluid per volume of the fluid in core sample expressed in a percentage.

As used herein, the term "porosity" refers to the extent to which a sample is composed of spaces or voids, which may be filled with fluids. Porosity can, for example, have the units of BV % or PV %.

As used herein, the term "mobile oil volume" refers to the volume of oil that can be diffusively exchanged. Mobile oil volume can, for example, have the units of BV % or PV %.

As used herein, the term "mobile water volume" refers to the volume of water that can be diffusively exchanged. Mobile water volume can, for example, have units of BV % or PV %.

As used herein, the term "immobile fluid volume" refers to the volume of fluid that cannot be diffusively exchanged. Immobile fluid volume can, for example, have units of BV % or PV %.

As used herein, the terms "nanopore," "micropore," and "macropore" do not necessarily indicate an absolute size for a pore but rather are relative terms that relate to the confinement of fluids within a pore where nanopores are the most confining pore and the smallest of the pore types, micropores are the less confining than nanopores and the medium size of the pore types, and macropores are the least confining pore and the largest of the pore types. As described below, NMR time scales (e.g., $T_1$ and $T_2$ relaxation times) are used to define each of these terms instead of the more common IUPAC definitions.

As used herein, the term "nanopore oil volume" refers to the volume of oil in nanopores. As used herein, the term "nanopore water volume" refers to the volume of water in nanopores. Nanopore oil volume and nanopore water volume can, for example, have units of BV % or PV %.

As used herein, the term "micropore oil volume" refers to the volume of oil in micropores. As used herein, the term "micropore water volume" refers to the volume of water in micropores. Micropore oil volume and micropore water volume can, for example, have units of BV % or PV %.

As used herein, the term "macropore oil volume" refers to the volume of oil in macropores. As used herein, the term "macropore water volume" refers to the volume of water in macropores. Macropore oil volume and macropore water volume can, for example, have units of BV % or PV %.

As used herein, the term "producible fluid volume" refers to the volume of fluid that can be produced from a formation via diffusion. Producible fluid volume can, for example, have units of BV % or PV %. Producible fluids encompass liquids and gases and hydrocarbons and water.

As used herein, the term "producible hydrocarbon fluid volume" refers to the volume of hydrocarbon fluid that can be produced from a formation via diffusion. Producible hydrocarbon fluids volume can, for example, have units of BV % or PV %. Producible hydrocarbon fluids include, but are not limited to, alkanes (e.g., methane, ethane, propane, and paraffins), cycloalkanes, aromatic hydrocarbons, asphaltenes, and mixtures thereof per $cm^3$ of total fluid in the core sample.

As used herein, the term "producible oil volume" refers to the volume of oil that can be produced from a formation via diffusion. Producible oil volume can, for example, have units of BV % or PV %.

As used herein, the term "producible gas volume" refers to the volume of gas that can be produced from a formation via diffusion. Producible gas volume can, for example, have units of BV % or PV %.

As used herein, the term "NMR measurement" refers to detection of hydrogen atoms ($^1H$), carbon atoms ($^{13}C$), fluorine atoms ($^{19}F$), sodium atoms ($^{23}Na$), or other atoms with non-zero magnetic moment using a low-field, intermediate-field, or high-field NMR and performing spectroscopy measurements, relaxometry measurements, diffusion measurements, imaging measurements, or combinations thereof. As used herein, the term "low-field NMR" refers to a nuclear magnetic resonance instrument operating at magnetic field from $25 \times 10^{-6}$ Tesla up to 0.6 Tesla. As used herein, the term "intermediate-field NMR" refers to a nuclear magnetic resonance instrument operating at magnetic field from 0.6 Tesla up to 1.4 Tesla. As used herein, the term "high-field NMR" refers to a nuclear magnetic resonance instrument operating at magnetic field from 1.4 Tesla up to 70 Tesla.

As used herein, the terms "measurement," "measured data," and grammatical variations thereof refer to acquired and processed data.

As used herein, the terms "Carr-Purcell-Meiboon-Gill" or "CPMG" refers to a spin-echo pulse sequence consisting of the steps: (1) a 90° pulse that creates a transverse magnetization, (2) a spin-echo period (delay-180°-delay block) that determines the decay of the magnetization, which can repeated any number times, and (3) acquisition of the $T_2$ relaxation times.

As used herein, the term "NMR applicable exchange fluid" or "NMR exchange fluid" relative to core samples refers to a fluid that when exchanged with an existing fluid in the core sample provides a different NMR signal intensity. For example, deuterated water is aNMR applicable exchange fluid for water because the $^1H$ NMR signals reduce when deuterated water replaces the water in the core sample. In another example, fluorinated hydrocarbons are NMR applicable exchange fluids for hydrocarbons because the $^{19}F$ NMR signal increases when the fluorinated hydrocarbons replace hydrocarbons and the $^1H$ NMR signals decrease when the fluorinated hydrocarbons (preferably perfluorocarbons) replace hydrocarbons. Therefore, fluorocarbons are $^1H$ NMR applicable exchange fluid and $^{19}F$ NMR applicable exchange fluid. As used herein, the term "NMR applicable exchange fluid" can be modified by a specific isotope to indicate which type of NMR the NMR applicable exchange fluid relates. For example, a $^1H$ NMR applicable exchange fluid refers to exchange fluid suitable for use in $^1H$ NMR measurements. If a specific type of NMR is not specified, the term NMR applicable exchange fluid applies to fluids suitable for use in any type of NMR.

As used herein, the term "NMR saturation fluid" relative to core samples refers to a NMR visible fluid that is used to fill, to the extent it is able, the pores of the core sample.

As used herein, the term "deuterated hydrocarbon" refers to a hydrocarbon where any number of hydrogens (one to all) has been replaced with deuterium.

As used herein, the term "$^{13}C$-enriched hydrocarbon" refers to a hydrocarbon where any number of carbons (one to all) has been replaced with $^{13}C$ carbon.

As used herein, the term "fluorinated hydrocarbon" refers to a hydrocarbon where any number of hydrogens (one to all) has been replaced with fluorine. As used herein, the term "perfluorinated hydrocarbon" refers to a hydrocarbon where all hydrogens have been replaced with fluorine.

As used herein, the term "chlorinated hydrocarbon" refers to a hydrocarbon where any number of hydrogens (one to all) has been replaced with chlorine. As used herein, the term "perchlorinated hydrocarbon" refers to a hydrocarbon where all hydrogens have been replaced with chlorine.

To facilitate a better understanding of the embodiments of the present invention, the examples of preferred or representative embodiments are given throughout the various sections below. In no way should the following examples be read to limit, or to define, the scope of the invention.

Core Samples

Core samples can be extracted from subterranean formations by known methods. Once collected downhole, the core samples can be handled a variety of ways, and the methods of handling can impact the methods described herein.

Core samples are typically cylindrical sections of a formation extracted by drilling radially from the wellbore into a sidewall of a wellbore. These core samples are often referred to as horizontal core samples. However, vertical core samples that are cylindrical sections extracted along the length of the wellbore can also be used in the methods described herein. The methods and analyses described herein are not limited by the extraction methods and direction of the core samples.

In a first example, the core samples can be preserved at formation pressure and temperature. In such cases, NMR analyses for porosity, total oil volume, and total water volume can be performed directly on the as-received, preserved core sample. Once initial NMR measurements are performed, the temperature and pressure conditions of the core samples can be changed. The amount and composition of the gas and liquid that elute from the preserved core sample can be measured. Then, these measurements can be used when deriving other core sample or formation properties (described further herein).

In another example, the core samples can be extracted from the formation and allowed to come to ambient temperature and/or pressure as the coring tool ascends from the collection location to the top of the borehole. In some instances, the amount and composition of the gas and liquid that elute from the core sample can be measured (e.g., during ascension or collected during ascension and measured later). Then, these measurements can be used when deriving other core sample or formation properties.

In another example, core samples can be extracted from the formation and allowed to come to ambient temperature and/or pressure as the coring tool ascends from the collection location to the top of the borehole where only a portion of or none of the gas and liquid that elute from the core sample is preserved. In these instances, some measurements may optionally be taken during production to provide complete estimation of the other core sample or formation properties. However, fluid exchange protocols can be adapted to assess key fluid properties in the extracted core sample (including producible fluid volumes).

NMR Measurement Methods

In the methods of the present invention, one or more NMR methods can be implemented. NMR measurement methods can include the steps of sending one or more radiofrequency (RF) pulses and detecting NMR signals from fluids inside and outside of the core sample. The NMR signals can correspond to, for example, spectroscopy, a free induction signal ($T_2^*$), a spin echo signal ($T_2$), a stimulated echo signal, a train of spin or stimulated echo signals ($T_2$), a thermal equilibrium signal ($T_1$), and any combination thereof. Various NMR measurement methods can be utilized include, but not limited to, relaxometry, diffusometry, 1-dimensional imaging, 2-dimensional imaging, 3-dimensional imaging, and any combination thereof. Further, two or more of the NMR signals can be correlated in a multi-dimensional plot (e.g., a spectroscopically resolved $T_2$, diffusion or imaging plots, or a $T_1$-$T_2$ correlation map).

The relaxation time $T_2^*$ describes the time constant for the loss of phase coherence of the transverse magnetization after the radiofrequency (RF) excitation field is turned off. This time dependent loss of phase coherence may be referred to as the free induction decay.

The time constant $T_2$ describes the characteristic decay time for the loss of phase coherence of the transverse magnetization following an application of two (or more) RF pulses. If two RF pulses are applied which are separated in time by $\tau$, a NMR nuclear spin echo is formed at time $2\tau$. The time dependence of the amplitude of the echo is described by $T_2$ relaxation mechanism. In this mode of measurement, the pair of RF pulses is repeated by successively increasing the delay time $\tau$, between the first and second RF pulse. In an alternative embodiment of this method, known as the CPMG pulse sequence, a long series of RF "refocusing" pulses are applied every $2\tau$, time intervals following the first pulse. This generates a spin echo following every time period $\tau$, following the second pulse.

The relaxation time $T_1$ is the characteristic time for the longitudinal magnetization to return to thermal equilibrium. There are different experimental approaches for measuring the $T_1$ value. One common method is the so-called inversion recovery method in which a sufficiently strong RF pulse is appropriately applied to either squelch or actually invert the magnetization. The return to thermal equilibrium is then monitored by sampling the state of the magnetization over time either by a series of free induction measurements or spin echo measurements.

Generally, the nuclei of unique substances will generate unique responses (e.g. relaxation times). Hence, one excitation pulse may permit measurement of multiple substances in a particular volume. For example, water displays a different response than oil, allowing differentiation between the two depending on the proton or nuclei's response to the excitation pulse. Also, substances having different physical states will respond differently. For example, ice responds to an excitation pulse differently from water because of the structured nature of ice crystals. More particularly, in this example, the magnetic moment of hydrogen nuclei in ice and snow returns to its equilibrium state so quickly that it becomes undetectable or "invisible" to standard NMR equipment.

The free induction decay (FID) describes magnetic field heterogeneity created by non-ideality of applied external magnetic field as well as internal magnetic field gradients caused by differences of magnetic susceptibilities of fluids and minerals in the core sample.

The diffusometry NMR measurement methods use a pulse sequence to spatially encode and decode the magnetization of molecules. Typically, a Hahn-echo or stimulated-echo pulse sequence is used. Measurements provide the distribution of spin displacements over the observation period of time to calculate the distribution of self-diffusion coefficient(s) of molecule(s) including those inside the core sample (with slower self-diffusion) and outside of core sample (with faster self-diffusion).

The imaging NMR measurement methods determine the spatial distribution of spin densities inside and outside of core sample. NMR imaging determines the heterogeneity of the core sample fluid saturation as well as presence of NMR visible fluid (e.g., water, oil) outside of the core sample.

A NMR signal to fluid volume calibration correlates a measured NMR signal to a volume. Such a calibration can be obtained by a variety of methods. In a first example, the fluid of interest for the calibration can be diluted at various concentrations in a host fluid. The fluid of interest and the host fluid should be readily distinguishable by NMR. For example, diluting 1 mL of water in 19 mL of deuterated water and measuring the NMR signal from the entire 20 mL provides a NMR signal corresponding to 1 mL of water in a 20 mL volume or 5 BV %. A series of such dilutions can be done to create the NMR signal to fluid volume calibration. Then, when measuring NMR signals of fluids in a core sample, the volume of the sample that the NMR signal measures and the NMR signal intensity can be correlated to a volume of fluid based on the NMR signal to fluid volume calibration.

In another example, a vial with 1 mL of water surrounded by 19 mL of deuterated water can be used to correlate provides the NMR signal corresponding to 1 mL of water in a 20 mL volume or 5 BV %. A series of such experiments can be done to create the NMR signal to fluid volume calibration. Then, when measuring NMR signals of fluids in a core sample, the volume of the sample that the NMR signal measures and the NMR signal intensity can be correlated to a volume of fluid based on the NMR signal to fluid volume calibration. It should be noted that the first method with direct dilution in the fluid of interest in the host fluid is preferred and provides a more accurate NMR signal to fluid volume calibration.

In any method of determining a NMR signal to fluid volume calibration, the density of the nuclei the NMR probes should be taken into consideration. Further, in any method of determining a NMR signal to fluid volume calibration, the concentration of nuclei (e.g., $^1H$) in samples used for determining the NMR signal to fluid volume calibration should be similar to the amount of fluid having $^1H$ in a core sample. For ultra-low permeability formations, the porosity can be 30 BV % or less, and more likely 15 BV % or less. Therefore, control samples should be NMR invisible fluids with varying low concentrations of NMR visible fluids. Then, the NMR signal to fluid volume calibration that correlate NMR signal intensity to fluid amount can be more correctly estimated.

The sum of all fluid volumes gives the total fluid filled volume of the corresponding core sample, which translates to the total fluid filled porosity in BV %. Worth noting is that the 1 mL of brine and 1 mL of ISOPAR™ (a mixture of synthetic isoparaffins, available from ExxonMobil Chemical) have similar hydrogen atom density and, therefore, give comparable NMR signal, which allows for using the same the NMR signal to fluid volume calibration for both fluids. This finding makes total fluid filled porosity measurements very robust and fluid type independent. This is especially important for characterization of unknown fluids with low-field NMR that does not provide a direct fluid type speciation by spectroscopy.

Diffusional Exchange

Diffusional exchange is based on exchanging a fluid in a core sample with a miscible fluid outside the core sample where diffusion is the dominating mechanism by which the fluids move. Optionally, temperature can be increased to facilitate faster fluid exchange.

Generally, hydrophilic NMR exchange fluids are used for exchanging with water in the core sample, and hydrophobic NMR exchange fluids are used for exchanging with hydrocarbon fluids in the core samples.

Examples of hydrophilic $^1H$ NMR applicable exchange fluid can include, but are not limited to, deuterated water ($D_2O$), deuterated alcohols (e.g., deuterated methanol, deuterated ethanol, deuterated isopropanol, deuterated t-butanol, and the like), deuterated glycols (e.g., deuterated ethylene glycol, deuterated propylene glycol, and the like), chlorinated alcohols, chlorinated glycols, fluorinated alcohols, fluorinated glycols, and any combination thereof.

Examples of hydrophobic $^1H$ NMR applicable exchange fluid can include, but are not limited to, deuterated $C_5$-$C_{20}$ hydrocarbons (e.g., deuterated pentane, deuterated hexane, deuterated cyclohexane, deuterated toluene, and the like), chlorinated $C_5$-$C_{20}$ hydrocarbons, fluorinated $C_5$-$C_{20}$ hydrocarbons, and any combination thereof.

Examples of hydrophilic $^{13}C$ NMR applicable exchange fluid can include, but are not limited to, alcohols (e.g., methanol, ethanol, isopropanol, t-butanol, and the like), glycols (e.g., ethylene glycol, propylene glycol, and the like), and any combination thereof.

Examples of hydrophobic $^{13}C$ NMR applicable exchange fluid can include, but are not limited to, $^{13}C$ enriched $C_5$-$C_{20}$ hydrocarbons (e.g., $^{13}C$ enriched pentane, $^{13}C$ enriched hexane, $^{13}C$ enriched cyclohexane, $^{13}C$ enriched, and the like), and any combination thereof.

Examples of hydrophilic $^{19}F$ NMR applicable exchange fluid can include, but are not limited to, fluorinated alcohols, fluorinated glycols, and any combination thereof.

Examples of hydrophobic $^{19}F$ NMR applicable exchange fluid can include, but are not limited to, fluorinated $C_5$-$C_{20}$ hydrocarbons.

Examples of hydrophilic $^{23}Na$ NMR applicable exchange fluid can include, but are not limited to, aqueous sodium containing solution such as NaCl solutions.

Examples of hydrophobic $^{23}Na$ NMR applicable exchange fluid can include, but are not limited to, sodium containing ionic liquids.

Each of the foregoing NMR exchange fluid examples may be partially deuterated or completely deuterated, partially chlorinated or perchlorinated, or partially fluorinated, or perfluorinated, as applicable to the chemical composition. Preferably, the NMR exchange fluid examples are completely hydrogenated, deuterated, perchlorinated, or perfluorinated, as applicable to the chemical composition.

FIG. 1 illustrates is a diagram for a process 100 of diffusional exchange. First, a core sample 102 (preferably a saturated core sample) is placed in a fluid bath 104. In a preferred embodiment, the fluid bath 104 surrounds all sides of the core sample 102. The fluid bath 104 initially contains a NMR exchange fluid 106 that is miscible with at least one fluid 108 in the core sample 102. The NMR exchange fluid 106 can be a single molecular species or can contain multiple molecular species. In a preferred embodiment, the NMR exchange fluid 106 is a single-phase fluid (i.e., not an emulsion). Over time 110, the fluid 108 in the core sample 102 that is miscible with the NMR exchange fluid 106 diffuses out of the core sample 102 as the NMR exchange fluid 106 diffuses into the core sample 102 based on the concentration difference between each fluid inside and outside the core sample 102. When the NMR exchange fluid 106 is composed of multiple molecular species, some molecular species may diffuse more readily into the core than others. In this case, the molecular composition of the 106 fluid can change during over time during the diffusion step 110. This along with the diffusion of molecular species of the fluid 108 out of the core sample 102 change the composition of the fluid in the bath and the new fluid bath composition is designated 104'.

The new fluid 104' composition outside the core sample 102 comprises components of the fluid 108 from the core sample 102 and the remaining molecular species in the NMR exchange fluid 106. In a preferred embodiment, the volume of the NMR exchange fluid 106 placed in bath 104 is large compared to the amount of fluid 108 that diffuses out of the core sample 102. In this preferred embodiment, the composition of the new fluid 104' is more than 75 mole % of molecular species originally present in the NMR exchange fluid 106, more preferably the composition of the new fluid 104' is more than 90 mole % of molecular species originally present in the NMR exchange fluid 106, even more preferably the composition of the new fluid 104' is more than 95 mole % of molecular species originally present in the NMR exchange fluid 106. If the compositional change exceeds these limits, it can be advantageous to take fluid out of the new fluid 104' as the exchange proceeds and replace it with fresh NMR exchange fluid 106. If the fluid 104' outside the core sample 102 is not changed for fresh NMR exchange fluid 106, the diffusion rates of each fluid in and out of the core sample 102 will equilibrate making the net flux of the different fluids very low. With larger volumes of NMR exchange fluid 106, the core sample 102 can essentially be saturated with NMR exchange fluid 106. Typically, a total volume of 3 pore volumes or greater (e.g., 3 pore volumes to 25 pore volumes or more, alternatively 3 pore volumes to 15 pore volumes, or alternatively 5 pore volumes to 10 pore volumes) is sufficient to essentially saturate the core sample 102 with the NMR exchange fluid 106. Alternatively, if the fluid 104' outside the core sample 102 is changed for fresh NMR exchange fluid 106, the concentration gradient of (a) the fluid 108 from the core sample 102 or the NMR exchange fluid 106 in the core sample relative to (b) the fluid 108 from the core sample 102 or the NMR exchange fluid 106 outside the core sample 102 is increased again to drive further diffusional exchange. The process of diffusional exchange can be for a desired amount of time 110, 112. Further, if done, the fluid 104' outside the core sample 102 can be changed or refreshed a desired number of times with the NMR exchange fluid 106. It should be noted, if the pore space in the core sample 102 in not saturated and contains empty pores and/or pores filled with low atmospheric pressure gas), the fluid exchange process can fill the empty pore space that can energetically accommodate the fluid.

The exchange process continues over time 112 and the fluid 108 continues to be transported from the core sample 102 and replaced by molecular species from the NMR exchange fluid 106. In a final state, the rate of transport of the fluid 108 from in the core sample 102 has slowed to less than 50% of its initial rate, more preferably to less than 10% of its initial rate, and even more preferably to less than 5% of its initial rate. At the end of the exchange, there is a final fluid composition 104" in the bath outside the core sample 102.

In a preferred embodiment, the fluid exchange process does not significantly alter the volume of fluids in the core sample 102 that are immiscible with NMR exchange fluid 106. For example, ISOPAR™ is immiscible with water, so when ISOPAR™ is used as the NMR exchange fluid 106, the volume of water in the core sample 102 is not significantly altered. Similarly, when water is used as the NMR exchange fluid 106, the volume of ISOPAR™ that may be in the core should not be significantly altered. More specifically, it is preferred that the NMR exchange fluid 106 displaces less than 20 volume % of immiscible fluids in the core sample 102, more preferably less than 10 volume %, and even more preferably less than 5 volume %. The amount of immiscible fluid displaced can be readily assessed from NMR measurements. This small displacement of immiscible fluid would not be expected in high permeability (>100 mD) core samples, which have significantly larger pores. In these types of cores, spontaneous imbibition occurs, which significantly alters the composition of a non-miscible fluid phase in the core sample.

The core sample can be submerged, preferably completely immersed, in the NMR exchange fluid 106 (or fluids if the fluid 104' outside the core sample 102 is changed for fresh NMR exchange fluid 106) for a sufficient time to approach maximum exchange for the given temperature and pressure of the core sample 102 during exchange. This time will depend on sample dimensions, temperature, porosity, and pore connectivity within the core sample 102. For example, for a cylindrical core sample about 3 cm in diameter under ambient temperature and pressure conditions, the time is typically at least 5 days, for example, from 5 days to 1 month or longer, or alternatively 10 days to 20 days. In another example, for a cylindrical core sample about ½ cm in diameter under ambient pressure and 80° C. temperature conditions, the time can be at least 1 hour, for example, from 1 hour to 1 day or longer, or alternatively 3 hours to 8 hours.

NMR analysis can be performed on the fluid inside the core sample 102 and/or the fluids 104', 104" outside the core sample 102 one or more times during the process 100. Generally, the core sample 102 is removed from the surrounding fluid 104', 104" and placed in a sample holder for NMR analysis. This is generally the practice because the bore of the magnet in the NMR has an inner diameter that does not fit the core sample 102 in a container of the surrounding fluid 104', 104". Accordingly, NMR analysis of the fluid 104', 104" outside the core sample 102 can be performed by taking a small sample from the fluid 104', 104" for performing NMR analysis in standard vials. However, if the NMR instrument is configured to receive and analyze the core sample 102 in a container of the surrounding fluid 104', 104", such methods are within the scope of the present invention.

Typically, the amount NMR signal correlates to the volume of fluid being analyzed. The NMR exchange fluid 106 can be NMR active and cause an increase to the NMR signal or can be NMR invisible and cause a decrease in NMR signal. The NMR analysis can involve monitoring and analyzing changes to NMR signals over time to derive a variety of core sample attributes (e.g., a porosity, a mobile oil volume, a mobile water volume, an immobile fluid volume, a nanopore oil volume, a micropore oil volume, a macropore oil volume, a nanopore water volume, a micropore water volume, a macropore water volume, a producible hydrocarbon volume, a producible oil volume, and a producible gas volume, described herein).

Figure 2:
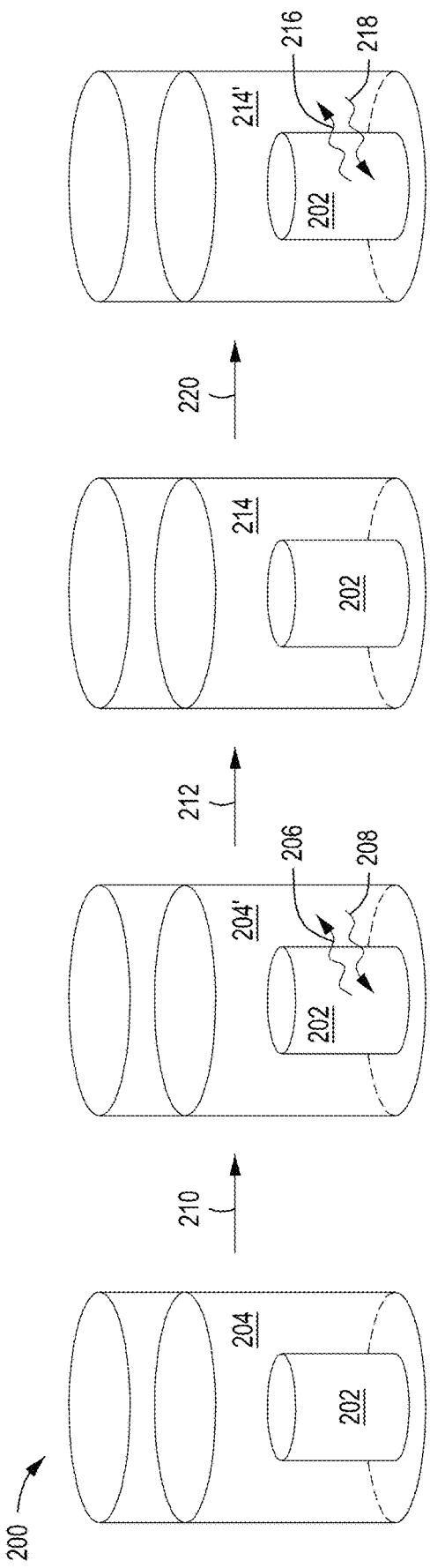
FIG. 2 illustrates a diffusional exchange process where both hydrophobic fluids and hydrophilic fluids inside the core sample are diffusionally exchanged.

FIG. 1 illustrates methods using only a hydrophobic or hydrophilic NMR exchange fluid. Alternatively, FIG. 2 illustrates a diffusional exchange process 200 where both hydrophobic fluids 206 and hydrophilic fluids 216 inside the core sample 202 are diffusionally exchanged. In the illustrated example, a core sample 202 is submerged in a fluid 204 that is a hydrophobic NMR exchange fluid 208. Over time 210, the hydrophobic NMR exchange fluid 208 diffuses into the core sample 202 and hydrophobic fluids 206 in the core sample 202 diffuse out of the core sample 202. The resultant fluid 204' outside the core sample 202 comprises the hydrophobic NMR exchange fluid 208 and the hydrophobic fluids 206 from the core sample 202. After a desired amount of time has passed, the fluid 204' outside the core sample 202 is changed 212 to a hydrophilic NMR exchange fluid 218 as the fluid 214 outside the core sample 202. Over time 220, the hydrophilic NMR exchange fluid 218 diffuses into the core sample 202 and hydrophilic fluids 216 in the core sample 202 diffuse out of the core sample 202. The resultant fluid 214' outside the core sample 202 comprises the hydrophilic NMR exchange fluid 218 and the hydrophilic fluids 216 from the core sample 202. While, the process 200 illustrate an exchange of hydrophobic fluids 206, 208 first and an exchange of hydrophilic fluids 216, 218 second, an alternative process can be to exchange of hydrophilic fluids first and hydrophobic fluids second.

As described above, the amount of NMR exchange fluid 208, 218 and/or the number of times the NMR exchange fluid 208, 218 is refreshed can push the core sample 202 to saturation of each of the NMR exchange fluids 208, 218.

NMR analysis can be performed on the fluid inside the core sample 202 and/or the fluid 204', 214' outside the core sample 202 one or more times during the process 200. For example, as described above relative to FIG. 1. As described above, changes in the NMR signal are monitored and analyzed to derive a variety of core sample attributes.

Either of the foregoing processes 100, 200 during diffusional exchange and/or during NMR analysis the core samples 102, 202, the core samples 102, 202 and corresponding fluid inside and outside of the core samples 102, 202 can be at an elevated temperature. Elevated temperature may hasten the diffusion process. Suitable temperatures depend on the fluids of interest. Generally, the elevated temperature should be below the boiling point of the fluid at the pressure of the fluid (described below). For example, at ambient pressures, the temperature may be up to 100° C. to avoid boiling of water and/or light hydrocarbons inside and/or outside the core sample. In another example, with a confining pressure of about 45 psig, the temperature may be up to about 130° C.

Further, in either of the foregoing processes 100, 200 during diffusional exchange and/or during NMR analysis the core samples 102, 202 can be in a pressurized fluid. That is, the fluid 104', 104", 204', 214' outside the core samples 102, 202 can be pressurized. For example, the samples may be pressurized to approximate downhole conditions. The core samples 102, 202 can be exposed to a confining pressure of up to 7,500 psig, and the fluid can be exposed to a pressure sufficient to create a pore pressure of up to 6,000 psig and a temperature up to 300° F.

Saturation

Saturating a core sample with a NMR saturation fluid may be done by any suitable method including, but not limited to, by completely immersing a core sample in the NMR saturation fluid for a sufficient time to allow for saturation.

A method of saturating can include bringing the core sample to ambient conditions while submerged in a NMR saturation fluid that has a NMR signal. If the core sample is already at ambient conditions, the core sample is simply submerged in the NMR saturation fluid. The objectives of the next steps are to remove at least a substantial amount of gas from the core sample and replace it with the NMR saturation fluid. Therefore, the NMR saturation fluid is exposed to a vacuum (e.g., about 1 mbar, although other pressures are suitable) while the core sample is submerged in the NMR saturation fluid. Vacuum is maintained until no visible bubbles of gas are produced for a period of time (e.g., about 1 hour to about 6 hours, or alternatively about 3 hours to about 4 hours). Then, the core sample, while still submerged in the NMR saturation fluid is exposed to atmospheric pressure for a period of time (e.g. about 10 minutes to about 4 days, or alternatively about 45 minutes to about 1.5 hours). This allows the liquid to saturate the sample.

The core samples are preferably as received core samples that still contain native fluids. Therefore, while the temperature can be elevated when saturating the core sample, preferably ambient temperature is maintained to mitigate native fluid in the core sample from exchanging with the NMR saturation fluid. However, exchange of native fluids in the core sample for the NMR saturation fluid may occur during saturation.

Any NMR saturation fluid can be used. Preferably, the NMR saturation fluid is water or a hydrocarbon based on the fluid that would have otherwise been present downhole. For example, the NMR saturation fluid can be selected based on the type of fluid released from the core sample from when the core sample was collected to when the saturation occurred. In another example, for a core sample from a production well or a core sample from a similar geophysical environment where production composition known, the produced fluid may be used to guide which NMR saturation fluid to use. NMR saturation fluid type should match the type of fluid predominantly present in the fluid presumed to be present downhole. That is a hydrocarbon NMR saturation fluid should be used when hydrocarbons are presumed to be the downhole fluid, and water should be used when water is presumed to be the downhole fluid.

Examples of hydrocarbon NMR saturation fluids include, but are not limited to, ISOPAR™, $C_5$-$C_{40}$ hydrocarbons (e.g., toluene, xylene, heptane, hexatricontane, and mixtures of linear paraffins), and the like, and combinations thereof.

Examples of hydrophilic NMR saturation fluids include, but are not limited to, water, and the like.

Porosity

Porosity provides an indication of the total amount of fluid in a formation. Further herein is described how to derive compositional details and mobility information about the fluid in the formation.

When the core is preserved the porosity can be measured in the preserved state where the sample is saturated with fluid. In this case, the porosity is determined by correlating the NMR signal attributed to the liquid in the core sample to a volume. As discussed above, NMR signal to fluid volume calibration can be used to quantitatively correlate NMR signal intensity to volume of each fluid phase.

If the sample is not preserved, the porosity of a core sample can be determined by saturating the core sample with a NMR saturation fluid. The NMR signal from the fluid in the core sample (e.g., native fluid and/or the NMR saturation fluid) can be used to estimate the porosity of the core sample. As discussed above, NMR signal to fluid volume calibration can be used to quantitatively correlate NMR signal intensity to volume of each fluid phase.

In one example, a $T_2$ spectrum can be measured. Generally, as described below relative to fluid volume for different pore types, $T_2$ relaxation times above about 300 ms correspond to the fluid surrounding the core sample (or free fluid). The integral of the area under the $T_2$ relaxation curve for relaxation times below 300 ms correlates to the total volume of the fluid via a NMR signal to fluid volume calibration. The NMR saturation fluid should be selected to have a $T_2$ relaxation time when not confined in a core sample of greater than 300 ms or additional correction factors should be applied. Examples of fluids with $T_2$ relaxation times greater than 300 ms when not confined by a core sample include, but are not limited to, ISOPAR™, $C_5$-$C_{40}$ hydrocarbons (e.g., toluene, xylene, heptane, hexatricontane, and mixtures of linear paraffins), water, and the like, and combinations thereof. Preferably, $C_5$-$C_{40}$ alkanes including mixtures thereof are used as NMR saturation fluids in this method.

Figure 4:
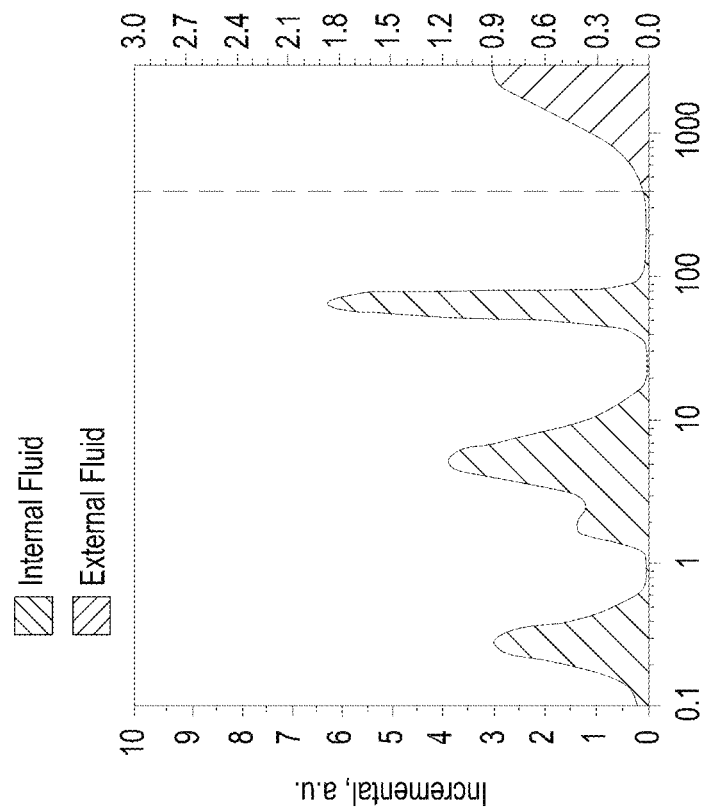
FIGS. 3 and 4 are prophetic, nonlimiting examples of $T_2$ spectra useful in determining a porosity of a core sample.
Figure 3:
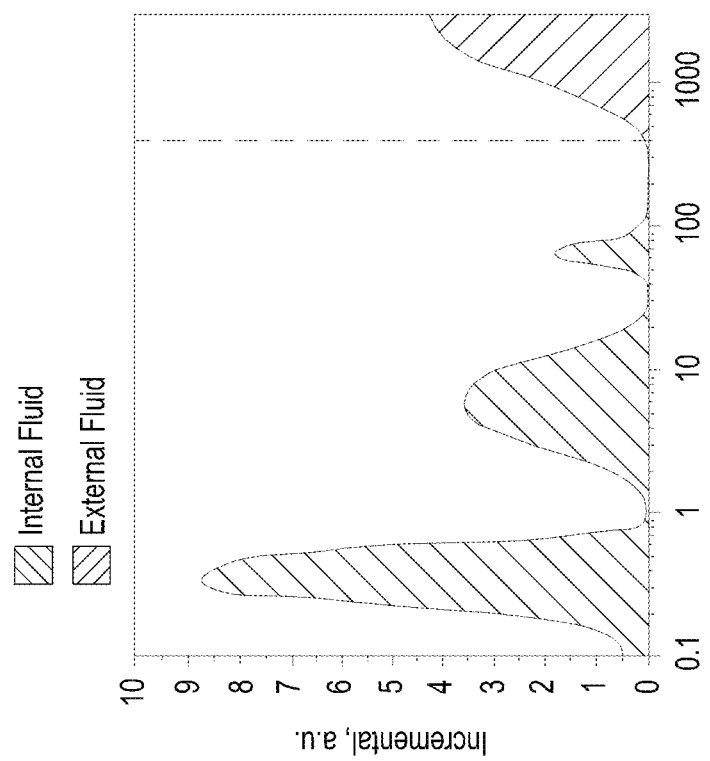

FIGS. 3 and 4 are prophetic, nonlimiting examples of $T_2$ spectra useful in determining a porosity of a core sample. Preferably, the NMR saturation fluids selected to have a $T_2$ relaxation time of greater than 300 ms. When the NMR saturation fluids in the core sample due to confinement described below, the $T_2$ relaxation time is 300 ms or less. Then, above 300 ms, the NMR signal is from the fluid external to the core sample. In both figures, there are several $T_2$ intensity peaks from 0.1 ms to 300 ms that correspond to NMR signals from fluid inside the core sample. The areas under the $T_2$ relaxation plot from 0.1 ms to 300 ms correlates (per the NMR signal to fluid volume calibration) to the volume of fluid in the core sample and, consequently, the porosity.

Accordingly, a method of the present disclosure can comprise: submerging a core sample in a NMR saturation fluid, wherein the core sample has a permeability of 10 mD or less; exposing the fluid to a vacuum while the core sample is submerged the NMR saturation fluid for a sufficient period of time to saturate the core sample; removing the vacuum while maintaining the core sample submerged the NMR saturation fluid; taking a NMR measurement of fluids in the core sample; and determining a porosity of the core sample based on a correlation between the NMR measurement and a NMR signal to fluid volume calibration, wherein the NMR measurement is $^1H$ $T_2$ relaxation times measured with low-field and/or intermediate-field NMR and the correlation is between an area under a $^1H$ $T_2$ relaxation time spectrum from 0.1 ms to 300 ms and the NMR signal to fluid volume calibration.

In another example, $T_1$ relaxation times can be measured. Generally, as described below relative to fluid volume for different pore types, $T_1$ relaxation times above about 300 ms correspond to the fluid surrounding the core sample (or free fluid). The integral of the area under the $T_1$ relaxation curve for relaxation times below 300 ms correlates to the total volume of the fluid via the NMR signal to fluid volume calibration. The NMR saturation fluid should be selected to have a $T_1$ relaxation time when not confined in a core sample of greater than 300 ms or additional correction factors should be applied. Examples of fluids with $T_1$ relaxation times greater than 300 ms when not confined in a core sample include, but are not limited to, ISOPAR™, $C_5$-$C_{40}$ hydrocarbons (e.g., toluene, xylene, heptane, hexatricontane, and mixtures of linear paraffins), water, and the like, and combinations thereof. Preferably, $C_5$-$C_{40}$ alkanes including mixtures thereof are used as NMR saturation fluids in this method.

In another example using a different NMR measurement, in $T_1$-$T_2$ 2-dimensional correlation map, lower $T_1$ and lower $T_2$ values correspond to fluids confined by in the pore structure of a core sample. For example, measuring the $^1H$ $T_1$ and $^1H$ $T_2$ relaxation times with low-field and/or intermediate-field NMR, $^1H$ $T_1$ of 0.1 ms to 300 ms and $^1H$ $T_2$ of 0.1 ms to 300 ms correspond to water and hydrocarbon confined in the pore structure of a core sample. Accordingly, using a NMR signal to fluid volume calibration, the volume of fluid in the core sample can be determined from the area under the $T_1$-$T_2$ 2-dimensional correlation map for $^1H$ $T_1$ of 0.1 ms to 300 ms and $^1H$ $T_2$ of 0.1 ms to 300 ms. When describing the area under a map herein, it is the integral of the z-axis (e.g., signal intensity) for the provided range(s) of the x- and/or y-axes (e.g., $T_1$ relaxation time and/or $T_2$ relaxation time).

Accordingly, a method of the present disclosure can comprise: submerging a core sample in a NMR saturation fluid, wherein the core sample has a permeability of 10 mD or less; exposing the fluid to a vacuum while the core sample is submerged the NMR saturation fluid for a sufficient period of time to saturate the core sample; removing the vacuum while maintaining the core sample submerged the NMR saturation fluid; taking a NMR measurement of fluids in the core sample; and determining a porosity of the core sample based on a correlation between the NMR measurement and a NMR signal to fluid volume calibration, wherein the NMR measurement is $^1H$ $T_1$-$T_2$ 2-dimensional correlation map measured with low-field and/or intermediate-field NMR and the correlation is between an area under a $^1H$ $T_1$-$T_2$ relaxation time plot for $T_2$ of 0.1 ms to 300 ms and $T_1$ of 0.1 ms to 300 ms and the NMR signal to fluid volume calibration.

In yet another example with a different NMR measurement, the $T_1/T_2$ ratios of the fluids can be measured. $T_1/T_2$ ratios above 1 correspond to fluid confined by the pore structure of the core sample. For example, for low-field and/or intermediate-field NMR, $1<^1H$ $T_1/T_2$ ratio$<100$ corresponds to fluid in the pore structure of the core sample. Accordingly, an area under the curve of a plot of signal intensity as a function of $^1H$ $T_1/T_2$ ratio for $1<^1H$ $T_1/T_2$ ratio$<100$ can be correlated to a volume of fluid in the core sample and, consequently, a porosity of the core sample using a NMR signal to volume calibration. $T_1$-$T_2$ 2-dimensional correlation map is also used to define volumes of water and oil.

Accordingly, a method of the present disclosure can comprise: submerging a core sample in a NMR saturation fluid, wherein the core sample has a permeability of 10 mD or less; exposing the fluid to a vacuum while the core sample is submerged the NMR saturation fluid for a sufficient period of time to saturate the core sample; removing the vacuum while maintaining the core sample submerged the NMR saturation fluid; taking a NMR measurement of fluids in the core sample; and determining a porosity of the core sample based on a correlation between the NMR measurement and a NMR signal to fluid volume calibration, wherein the NMR measurement is $^1H$ $T_1/T_2$ ratio measured with low-field and/or intermediate-field NMR and the correlation is between an area under a $^1H$ $T_1/T_2$ ratio of $1<^1H$ $T_1/T_2$ ratio$<100$ and the NMR signal to fluid volume calibration.

In yet another example, diffusometry can be used to determine porosity. Because the movement of the fluid in the core sample versus the fluid outside the core sample is limited, the fluid inside the core sample will have lower diffusion values. Diffusion values of $1\times10^{-9}$ $m^2$/sec and less may be attributed to fluid inside the core sample. The intensity of the signal in this range can then be correlated to volume and, consequently, porosity. The NMR saturation fluid should be selected to have a diffusion values when not confined in a core sample of greater than $10^{-9}$ $m^2$/sec or additional correction factors should be applied. Examples of fluids with diffusion values greater than $10^{-9}$ $m^2$/sec when not confined in a core sample include, but are not limited to, ISOPAR™, $C_5$-$C_{40}$ hydrocarbons (e.g., toluene, xylene, heptane, hexatricontane, and mixtures of linear paraffins), water, and the like, and combinations thereof. Preferably, $C_5$-$C_{40}$ alkanes including mixtures thereof are used as NMR saturation fluids in this method. As NMR diffusometry signal is affected by $T_2$ and $T_1$ relaxation of spins, proper corrections and calibrations are required to quantitatively determine amount of fluid inside and outside of the core sample. In some cases, NMR diffusometry does not detect fluids in smallest pores or tightly bound fluids having short $T_2$ and $T_1$ relaxation times (typically below 10 ms).

In another example, NMR imaging can be used to determine porosity. NMR signal within the boundaries of the core sample can be used to determine the fluid content in the core sample. NMR signal outside of the core sample boundaries is excluded from the sample porosity measurements. Because NMR imaging signal as measured by variety of NMR pulse sequences is affected by $T_2^*$, $T_2$ and $T_1$ relaxation processes, proper correction and calibration is used to quantitatively determine the amount of fluid inside and outside of the core sample.

Accordingly, a method of the present disclosure can comprise: submerging a core sample in a NMR saturation fluid, wherein the core sample has a permeability of 10 mD or less; exposing the fluid to a vacuum while the core sample is submerged the NMR saturation fluid for a sufficient period of time to saturate the core sample; removing the vacuum while maintaining the core sample submerged the NMR saturation fluid; taking a NMR measurement of fluids in the core sample; and determining a porosity of the core sample based on a correlation between the NMR measurement and a NMR signal to fluid volume calibration, wherein the NMR measurement is imaging measured with intermediate-field and/or high-field NMR and the correlation is between a $T_2$- and $T_1$-relaxation corrected signal for the fluids within spatial boundaries of the core sample and the NMR signal to fluid volume calibration.

In another example using a different NMR measurement, a low-field NMR can be used in relaxometery mode for collecting $T_2$ relaxation times with a variable refocusing delay time $\tau$, also referred to herein as a NMR signal decay. Then, the total proton content (which relates to the total fluid present as described above) is obtained by extrapolating the relaxation time to zero refocusing delay. The NMR signal intensity can be converted to fluid volume based on NMR signal to fluid volume calibration to yield a plot of fluid volume as a function of refocusing delay $\tau$. Then, the area under the fit corresponds to the porosity. For ultra-low permeability core samples, the fluid in the smaller pores is more clearly resolved with shorter refocusing delay time $\tau$ below 200 μs, preferentially below 50 μs.

Accordingly, a method of the present disclosure can comprise: submerging a core sample in a NMR saturation fluid, wherein the core sample has a permeability of 10 mD or less; exposing the fluid to a vacuum while the core sample is submerged the NMR saturation fluid for a sufficient period of time to saturate the core sample; removing the vacuum while maintaining the core sample submerged the NMR saturation fluid; taking a NMR measurement of fluids in the core sample; and determining a porosity of the core sample based on a correlation between the NMR measurement and a NMR signal to fluid volume calibration, wherein the NMR measurement is $T_2$ NMR signal intensity as a function of refocusing delay and the correlation is between a y-value at a y-intercept of an extrapolation of the $T_2$ NMR signal intensity including x=0 and the NMR signal to fluid volume calibration.

The volume and/or compositional makeup of the gas that elutes from the core sample while the fluid is under vacuum can be measured. Compositional makeup can be determined by gas chromatography and/or spectroscopic methods known in the art.

Mobile Oil Volume, Mobile Water Volume, Immobile Hydrocarbon Volume, Immobile Water Volume, and Immobile Fluid Volume The amount of mobile oil, mobile water, and immobile fluid provides an indication of the amount of hydrocarbon and water that is readily mobile within the formation and can potentially be produced by conventional methods. The immobile fluid volume provides an indication of the amount of fluids that would require enhanced oil recovery methods to produce in combination with the volume of fluid that cannot be produced.

Mobile oil volume is correlated to the change in NMR signal from an initial time point to a point of saturation with a hydrophobic NMR exchange fluid. Therefore, a method can include measuring a NMR signal corresponding to fluid in a saturated core sample; diffusionally exchanging oil in a core sample with a hydrophobic NMR exchange fluid; measuring the NMR signal corresponding the fluid in the core sample after the diffusional exchange; and correlating a change in NMR signal to a volume of mobile oil. In a preferred embodiment, the sample is first saturated with a hydrophobic NMR saturation fluid such as ISOPAR™. This saturates empty pores that are accessible with the NMR visible fluid. The amount of NMR saturation fluid in the sample is than measured. The sample is then exchanged with a NMR invisible hydrophobic exchange fluid (a hydrophobic NMR exchange fluid) and remeasured in the NMR instrument. The difference in the hydrophobic fluid signals from the core provides a measure of the mobile oil volume. In one example, the hydrophobic NMR exchange fluid may be a deuterated hydrocarbon, where the percent of $^1$H NMR signal loss corresponds to a volume percent of the mobile oil volume. It is preferred that the change in NMR signals from hydrophilic fluids in the core such as water be less than 25% during the course of these exchanges, more preferable less than 10%, and even more preferably less than 5%. In another preferred embodiment, the measurement of mobile oil volume is made as part of a protocol to measure the porosity in the sample. In another embodiment, the measurement is made on a preserved core and the step of saturating the core with a NMR visible hydrophobic exchange fluid is omitted.

Mobile water volume is correlated to the change in NMR signal from an initial time point to a point of saturation with a hydrophobic NMR exchange fluid. Therefore, a method can include measuring a NMR signal corresponding to fluid in a saturated core sample; diffusionally exchanging water in a core sample with a hydrophilic NMR exchange fluid; measuring the NMR signal corresponding the fluid in the core sample after the diffusional exchange; and correlating a change in NMR signal to a volume of mobile water. In one example, the hydrophilic NMR exchange fluid may be a deuterated water, where the percent of $^1$H NMR signal loss corresponds to a volume percent of the mobile water volume. In one preferred embodiment, the core sample is first saturated with water, and then diffusionally exchanged with deuterated water. NMR measurements are performed before and after diffusional exchange, where the difference between the water signals with $T_2$<300 ms is used to determine mobile water volume. In another embodiment, the mobile water volume is determined by first measuring the native water signal from the core and then diffusionally exchanging the native water with deuterated water into the core, where the difference between the NMR water signals is taken as a measure of mobile water. In another preferred embodiment, the measurement of mobile water volume is performed after measuring the mobile oil volume in the core. In each of these examples, it is preferred that the amount of hydrophobic fluid in the core change be less than 25% during the deuterated water and/or water exchanges, more preferably by less than 10%, and even more preferably by less than 5%.

Immobile hydrocarbon volume is correlated to the amount of unchanged NMR signal from a point where the core is at or near saturation with hydrocarbons to a point of saturation with a hydrophobic NMR invisible exchange fluid. Immobile water volume is correlated to the amount of unchanged NMR signal from an initial point where the core is at or near saturation with water to a point of saturation by exchange with a deuterated water, which is invisible in the NMR measurement. Accordingly, the total volume of fluid in a core sample is a sum of the mobile oil volume, the mobile water volume, the immobile hydrocarbon volume and the immobile water volume. The immobile fluid volume is the sum of the immobile hydrocarbon and immobile water volumes. Therefore, a method can include measuring a NMR signal corresponding to fluid in a core sample; diffusionally exchanging oil in a core sample with a hydrophobic NMR exchange fluid; diffusionally exchanging water in a core sample with a hydrophilic NMR exchange fluid; measuring the NMR signal corresponding the fluid in the core sample after the diffusional exchange; and correlating a remaining NMR signal to a volume of mobile water. The diffusional exchange for water and oil in the core sample can be in either order. Preferably, the diffusional exchange that goes first is the one corresponding to the fluid (oil or water) that is believed to be of highest volume content in the core sample.

For mobile oil volume, mobile water volume, and immobile fluid volume, any of the NMR signals and methods described herein can be used (e.g., $T_2^*$, $T_2$, $T_1$, FID, diffusometry, imaging, and any combination thereof).

Further, before and/or after diffusional exchanges, the core sample mass can be measured.

Example 1

Figure 6:
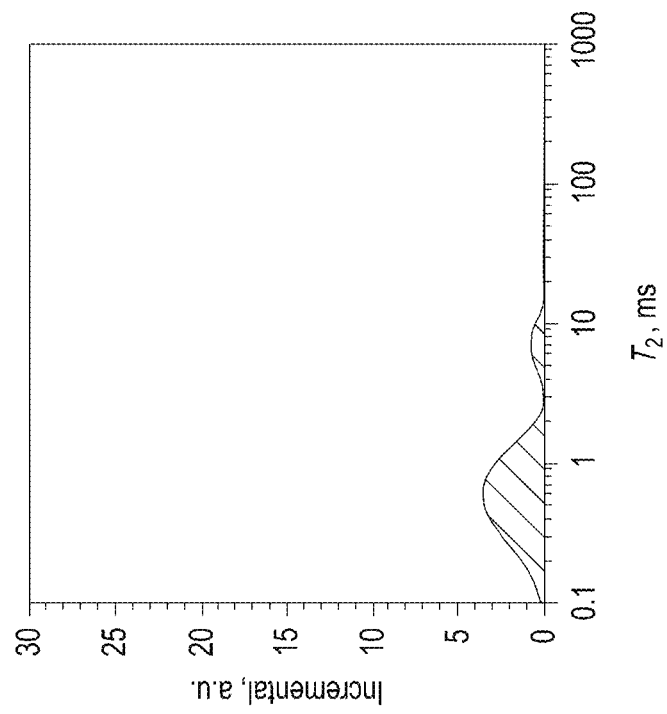
FIGS. 5 and 6 are $T_2$ spectra (2 MHz, 51 mm probe, CPMG pulse sequence, τ=200 μs, 24° C.) for the fluid in the core sample before and after diffusional exchange, respectively.
Figure 5:
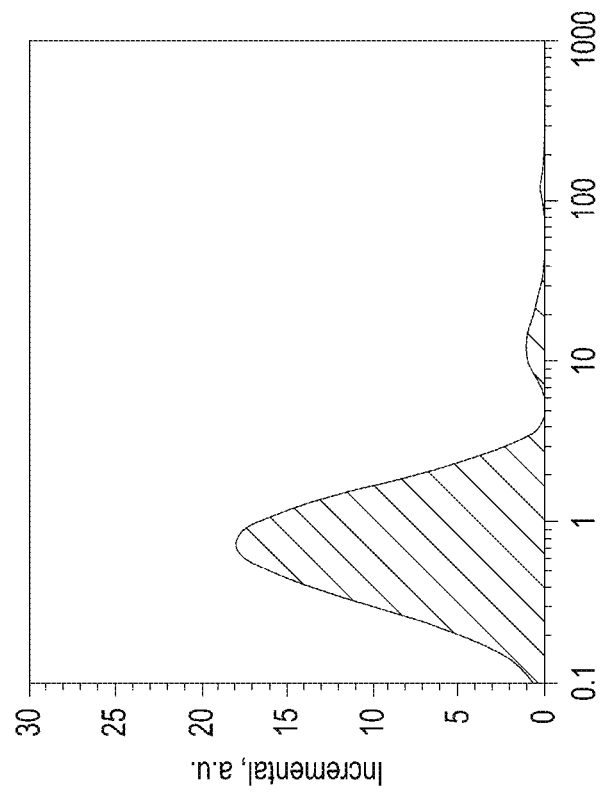

Mobile water volume. A core sample from the shale was analyzed by NMR and determined to have 14.6 BV % total porosity. FIG. 5 is the $T_2$ spectrum (2 MHz, 51 mm probe, CPMG pulse sequence, $\tau=200$ μs, 24° C.) from 0.1 ms to 300 ms for the fluid in the core sample. Above about 300 ms, the fluid surrounding the core sample (or free fluid) contributes to the NMR signal. The core sample was submerged in $D_2O$ for 5 days before the $T_2$ relaxation measurements (2 MHz, 51 mm probe, CPMG pulse sequence, $\tau=200$ μs, 24° C.) were performed again (FIG. 6). Comparing FIGS. 5 and 6 the NMR signal at $T_2 \sim 0.7$ has decreased significantly. Presumable, this is due to mobile water being diffusionally exchanged for $D_2O$. The remaining signal corresponds to about 3.1 BV %, which means that 11.5 BV % is mobile water.

$^1$H NMR and $^{13}$C NMR was performed on the fluid outside the core sample and shown in FIGS. 7 and 8, respectively. The $^1$H NMR signal at about 4.7 ppm (FIG. 7) illustrates that brine, and the lack of $^1$H NMR signal at about 1.0-2.0 ppm (FIG. 7) illustrates that no mobile oil has been diffusionally exchanged with the $D_2O$. Additionally, the lack of $^{13}$C NMR signal (FIG. 8) further illustrates that no mobile oil has been diffusionally exchanged with the $D_2O$.

Example 2

Figure 10:
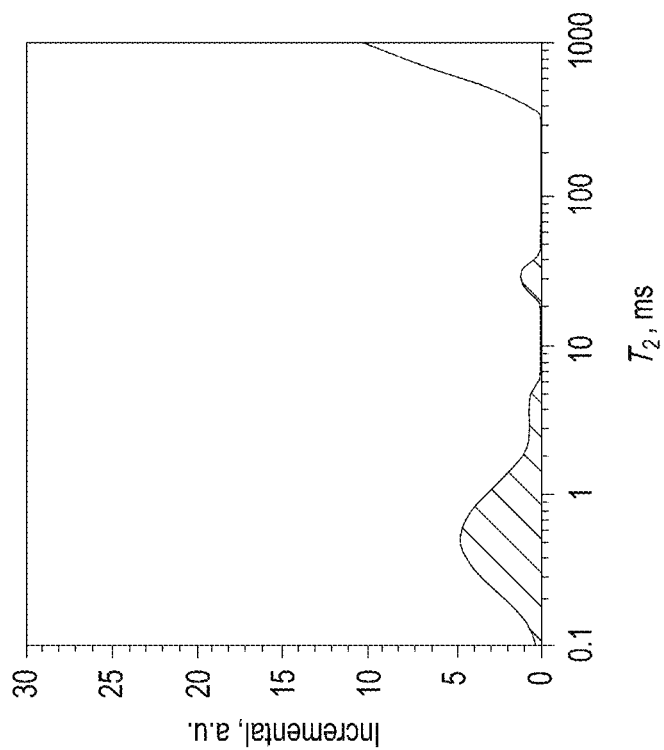
FIGS. 9 and 10 are $T_2$ spectra (2 MHz, 51 mm probe, CPMG pulse sequence, τ=200 μs, 24° C.) for the fluid in the core sample before and after diffusional exchange, respectively.
Figure 9:
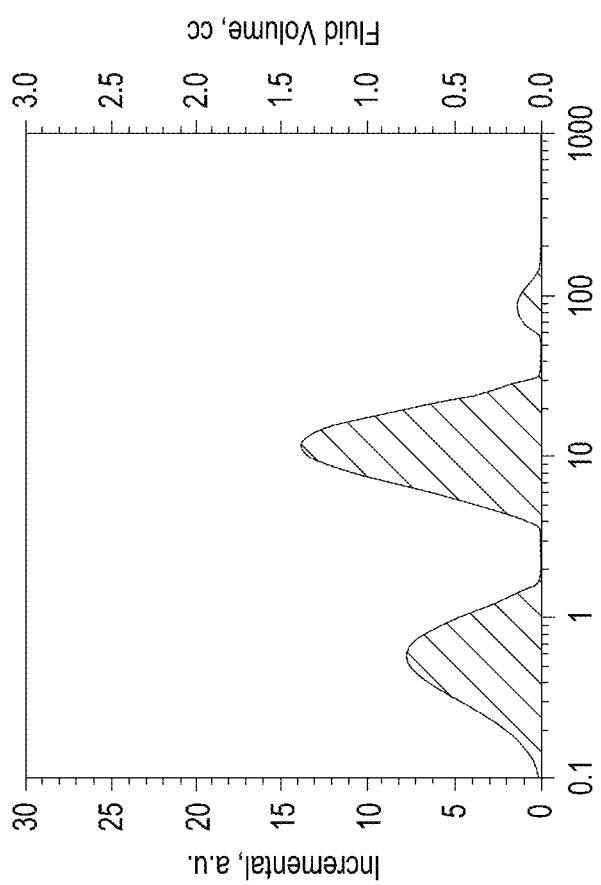

Mobile oil volume. A core sample from the shale was analyzed by NMR and determined to have 11.9 BV % total porosity. FIG. 9 is the $T_2$ spectrum (2 MHz, 51 mm probe, CPMG pulse sequence, $\tau=200$ μs, 24° C.) for the fluid in the core sample. The core sample was submerged in $d_{12}$-cyclohexane (fully deuterated cyclohexane) for 5 days before the $T_2$ relaxation measurements (2 MHz, 51 mm probe, CPMG pulse sequence, $\tau=200$ μs, 24° C.) were performed again (FIG. 10). Comparing FIGS. 9 and 10 the NMR signal at above a $T_2$ of 10 ms has essentially disappeared has decreased significantly. Presumable, this is due to mobile oil being diffusionally exchanged for $d_{12}$-cyclohexane. The remaining signal below $T_2 \sim 10$ ms corresponds to about 3.6 BV %, which means that 8.3 BV % is mobile oil.

Figure 12:
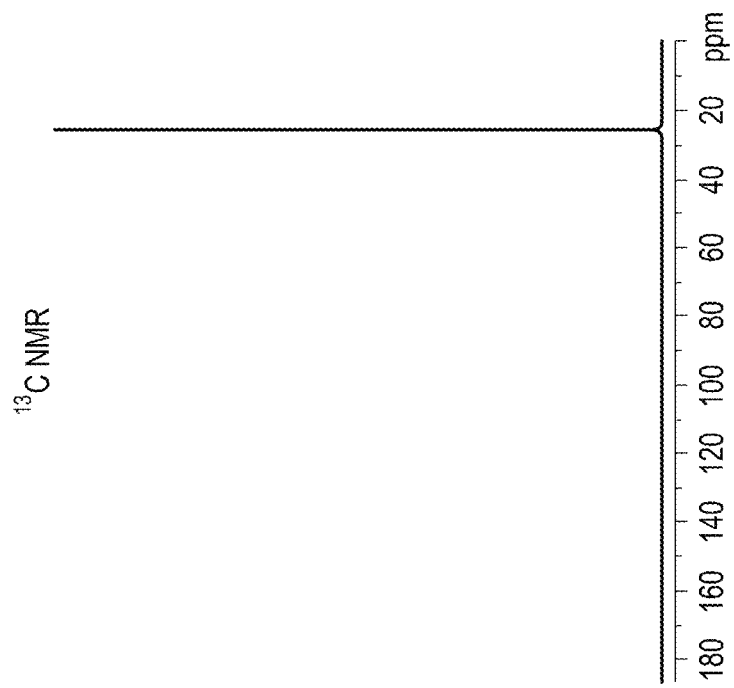
FIGS. 11 and 12 are $^1H$ NMR and $^{13}C$ NMR spectrographs, respectively, performed on the fluid outside the core sample after diffusional exchange of fluids from FIG. 9 to FIG. 10.
Figure 11:
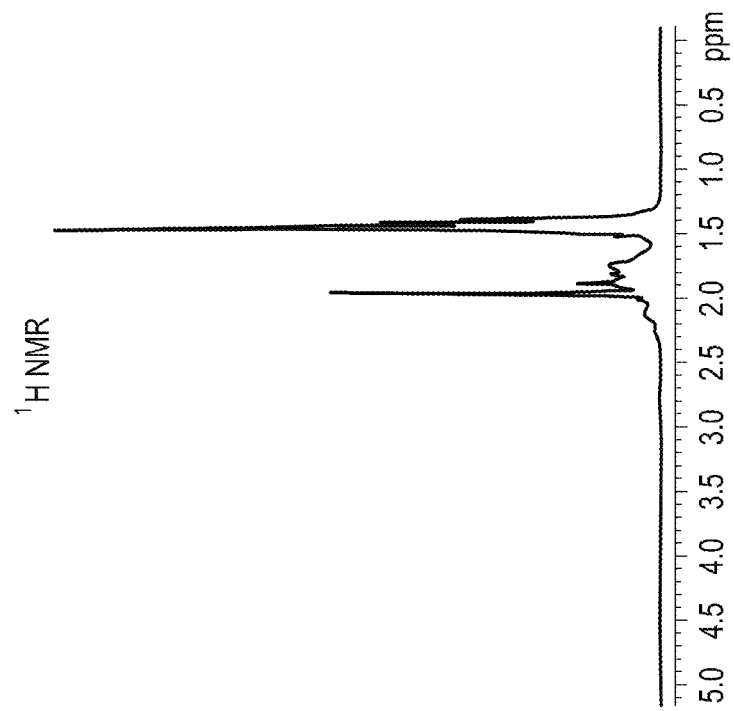

$^1$H NMR and $^{13}$C NMR was performed on the fluid outside the core sample and shown in FIGS. 11 and 12, respectively. The lack of a $^1$H NMR signal at about 4.7 ppm (FIG. 11) illustrates that no mobile water has been diffusionally exchanged with the $d_{12}$-cyclohexane, and the $^1$H NMR signal at about 1.0-2.0 ppm (FIG. 11) illustrates that mobile oil has diffused out of the core sample. Additionally, the $^{13}$C NMR signal (FIG. 12) further illustrates that mobile oil has diffused out of the core sample.

Accordingly, a method of the present disclosure can comprise: determining a porosity of a core sample, wherein the core sample has a permeability of 10 mD or less (e.g., via a method described herein using NMR measurements or by another method); saturating the core sample with a NMR saturation fluid; taking a first NMR measurement of fluids in the core sample; diffusionally exchanging a hydrophobic fluid or a hydrophilic fluid in the core sample in a hydrophobic NMR exchange fluid or a hydrophilic NMR exchange fluid, respectively; taking a second NMR measurement of the fluid in the core sample after diffusional exchange; and deriving a property of the core sample based on the porosity, a NMR signal to fluid volume calibration, a comparison between the first NMR measurement and the second NMR measurement, wherein the property of the core sample is selected from a first group consisting of a mobile oil volume, an immobile hydrocarbon volume, and a combination thereof when using the hydrophobic NMR exchange fluid or is selected from the second group consisting of a mobile water volume, an immobile water volume, and a combination thereof when using the hydrophilic NMR exchange fluid, wherein the NMR measurements are $^1$H $T_2$ relaxation times with low-field and/or intermediate-field NMR and the comparison is a change in an area under a $^1$H $T_2$ relaxation time spectrum from 0.1 ms to 300 ms.

Example 3

Mobile oil and mobile water volumes. In this example, the NMR measurements provide a $T_1$-$T_2$ correlation map where water has a signal peak at $0.1<T_1<5$ and $0.1<T_2<5$ and hydrocarbons have a signal peak at $5<T_1<100$ and $1<T_2<50$. The area under the peaks can be converted to volume using NMR signal to fluid volume calibrations. When describing the area under a map herein, it is the integral of the z-axis (e.g., signal intensity) for the provided range(s) of the x- and/or y-axes (e.g., $T_1$ relaxation time and/or $T_2$ relaxation time).

Figure 13:
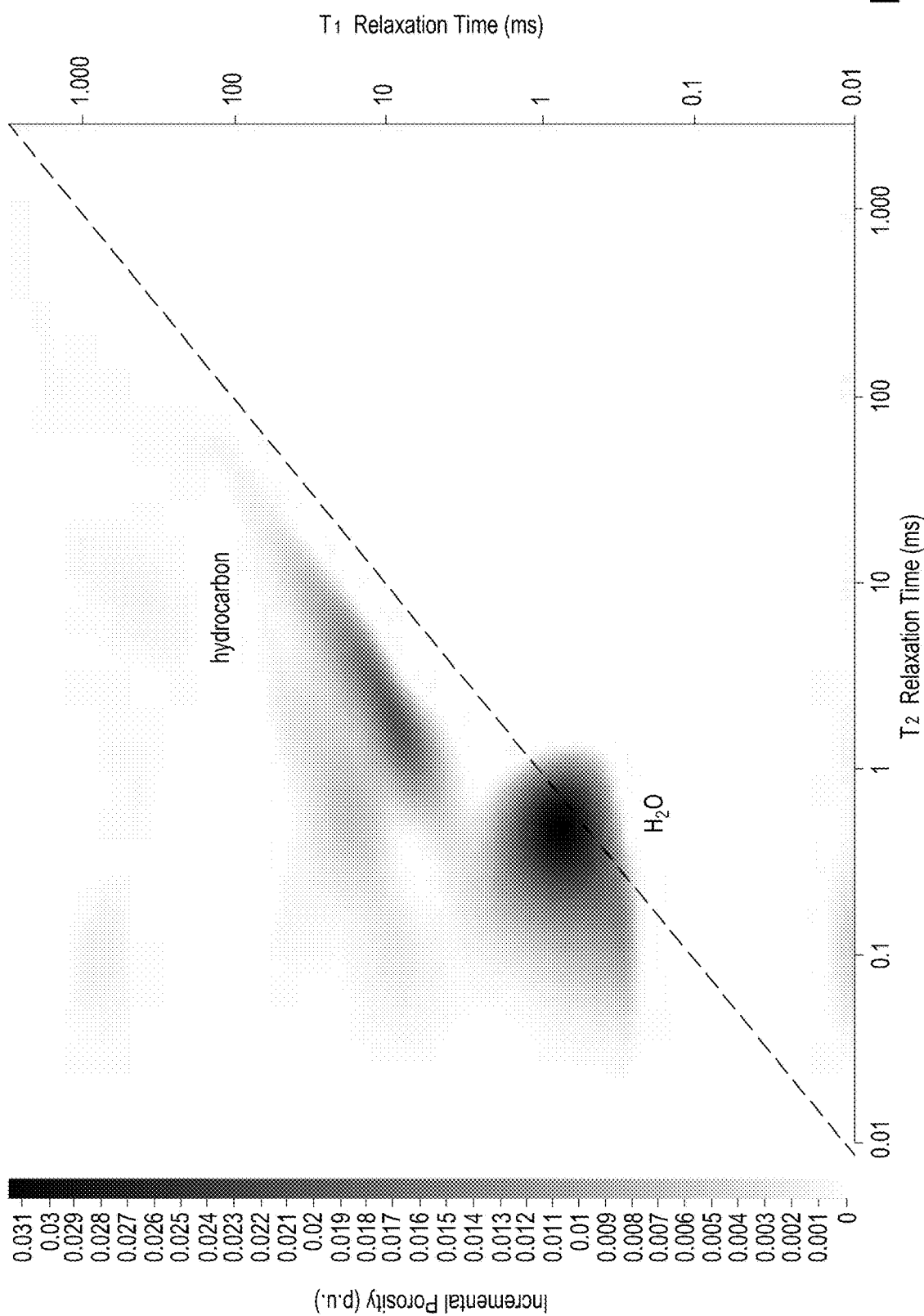
FIG. 13 is the $T_1$-$T_2$ correlation map for a shale core sample as-received.
Figure 14:
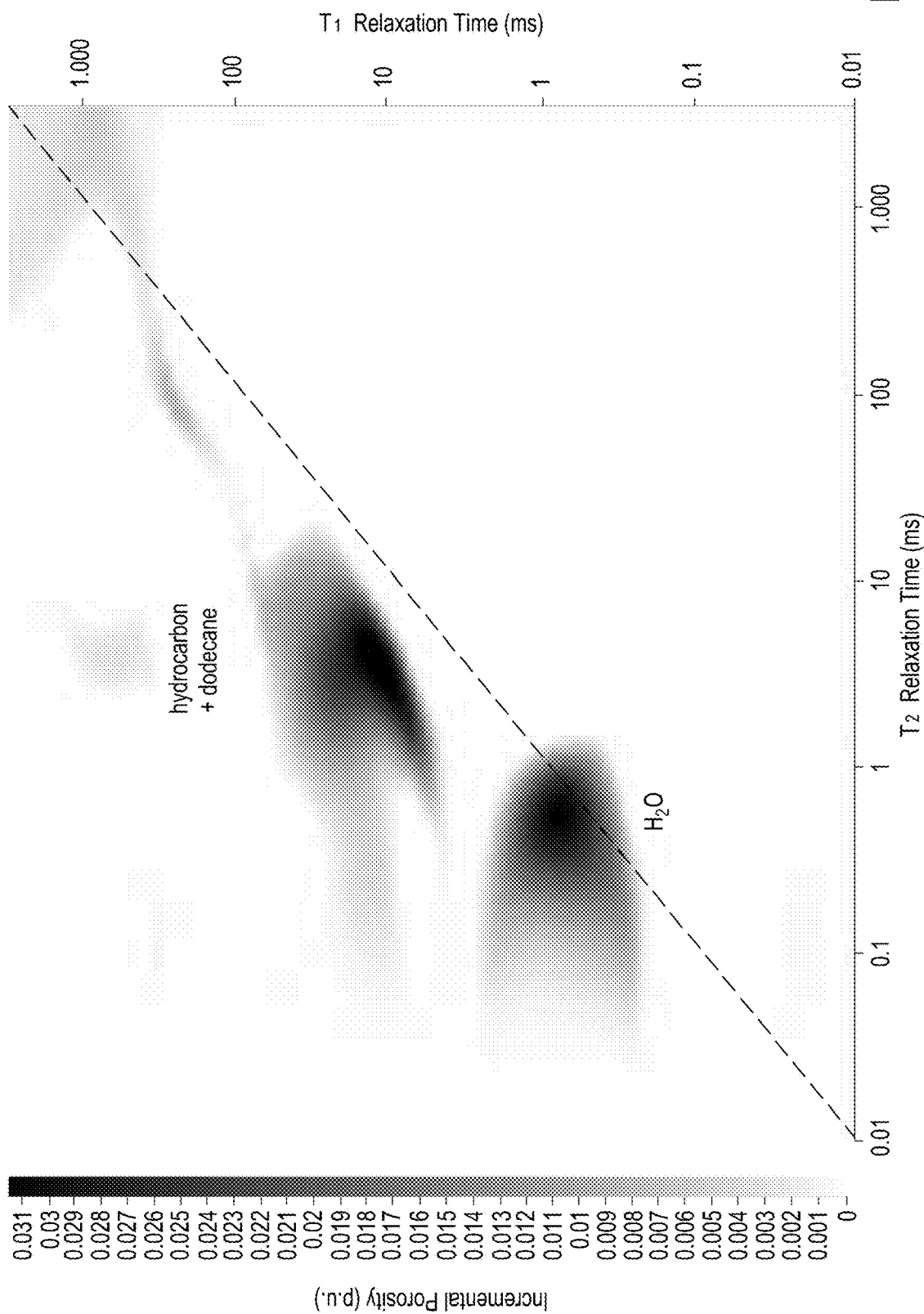
FIG. 14 is the $T_1$-$T_2$ correlation map for a saturated core sample.
Figure 15:
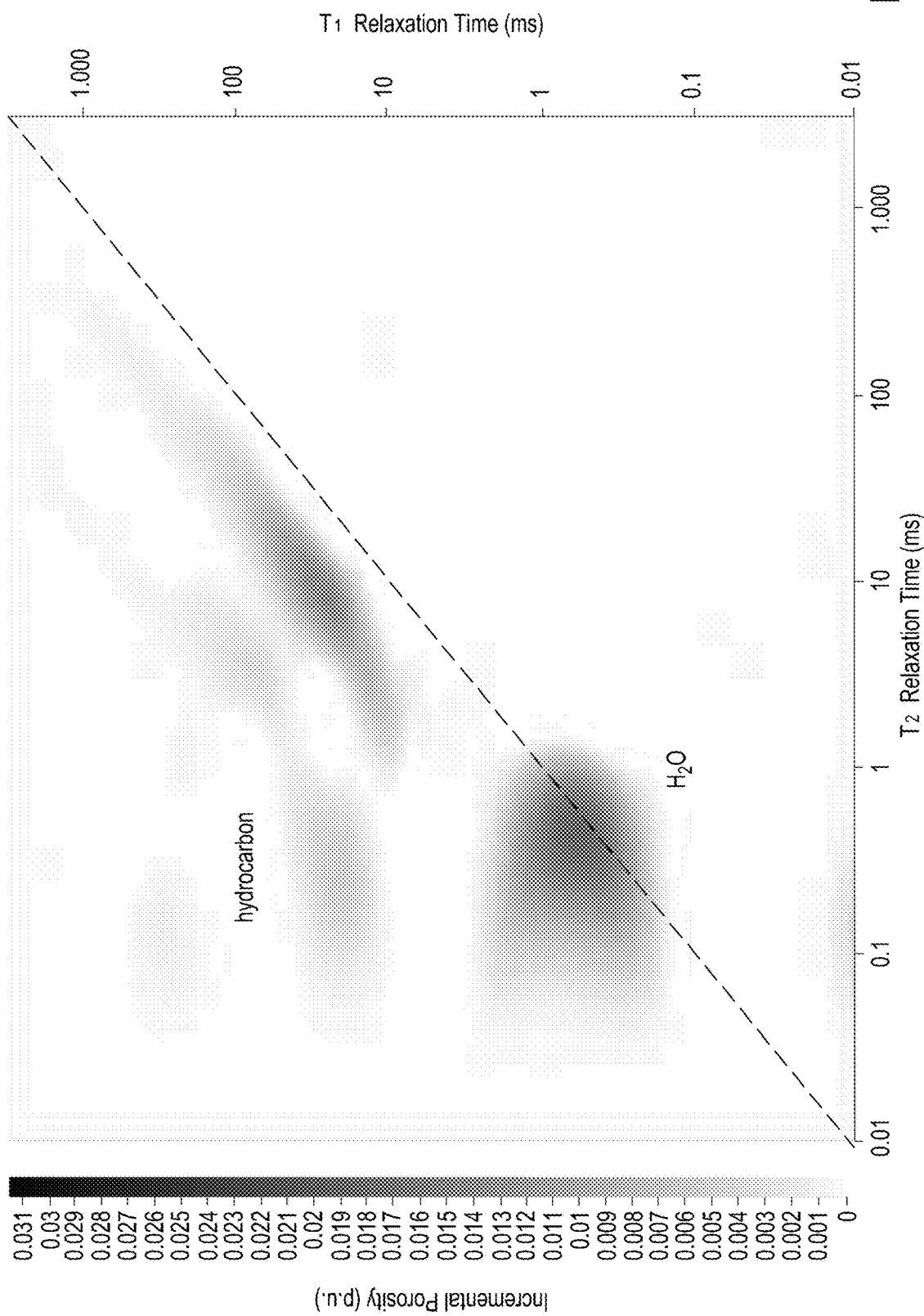
FIG. 15 is the $T_1$-$T_2$ correlation map for a core sample after diffusional exchange with deuterated toluene.
Figure 16:
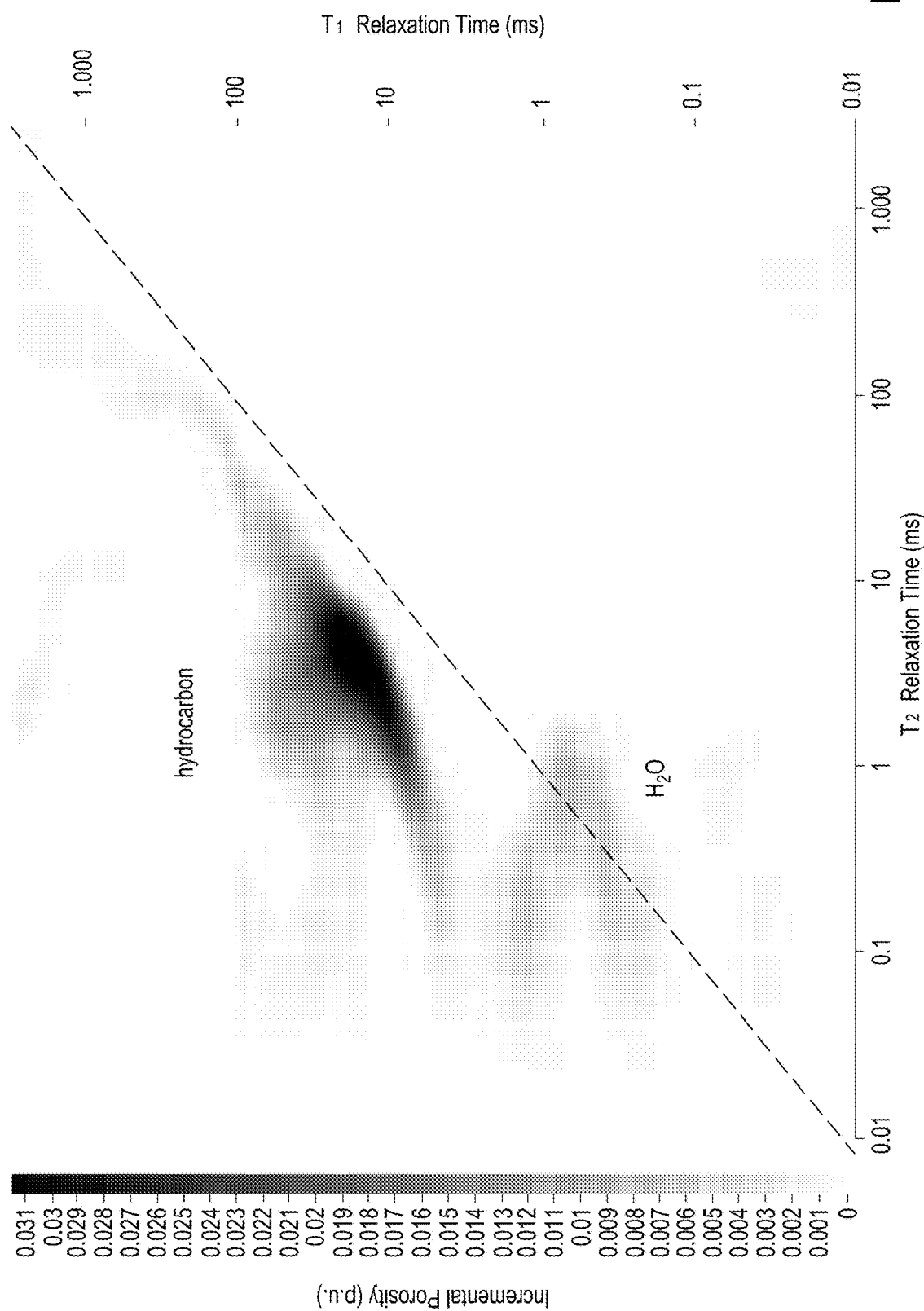
FIG. 16 is the $T_1$-$T_2$ correlation map for a core sample after diffusional exchange with deuterated water.

FIG. 13 is the $T_1$-$T_2$ correlation map for a shale core sample as-received, which indicates that the water content is 5.7 BV % and the hydrocarbon content is 3.5 BV %. The core sample was then saturated with dodecane (a NMR saturation fluid). FIG. 14 is the $T_1$-$T_2$ correlation map for the saturated core sample, which indicates that the water content is 5.7 BV % and the hydrocarbon content is 7.0 BV %. The saturated core sample was then cut into several pieces. A first piece of the saturated core sample was immersed in deuterated toluene (a NMR exchange fluid) for 13 days to diffusionally exchange the hydrocarbon in the core sample for the deuterated toluene. FIG. 15 is the $T_1$-$T_2$ correlation map for the core sample after diffusional exchange with deuterated toluene, which indicates that the water content is 5.9 BV % and the hydrocarbon content is 2.4 BV %. Therefore, the mobile hydrocarbon volume is 4.6 BV %. Then, a second piece of the saturated core sample was immersed in deuterated water (a NMR exchange fluid) for 14 days to diffusionally exchange the water in the core sample for the deuterated water. FIG. 16 is the $T_1$-$T_2$ correlation map for the core sample after diffusional exchange with deuterated water, which indicates that the water content is 1.4 BV % and the hydrocarbon content is 7.1 BV %. Therefore, the mobile water volume is 4.3 BV %. Further, the immobile fluid volume is 6.7 BV %.

Accordingly, a method of the present disclosure can comprise: determining a porosity of a core sample, wherein the core sample has a permeability of 10 mD or less (e.g., via a method described herein using NMR measurements or by another method); saturating the core sample with a NMR saturation fluid; taking a first NMR measurement of fluids in the core sample; diffusionally exchanging a hydrophobic fluid or a hydrophilic fluid in the core sample in a hydrophobic NMR exchange fluid or a hydrophilic NMR exchange fluid, respectively; taking a second NMR measurement of the fluid in the core sample after diffusional exchange; and deriving a property of the core sample based on the porosity, a NMR signal to fluid volume calibration, a comparison between the first NMR measurement and the second NMR measurement, wherein the property of the core sample is selected from a first group consisting of a mobile oil volume, an immobile hydrocarbon volume, and a combination thereof when using the hydrophobic NMR exchange fluid or is selected from the second group consisting of a mobile water volume, an immobile water volume, and a combination thereof when using the hydrophilic NMR exchange fluid, wherein the NMR measurements are $^1$H $T_1$-$T_2$ 2-dimensional correlation map measured with low-field and/or intermediate-field NMR and the comparison is a change in an area under a $^1$H $T_1$-$T_2$ relaxation time plot from $T_2$ of 0.1 ms to 300 ms and $T_1$ of 0.1 ms to 300 ms.

Examples 1-3 illustrate that diffusional exchange can be used to derive mobile oil and mobile water volumes.

In yet another example, a method of the present disclosure for assessing fluid mobility in a core sample can include determining a porosity of a core sample, wherein the core sample has a permeability of 10 mD or less (e.g., via a method described herein using NMR measurements or by another method); saturating the core sample with a NMR saturation fluid; taking a first NMR measurement of fluids in the core sample; diffusionally exchanging a hydrophobic fluid or a hydrophilic fluid in the core sample in a hydrophobic NMR exchange fluid or a hydrophilic NMR exchange fluid, respectively; taking a second NMR measurement of the fluid in the core sample after diffusional exchange; and deriving a property of the core sample based on the porosity, a NMR signal to fluid volume calibration, a comparison between the first NMR measurement and the second NMR measurement, wherein the property of the core sample is selected from a first group consisting of a mobile oil volume, an immobile hydrocarbon volume, and a combination thereof when using the hydrophobic NMR exchange fluid or is selected from the second group consisting of a mobile water volume, an immobile water volume, and a combination thereof when using the hydrophilic NMR exchange fluid, wherein the NMR measurements are $^1$H $T_1$/$T_2$ ratio measured with low-field and/or intermediate-field NMR and the comparison is a change in an area under a $^1$H $T_1$/$T_2$ ratio of $1 < {}^1$H $T_1$/$T_2$ ratio$\leq 100$.

In yet another example, a method of the present disclosure for assessing fluid mobility in a core sample can include determining a porosity of a core sample, wherein the core sample has a permeability of 10 mD or less (e.g., via a method described herein using NMR measurements or by another method); saturating the core sample with a NMR saturation fluid; taking a first NMR measurement of fluids in the core sample; diffusionally exchanging a hydrophobic fluid or a hydrophilic fluid in the core sample in a hydrophobic NMR exchange fluid or a hydrophilic NMR exchange fluid, respectively; taking a second NMR measurement of the fluid in the core sample after diffusional exchange; and deriving a property of the core sample based on the porosity, aNMR signal to fluid volume calibration, a comparison between the first NMR measurement and the second NMR measurement, wherein the property of the core sample is selected from a first group consisting of a mobile oil volume, an immobile hydrocarbon volume, and a combination thereof when using the hydrophobic NMR exchange fluid or is selected from the second group consisting of a mobile water volume, an immobile water volume, and a combination thereof when using the hydrophilic NMR exchange fluid, wherein the NMR measurements are imaging measured with intermediate-field and/or high-field NMR the comparison is a change in a $T_2$- and $T_1$-relaxation corrected signal for a fluid within spatial boundaries of the core sample.

In yet another example, a method of the present disclosure for assessing fluid mobility in a core sample can include determining a porosity of a core sample, wherein the core sample has a permeability of 10 mD or less (e.g., via a method described herein using NMR measurements or by another method); saturating the core sample with a NMR saturation fluid; taking a first NMR measurement of fluids in the core sample; diffusionally exchanging a hydrophobic fluid or a hydrophilic fluid in the core sample in a hydrophobic NMR exchange fluid or a hydrophilic NMR exchange fluid, respectively; taking a second NMR measurement of the fluid in the core sample after diffusional exchange; and deriving a property of the core sample based on the porosity, aNMR signal to fluid volume calibration, a comparison between the first NMR measurement and the second NMR measurement, wherein the property of the core sample is selected from a first group consisting of a mobile oil volume, an immobile hydrocarbon volume, and a combination thereof when using the hydrophobic NMR exchange fluid or is selected from the second group consisting of a mobile water volume, an immobile water volume, and a combination thereof when using the hydrophilic NMR exchange fluid, wherein the NMR measurements are $T_2$ NMR signal intensity as a function of refocusing delay and the comparison is in a y-value at a y-intercept of an extrapolation of the $T_2$ NMR signal intensity including x=0.

Producible Fluid Volume, Producible Hydrocarbon Volume, Producible Oil Volume, Producible Water Volume, Producible Gas Volume The producible fluid volume in total and for different types of fluid is important to identifying target production zones in ultra-low permeability formations. Producible fluids are defined as the amount of the fluid that can be extracted from the formation by gas expansion. This is taken to correspond to the amount of mobile fluid that comes from the core sample when bringing the core sample from formation conditions to ambient conditions. Depressurization of gas in the core drives fluids out of the core. At ambient conditions, virtually all of the gas has been displaced along with a fraction of the mobile oil and a fraction of the mobile water. A more rigorous displacement of gas can be accomplished by placing the core under vacuum. However, this is not required for a measurement of producible fluid volumes. Therefore, how the core sample is treated and fluid elution therefrom relates to calculating a producible fluid volume.

In a first example, when a core sample is preserved at formation pressure and temperature, the core sample can be brought to ambient temperature and pressure in a controlled environment where the hydrocarbon (gas and oil) and water that elute from the core sample are collected. The volume of the collected fluids can be then be measured. The methods described herein can then be used to determine porosity, mobile oil volume, mobile water volume, and immobile fluid volume, which are then used in combination with the volume of the collected fluids to provide a producible fluid volume in total or by fluid type. In the porosity measurement, the gas eluted from the core sample while under vacuum as well as gas eluted when equilibrating to ambient conditions provides the producible gas volume. In computing the producible gas volume, the measured volume of gas has to be adjusted to the pressure and temperature conditions in the original formation. Accordingly, the producible gas volume is volume of gas eluted from the core adjusted to the formation conditions. The producible oil volume is volume of the oil eluted when equilibrating the core sample to ambient conditions. Similarly, the producible water volume is the volume of water eluted when equilibrating the core sample to ambient conditions. The producible hydrocarbon volume is the producible oil volume plus the producible gas volume. The producible fluid volume is the sum of the producible hydrocarbon volume and the producible water volume. The porosity is the producible fluid volume plus the immobile fluid volume.

In another example, the core samples can be extracted from the formation and allowed to come to ambient temperature and/or pressure as the coring tool ascends from the collection location to the top of the borehole. Where the fluids that elute from the core sample are measured during ascension or collected during ascension and measured later, the above methods for determining the producible fluid volume in total and for different types of fluid can be implemented.

In another example, if only some or none of the liquid that elutes from the core sample during equilibration to ambient conditions is collected, a minimum producible hydrocarbon volume and minimum producible water volume can be determined. These types of cores are referred to as non-preserved cores. The producible hydrocarbon volume is determined by measuring the hydrocarbon signal in the non-preserved core and then diffusionally exchanging a NMR visible hydrocarbon into the core. The change in the NMR hydrocarbon signal before and after the exchange provides a direct measurement of the producible hydrocarbon volume. Similarly, the producible water volume can be determined by measuring the water signal in the non-preserved core and then diffusionally exchanging water into the core and comparing with a new NMR measurement of the water signal. If the producible gas volume is desired, the gas to oil ratio in the initially produced fluid from the formation can be used to estimate the producible gas volume from the NMR determination of the producible hydrocarbon volume using the assumption that the gas to oil ratio is the same for all of the producible oil volume. Equivalently this procedure can be used to obtain the producible oil volume from the NMR determination of producible hydrocarbon volume.

Accordingly, a method of the present disclosure can comprise: determining a porosity of a core sample, wherein the core sample has a permeability of 10 mD or less (e.g., via a method described herein using NMR measurements or by another method); saturating the core sample with a NMR saturation fluid; taking a first NMR measurement of fluids in the core sample; diffusionally exchanging a hydrophobic fluid in the core sample in a hydrophobic NMR exchange fluid; taking a second NMR measurement of the fluid in the core sample after diffusional exchange; deriving a first property of the core sample based on the porosity, a NMR signal to fluid volume calibration, a comparison between the first NMR measurement and the second NMR measurement, wherein the first property of the core sample is selected from a first group consisting of a mobile oil volume, an immobile hydrocarbon volume, and a combination thereof; diffusionally exchanging the hydrophilic fluid in the core sample in the hydrophilic NMR exchange fluid; taking a third NMR measurement of the fluid in the core sample after diffusional exchange with the hydrophilic NMR exchange fluid; deriving a second property of the core sample based on the porosity, a NMR signal to fluid volume calibration, a comparison between the second NMR measurement and the third NMR measurement, wherein the second property of the core sample is selected from a first group consisting of a mobile water volume, an immobile water volume, a mobile fluid volume, an immobile fluid volume, and any combination thereof, wherein the two steps of diffusional exchange can be performed in either order (e.g., hydrophilic diffusional exchange before hydrophobic diffusional exchange); determining a total volume of oil eluted from the core sample between extraction from a formation and being brought to ambient conditions; and deriving a producible oil volume based on the producible oil volume equaling the sum of the mobile oil volume and the total volume of the oil eluted from the core sample.

Another method of the present disclosure can comprise: determining a porosity of a core sample, wherein the core sample has a permeability of 10 mD or less (e.g., via a method described herein using NMR measurements or by another method); saturating the core sample with a NMR saturation fluid; taking a first NMR measurement of fluids in the core sample; diffusionally exchanging a hydrophobic fluid in the core sample in a hydrophobic NMR exchange fluid; taking a second NMR measurement of the fluid in the core sample after diffusional exchange; deriving a first property of the core sample based on the porosity, a NMR signal to fluid volume calibration, a comparison between the first NMR measurement and the second NMR measurement, wherein the first property of the core sample is selected from a first group consisting of a mobile oil volume, an immobile hydrocarbon volume, and a combination thereof; diffusionally exchanging the hydrophilic fluid in the core sample in the hydrophilic NMR exchange fluid; taking a third NMR measurement of the fluid in the core sample after diffusional exchange with the hydrophilic NMR exchange fluid; deriving a second property of the core sample based on the porosity, a NMR signal to fluid volume calibration, a comparison between the second NMR measurement and the third NMR measurement, wherein the second property of the core sample is selected from a first group consisting of a mobile water volume, an immobile water volume, a mobile fluid volume, an immobile fluid volume, and any combination thereof, wherein the two steps of diffusional exchange can be performed in either order (e.g., hydrophilic diffusional exchange before hydrophobic diffusional exchange); determining a portion of a total volume of oil eluted from the core sample between extraction from a formation and being brought to ambient conditions; and deriving a minimum producible oil volume based on the producible oil volume equaling the sum of the mobile oil volume and the portion of the total volume of the oil eluted from the core sample.

Yet another method of the present disclosure can comprise: determining a porosity of a core sample, wherein the core sample has a permeability of 10 mD or less (e.g., via a method described herein using NMR measurements or by another method); saturating the core sample with a NMR saturation fluid; taking a first NMR measurement of fluids in the core sample; diffusionally exchanging a hydrophobic fluid in the core sample in a hydrophobic NMR exchange fluid; taking a second NMR measurement of the fluid in the core sample after diffusional exchange; deriving a first property of the core sample based on the porosity, a NMR signal to fluid volume calibration, a comparison between the first NMR measurement and the second NMR measurement, wherein the first property of the core sample is selected from a first group consisting of a mobile oil volume, an immobile hydrocarbon volume, and a combination thereof; diffusionally exchanging the hydrophilic fluid in the core sample in the hydrophilic NMR exchange fluid; taking a third NMR measurement of the fluid in the core sample after diffusional exchange with the hydrophilic NMR exchange fluid; deriving a second property of the core sample based on the porosity, a NMR signal to fluid volume calibration, a comparison between the second NMR measurement and the third NMR measurement, wherein the second property of the core sample is selected from a first group consisting of a mobile water volume, an immobile water volume, a mobile fluid volume, an immobile fluid volume, and any combination thereof, wherein the two steps of diffusional exchange can be performed in either order (e.g., hydrophilic diffusional exchange before hydrophobic diffusional exchange); determining a total volume of water eluted from the core sample between extraction from a formation and being brought to ambient conditions; and deriving a producible water volume based on the producible water volume equaling the sum of the mobile water volume and the total volume of the water eluted from the core sample.

Another method of the present disclosure can comprise: determining a porosity of a core sample, wherein the core sample has a permeability of 10 mD or less (e.g., via a method described herein using NMR measurements or by another method); saturating the core sample with a NMR saturation fluid; taking a first NMR measurement of fluids in the core sample; diffusionally exchanging a hydrophobic fluid in the core sample in a hydrophobic NMR exchange fluid; taking a second NMR measurement of the fluid in the core sample after diffusional exchange; deriving a first property of the core sample based on the porosity, a NMR signal to fluid volume calibration, a comparison between the first NMR measurement and the second NMR measurement, wherein the first property of the core sample is selected from a first group consisting of a mobile oil volume, an immobile hydrocarbon volume, and a combination thereof; diffusionally exchanging the hydrophilic fluid in the core sample in the hydrophilic NMR exchange fluid; taking a third NMR measurement of the fluid in the core sample after diffusional exchange with the hydrophilic NMR exchange fluid; deriving a second property of the core sample based on the porosity, a NMR signal to fluid volume calibration, a comparison between the second NMR measurement and the third NMR measurement, wherein the second property of the core sample is selected from a first group consisting of a mobile water volume, an immobile water volume, a mobile fluid volume, an immobile fluid volume, and any combination thereof, wherein the two steps of diffusional exchange can be performed in either order (e.g., hydrophilic diffusional exchange before hydrophobic diffusional exchange); determining a portion of a total volume of water eluted from the core sample between extraction from a formation and being brought to ambient conditions; and deriving a minimum producible water volume based on the producible water volume equaling the sum of the mobile water volume and the portion of the total volume of the water eluted from the core sample.

Nanopore Oil Volume, Micropore Oil Volume, Macropore Oil Volume, Nanopore Water Volume, Micropore Water Volume, and Macropore Water Volume Again, as stated in the definitions section, the terms "nanopores," "micropore," and "macropore" are relative terms and do not imply specific dimensions. Rather, the terms are based on fluids having a different NMR response in different pore structures.

Extracting oil from different size pores can require different production techniques. Generally, oil in contact with the rock can be more difficult to produce because of interactions between the rock and the oil. Therefore, larger volumes of oil in macropores may be more easily produced because the volume to surface area ratio of the macropores is greatest. Production of oil from micropores and nanopores may require additional interventions like chemical floods or steam injection. Accordingly, knowing the volume of oil in each of these pore structures may provide valuable insight to the production methods needed for different areas of the reservoir.

Conversely, water in different pore sizes can create different issues. Generally, water production is preferably minimal. As in oil above, water in the larger pores is more readily produced. Current methods only provide an estimated amount of water in the reservoir. However, if most of that water is in nanopores, then water production could be minimal and less costly water mitigation technique could be implemented to minimize water in the produced fluid. However, if the water is primarily in macropores, then a more aggressive approach may be used to mitigate water production. Alternatively, that portion of the formation may be bypassed for production.

Knowing the distribution of water and/or oil in the pore volume of core samples would be useful in developing a production plan for a wellbore.

The NMR response of fluids in different pore sizes is effected by the volume to surface area ratio and the relative confinement. For the volume to surface area ratio, the composition of the rock in the formation can influence a nuclei's NMR response when in close proximity to the rock surface. Therefore, the composition of the rock has less influence on the NMR response of fluids in macropores as compared to nanopores. Relative confinement is similar except it is the mobility of the fluid molecule within the pore. Because nanopores are so small the natural movement of the fluid therein is limited. As fluid mobility is limited, the molecules may assemble or orient to some degree and the neighboring fluid molecules could have an effect on a nuclei's NMR responses.

Because of the volume to surface area ratio and the relative confinement of fluids within the different pores, the fluids in the different pores have different NMR responses. For example, fluids in nanopores are the most confined and interact with the rock the most. Accordingly, the fluids in nanopores have a shorter relaxation time. The fluids in micropores are less confined and interact less with the rock and, therefore, have longer relaxation times. Continuing the trend, the fluid in macropores have even longer relaxation times, followed by external or free fluid with the longest relaxation times.

The exact ranges of relaxation times associated with each of the pore types will depend on the composition of the rock and the pore surface, the composition of the fluids, the temperature of the sample, and the magnetic field strength. Tables 1 and 2 provide a list of conditions with the corresponding $^1$H NMR $T_2$ and $T_1$ relaxation time ranges, respectively.

TABLE 1

| Parameters | |
| --- | --- |
| Temperature | 25° C. |
| NMR Acquisition Parameters | low-field and/or intermediate-field NMR $T_2$ Relaxation Ranges |
| Pore Type | Range |
| Nanopores | 0.1 ms ≤ $T_2$ < 1.5 ms |
| Micropores | 1.5 ms ≤ $T_2$ < 30 ms |
| Macropores | 30 ms ≤ $T_2$ < 300 ms |
| External or Free Fluid | 300 ms and greater |

TABLE 2

| Parameters | |
| --- | --- |
| Temperature | 25° C. |
| NMR Acquisition Parameters | low-field and/or intermediate-field NMR $T_1/T_2$ Ratio Ranges |
| Pore Type | Range |
| Nanopores | 10 < $T_1/T_2$ ≤ 100 |
| Micropores | 3 < $T_1/T_2$ ≤ 10 |
| Macropores | 1 < $T_1/T_2$ ≤ 3 |
| External or Free Fluid | $T_1/T_2$ = 1 |

For core samples that are not sealed with the formation fluids therein, the macro pores can be at least partially empty because fluids therein can easily flow out. Accordingly, the core sample should either be submerged in a fluid bath and/or placed in a pressure cell to fill the entire porosity of the core sample.

Once the NMR measurements are performed, the area under the $T_2$ spectrum relates to the volume of fluid in the pores. Knowing the porosity or, more specifically, the volume of voids in the core sample, the area under the $T_2$ spectrum for the three pore types (0.1 ms≤$T_2$≤300 ms) cumulatively can be assigned 100% of volume of voids. Then, the percentage of area under the $T_2$ spectrum for each individual pore type relative to the total area under the $T_2$ spectrum up to 300 ms corresponds to a percent volume, from which total volume for each individual pore type can be extrapolated.

In an example method, the fluid in a core sample is saturated with a NMR situation fluid. Then, a low-field NMR can be used in relaxometery mode for collecting $T_2$ relaxation times with a variable refocusing delay time τ. Then, the total proton content (which relates to the total fluid present as described above) for each of the ranges in Table 1 correlates to the volume of fluid in each pore type and, consequently, a pore type distribution.

Example 4

Figure 18:
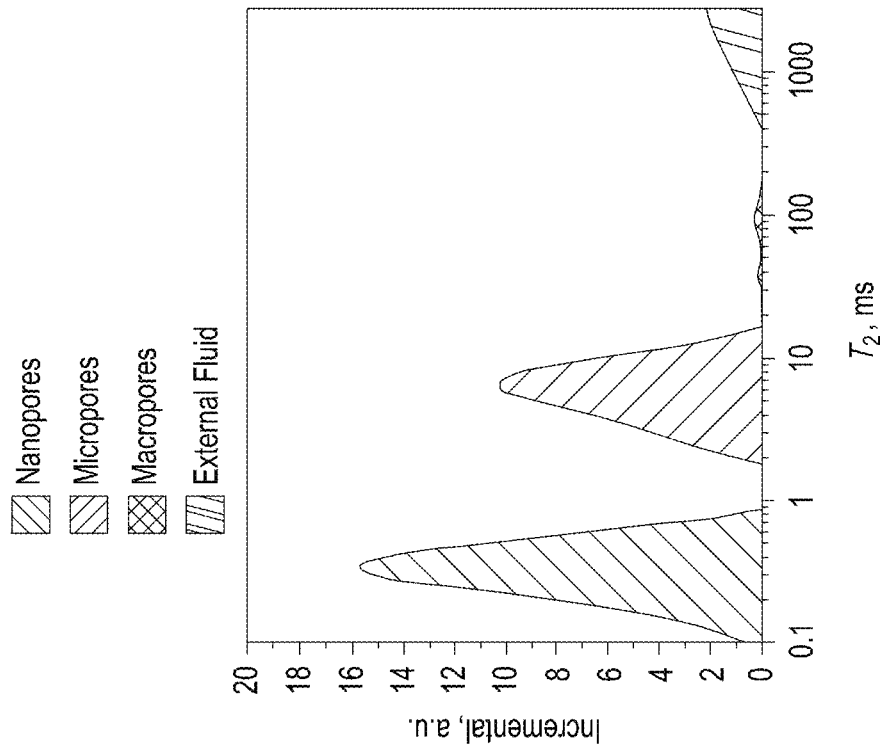
FIG. 18 is the $T_2$ spectrum for the high porosity shale core sample.
Figure 17:
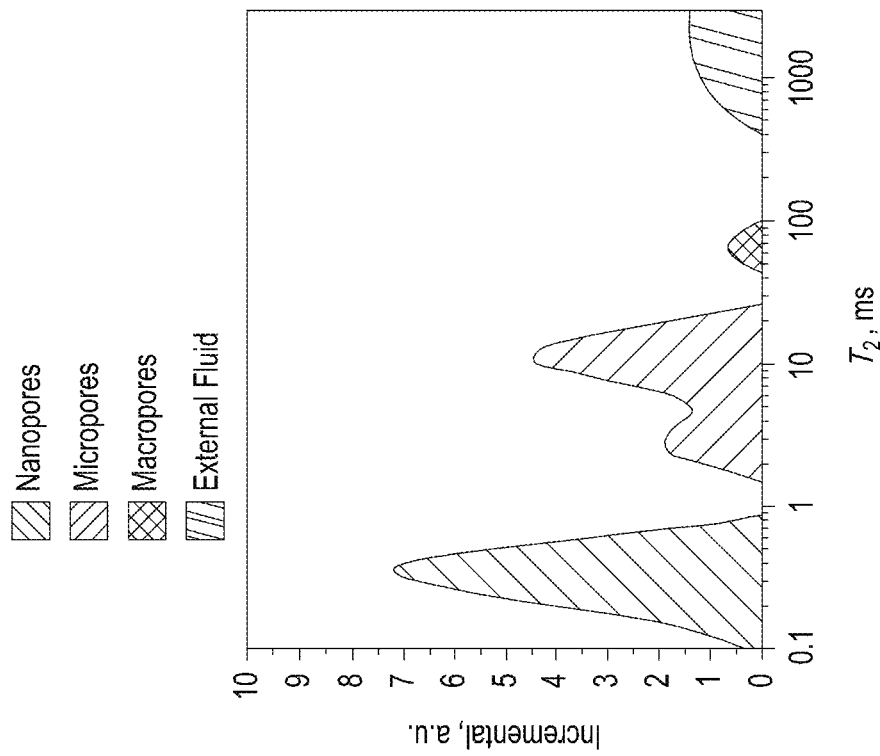
FIG. 17 is the $T_2$ spectrum for the low porosity shale core sample.

Porosity Type. Two core samples (a low porosity shale core sample and a high porosity shale core sample) were treated to remove the native fluid therein and then saturated with toluene. $T_2$ relaxation measurements (2 MHz, 51 mm probe, CPMG pulse sequence, τ=200 μs, 25° C., confinement pressure 4500 psig, pore pressure 3500 psig) were performed on the fluids of the core samples. FIG. 17 is the $T_2$ spectrum for the low porosity shale core sample, and FIG. 18 is the $T_2$ spectrum for the high porosity shale core sample. In FIGS. 17 and 18, the pore types are labeled.

For the low porosity shale core sample (FIG. 17), the nanopores contain about 0.95 cm$^3$ of toluene, the micropores contain about 0.68 cm$^3$ of toluene, the macropores contain about 0.046 cm$^3$ of toluene, and the external fluid contains about 0.24 cm$^3$ of toluene. For the high porosity shale core sample (FIG. 18), the nanopores contain about 1.99 cm$^3$ of toluene, the micropores contain about 1.37 cm$^3$ of toluene, the macropores contain about 0.037 cm$^3$ of toluene, and the external fluid contains about 0.22 cm$^3$ of toluene.

Example 5

Figure 19:
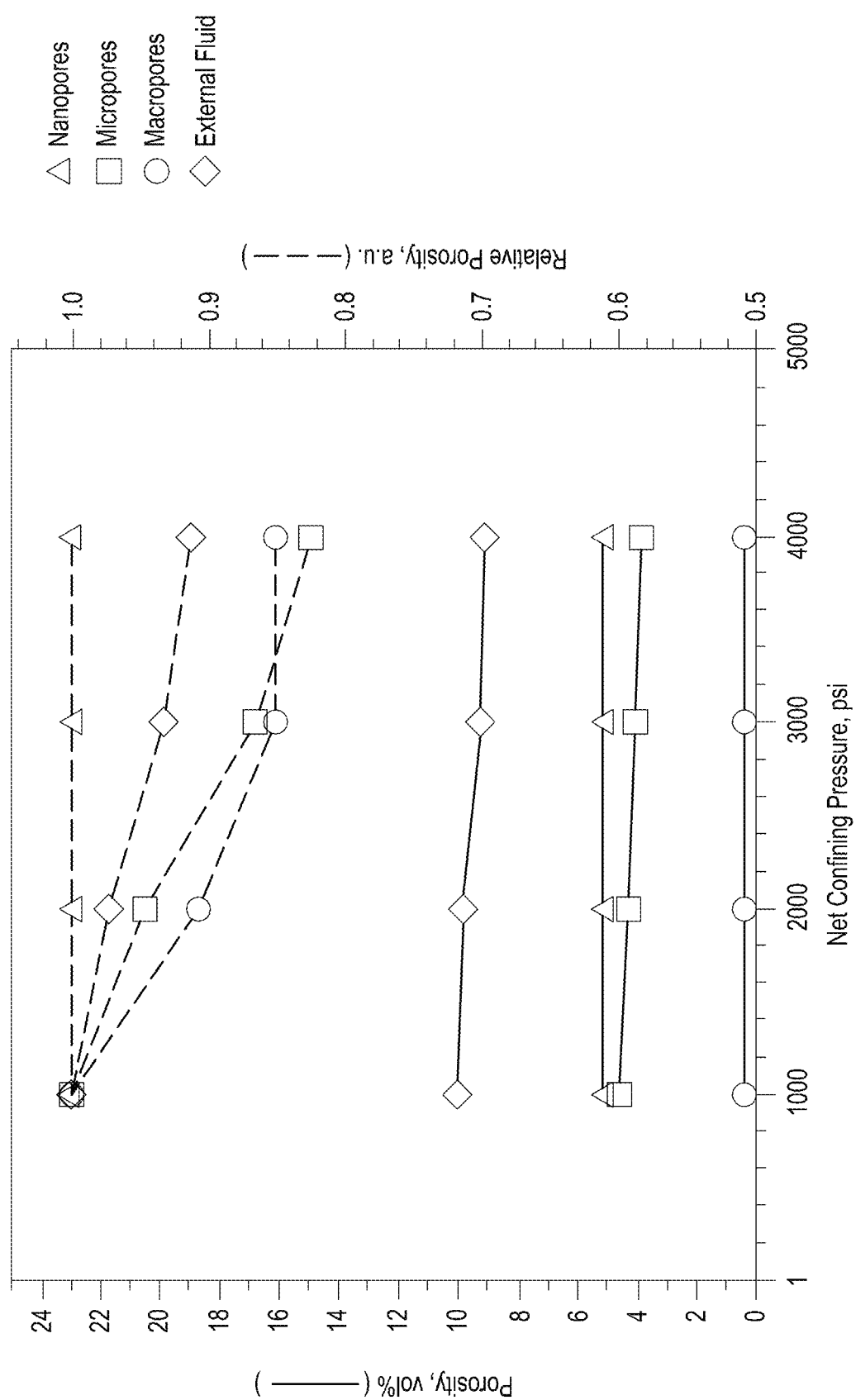
FIGS. 19 and 20 are plots of the net confining stress as a function of porosity volume for the low and high porosity shale core sample of FIGS. 13 and 14, respectively.

Simulated Production. Using the samples from Example 4, hydrocarbon production was simulated by decreasing the internal pore pressure from 3500 psig to 500 psig while maintaining a confining pressure of 4500 psig. By reducing the pore pressure, the net confining stress is reduced. FIGS. 19 (low porosity shale core sample) and 20 (high porosity shale core sample) are plots of the net confining stress as a function of porosity volume as determined by the NMR measurements described in Example 4.

Figure 20:
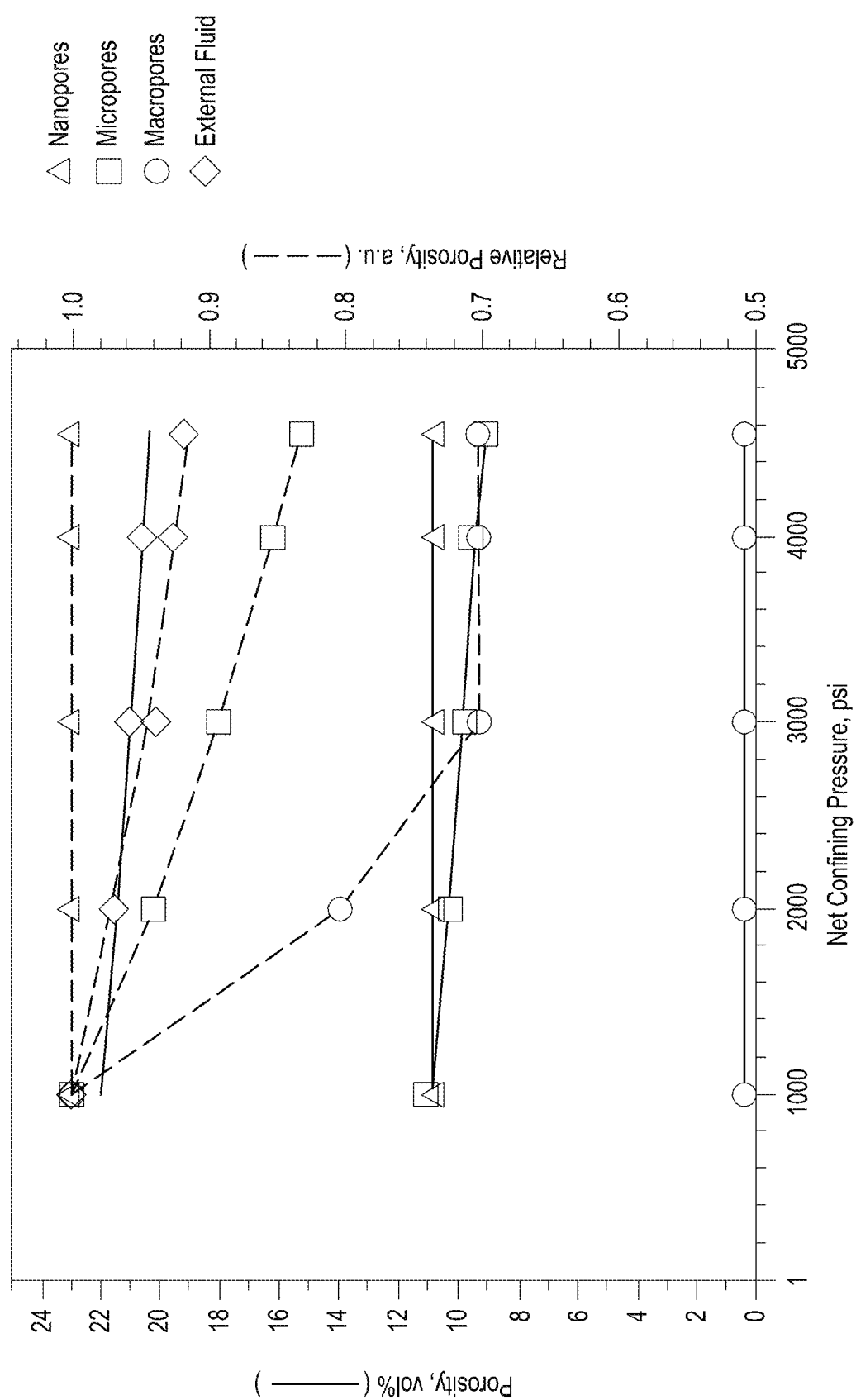

As seen in FIGS. 19 and 20, the NMR signals are stress dependent, which suggests that pore volumes are reduced with increasing stress. More specifically, the $T_2$ relaxation times corresponding to the nanopores and macropores is substantially unchanged, while the $T_2$ relaxation times corresponding to the micropores shows a slight tendency to decrease with higher net confining stress. This suggests that the micropores reduce in pore type with increasing net confining stress. In both samples, higher net confining stress caused a lower fluid volume in the core sample, which is interpreted as a reduction in pore volume and porosity.

Accordingly, a method of the present disclosure for analyzing pore type of a core sample may include: determining a porosity of a core sample, wherein the core sample has a permeability of 10 mD or less; saturating the core sample with a NMR saturation fluid to achieve a saturated core sample; taking a NMR measurement of fluids in the saturated core sample; deriving a volume for a pore type based on the porosity based on a correlation between the NMR measurement and a NMR signal to fluid volume calibration, wherein the pore type is selected from the group consisting of a nanopore, a micropore, a macropore, and any combination thereof, and wherein the NMR measurement is $^1$H $T_2$ relaxation times measured with low-field and/or intermediate-field NMR and the correlation is between the NMR signal to fluid volume calibration and an area under a $^1$H $T_2$ relaxation time spectrum for one selected from the group consisting of 0.1 ms≤$T_2$<1.5 ms for the nanopores, 1.5 ms≤$T_2$<30 ms for the micropores, 30 ms≤$T_2$<300 ms for the macropores, and any combination thereof.

Another method of the present disclosure for analyzing pore type of a core sample may include: determining a porosity of a core sample, wherein the core sample has a permeability of 10 mD or less; saturating the core sample with a NMR saturation fluid to achieve a saturated core sample; taking a NMR measurement of fluids in the saturated core sample; deriving a volume for a pore type based on the porosity based on a correlation between the NMR measurement and a NMR signal to fluid volume calibration, wherein the pore type is selected from the group consisting of a nanopore, a micropore, a macropore, and any combination thereof, and wherein the NMR measurement is $^1H$ $T_1/T_2$ ratio measured with low-field and/or intermediate-field NMR and the correlation is between the NMR signal to fluid volume calibration and the $^1H$ $T_1/T_2$ ratio for one selected from the group consisting of $10 \leq {}^1H\ T_1/T_2 < 100$ for the nanopores, $3 \leq {}^1H\ T_1/T_2 < 10$ for the micropores, $1 \leq {}^1H\ T_1/T_2 < 3$ for the macropores, and any combination thereof.

Another method of the present disclosure for analyzing pore type of a core sample may include: determining a porosity of a core sample, wherein the core sample has a permeability of 10 mD or less; saturating the core sample with a NMR saturation fluid to achieve a saturated core sample; taking a NMR measurement of fluids in the saturated core sample; deriving a volume for a pore type based on the porosity based on a correlation between the NMR measurement and a NMR signal to fluid volume calibration, wherein the pore type is selected from the group consisting of a nanopore, a micropore, a macropore, and any combination thereof, and wherein the NMR measurement is $^1H$ $T_1$-$T_2$ 2-dimensional correlation map measured with low-field and/or intermediate-field NMR and the correlation is between the NMR signal to fluid volume calibration and an area under the $^1H$ $T_1$-$T_2$ 2-dimensional correlation map for one selected from the group consisting of $0.1\ ms \leq T_2 < 1.5\ ms$ for the nanopores, $1.5\ ms \leq T_2 < 30\ ms$ for the micropores, $30\ ms \leq T_2 < 300\ ms$ for the macropores, and any combination thereof.

In yet another example method, diffusion NMR (also referred to as self-diffusion NMR) measurements can be used to determine the pore type distribution and the fluids in each pore type. Diffusion NMR techniques combine RF pulse with magnetic field gradients to identify spatial movement of molecules within the fixed observation time. The more intense and longer the magnetic gradient pulse in these techniques, the more spatially selective the technique is. By monitoring specific chemical shifts that correspond to water and/or hydrocarbons (as described in FIG. 4), the distribution of oil and water mobility is obtained. Further, because the method provides the distance the molecules diffuse over a specific time period, the fraction and volume of fluid in micropores (shorter travel distance) and macropores (longer travel distance) or in thin layers on the surface of the rock can also be determined after correction on signal losses due to $T_2$ and $T_1$ processes, which observed molecules experience during the coding and decoding experiment.

Accordingly, a method of the present disclosure for analyzing pore type of a core sample may include: determining a porosity of a core sample, wherein the core sample has a permeability of 10 mD or less; saturating the core sample with a NMR saturation fluid to achieve a saturated core sample; taking a NMR measurement of fluids in the saturated core sample; deriving a volume for a pore type based on the porosity based on a correlation between the NMR measurement and a NMR signal to fluid volume calibration, wherein the pore type is selected from the group consisting of a nanopore, a micropore, a macropore, and any combination thereof, and wherein the NMR measurement is diffusometry and the correlation is between the NMR signal to fluid volume calibration and a $T_2$- and $T_1$-relaxation corrected area under a diffusion spectrum for $1 \times 10^{-14}\ m^2/s <$ diffusion rate $\leq 1 \times 10^{-11}\ m^2/s$ for nanopores and/or for $1 \times 10^{-11}\ m^2/s <$ diffusion rate $\leq 1 \times 10^{-9}\ m^2/s$ for micropores.

Another method of the present disclosure for analyzing pore type of a core sample may include: determining a porosity of a core sample, wherein the core sample has a permeability of 10 mD or less; saturating the core sample with a NMR saturation fluid to achieve a saturated core sample; taking a NMR measurement of fluids in the saturated core sample; deriving a volume for a pore type based on the porosity based on a correlation between the NMR measurement and a NMR signal to fluid volume calibration, wherein the pore type is selected from the group consisting of a nanopore, a micropore, a macropore, and any combination thereof, and wherein the NMR measurement is $T_2$-weighted imaging and the correlation is between the NMR signal to fluid volume calibration and a $T_2$- and $T_1$-relaxation corrected signal for the fluids within spatial boundaries of the core sample where the $T_2$-weight is $0.1\ ms \leq T_2 < 1.5\ ms$ for the nanopores, where the $T_2$-weight is $1.5\ ms \leq T_2 < 30\ ms$ for the micropores, and where the $T_2$-weight is for $30\ ms \leq T_2 < 300\ ms$ for the macropores.

These examples illustrate that pore types can be detected and volume of fluid therein can be quantified. Therefore, combining these NMR measurement techniques with diffusional exchange for oil and/or water can provide a further understanding of which pore types the different formation fluids reside.

Further, the NMR measurements in combination with diffusional exchange can be used to identify which pore types the fluids are diffusing from and the amount of said fluids by pore type. Said NMR measurements can be those described for pore types, which include, but are not limited to, the values of $T_2$ relaxation times (e.g., $^1H$ $T_2$ values of Table 1); the values of $T_1/T_2$ ratios (e.g., $^1H$ $T_1/T_2$ ratios of Table 2); $T_2$ signal intensity as a function of refocusing delay; the $T_2$ and $T_1$-relaxation corrected signals within the spatial boundaries of the core sample; and the like; and any combination thereof. Accordingly, one or more of the following can be determined: a mobile nanopore oil volume, a mobile micropore oil volume, a mobile macropore oil volume, a mobile nanopore water volume, a mobile micropore water volume, a mobile macropore water volume, an immobile nanopore hydrocarbon volume, an immobile micropore

TABLE 3

| | Diffusion Rate (DR) ($m^2/s$) | |
| --- | --- | --- |
| Pore Type | Water | Hydrocarbon |
| Not confined and macropores | $2.7 \times 10^{-9}\ m^2/s < DR$ | $1 \times 10^{-9}\ m^2/s < DR$ |
| Micropores | $1 \times 10^{-11}\ m^2/s < DR \leq 2.7 \times 10^{-9}\ m^2/s$ | $1 \times 10^{-11}\ m^2/s < DR \leq 1 \times 10^{-9}\ m^2/s$ |
| Nanopores | $1 \times 10^{-14}\ m^2/s < DR \leq 1 \times 10^{-11}\ m^2/s$ | $1 \times 10^{-14}\ m^2/s < DR \leq 1 \times 10^{-11}\ m^2/s$ * |

*Hydrocarbon would not load into the zeolite, so this is an estimated range.

hydrocarbon volume, an irreducible macropore hydrocarbon volume, an irreducible nanopore water volume, an immobile micropore water volume, an immobile macropore water volume, an immobile nanopore volume, an immobile micropore volume, an immobile macropore volume, and any combination thereof.

For example, the NMR measurements can be $^1$H $T_2$ relaxation times where the reduction of $T_2$ signal intensity for over $T_2$ relaxation time ranges per Table 1 can be used to identify a volume of mobile water in each pore type (when a hydrophilic NMR exchange fluid is used) and/or identify a volume of mobile hydrocarbon in each pore type (when a hydrophobic NMR exchange fluid is used).

Pore Connectivity

Pore connectivity is the degree to which the pore types are intraconnected and interconnected. That is, pore connectivity analyzes the fluid movement within pores and between pore types. This is a qualitative analysis where comparison between the pore connectivity of different core samples may be useful to provide an indication that one formation has greater pore connectivity than another.

Diffusional exchange can be time consuming for large samples. On the other hand, the long exchange time allows for monitoring the entire evolution of the fluid exchange by detecting intermediate states. That is, the hierarchical movement of the fluid from the one pore type to another can be monitored. Expanding on the NMR analyses described above relative to the nanopore oil volume, micropore oil volume, macropore oil volume, nanopore water volume, micropore water volume, and macropore water volume, the diffusional exchange can be monitored over time by taking several NMR measurements over time where changes in NMR signal for the different pore types can be correlated to the hierarchical movement of the fluid from the one pore type to another.

Example 7

Figure 21:
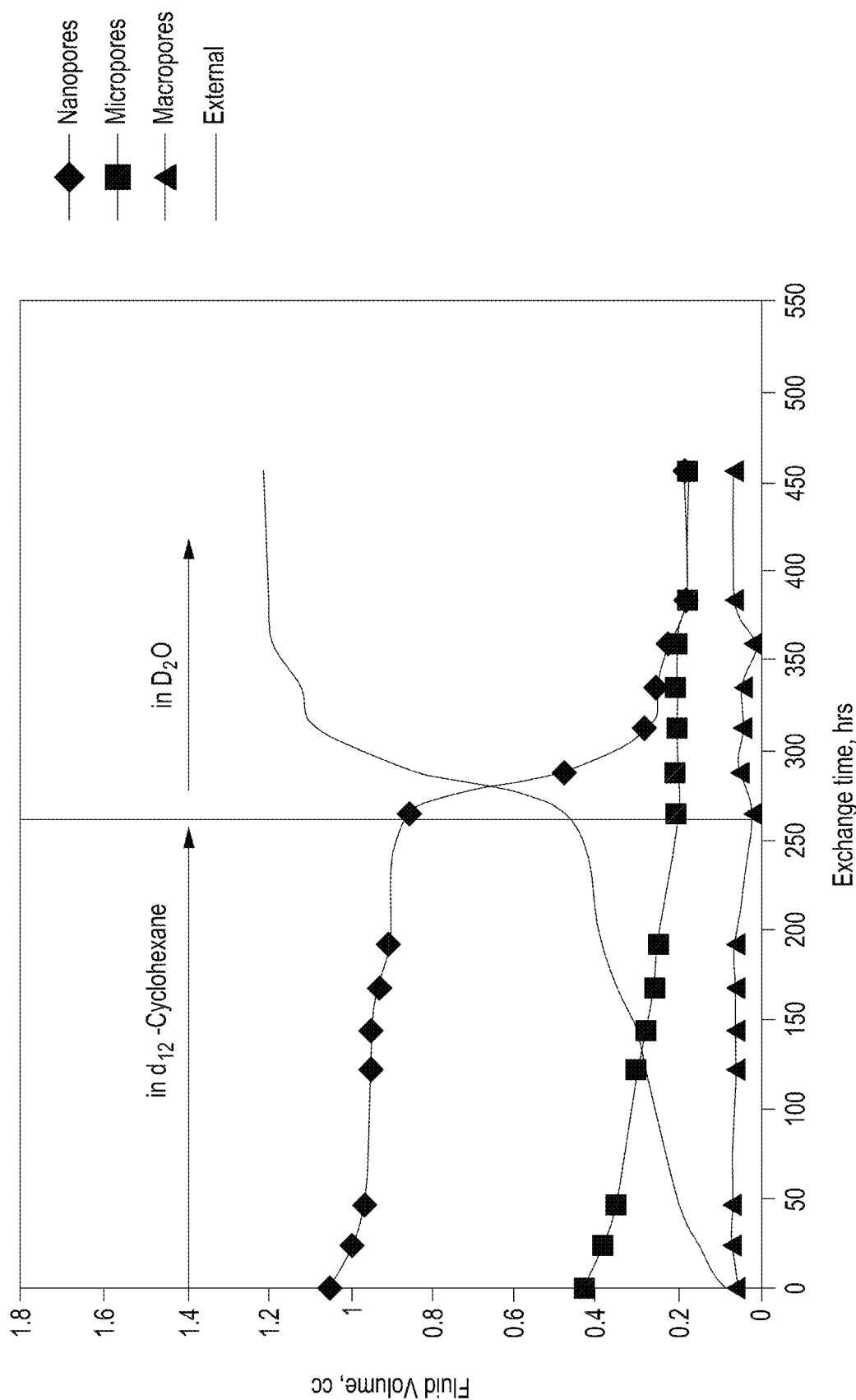
FIG. 21 is a plot of the exchange time as a function of fluid volume for a core sample that underwent fluid exchange for $d_{12}$-cyclohexane and then a fluid exchange for $D_2O$.

Pore Connectivity. The fluids in a core sample were diffusionally exchanged with $d_{12}$-cyclohexane for about 260 hours and then diffusionally exchanged with $D_2O$ for about 200 more hours. $T_2$ relaxation time NMR measurements (2 MHz, 51 mm probe, CPMG pulse sequence, $\tau=100$ μs, 24° C.) were taken several times over the 19 days. As described above, the amount of fluid in the nanopores, micropores, macropores, and fluid external to the core sample were derived from the $T_2$ relaxation time NMR measurements. FIG. 21 is a plot of the exchange time as a function of fluid volume with a vertical line to illustrate the time at which the NMR exchange fluid was changed from $d_{12}$-cyclohexane to $D_2O$.

The fluid exchange process in $d_{12}$-cyclohexane is somewhat slow. However, a reduction of $^1$H-containing fluid phase in nano-pores by ~15% and major reduction of in micropores by ~55% was observed while external $^1$H-containing fluid phase grew. Interestingly, $^1$H-containing fluid in macropores does not significantly change during first 200 hours as the macropores are likely responsible for the $^1$H-containing fluid transport from nano- and micro-pores to the external volume. Macropores are only drained in air when the sample was removed from the cyclohexane bath at 260 hours. Although the connectivity of nanopores directly with the micropores cannot be inferred, the nanopores and micropores are connected with macropores either directly and/or via each other. The macropores are connected to the external surface.

The evolution exchange of the hydrophilic fluid in the core sample with $D_2O$ after 260 hours is also illustrated in FIG. 21. While most of hydrocarbon fluid was exchanged with $d_{12}$-cyclohexane during previous 10 days of the exchange, $D_2O$ quickly replaced water molecules primarily located in the nanopores while fluid content in micropores is not significantly affected by the $D_2O$ exchange. Although macropores were dried in the air after cyclohexane exchange, water travels from nanopores through macropores keeping macro-pores filled at ~0.5 BV %.

For example, a method of the present disclosure for analyzing pore connectivity can include determining a porosity of a core sample, wherein the core sample has a permeability of 10 mD or less; taking a first NMR measurement of fluid in the core sample that is saturated; diffusionally exchanging a first fluid in the core sample in a first NMR exchange fluid, wherein (1) the first fluid is a hydrophobic fluid and the first NMR exchange fluid is a hydrophobic NMR exchange fluid or (2) the first fluid is a hydrophilic fluid and the second NMR exchange fluid is a hydrophilic NMR exchange fluid; taking a first plurality NMR measurement over time of the fluid in the core sample during diffusional exchange with the first NMR exchange fluid; analyzing a pore connectivity based on the porosity, a NMR signal to fluid volume calibration, and a comparison between the first NMR measurement and the first plurality of NMR measurements, wherein when using the hydrophobic NMR exchange fluid the pore connectivity analysis includes pore types selected from the group consisting of a nanopore oil volume, a micropore oil volume, a macropore oil volume, and any combination thereof, and wherein when using the hydrophilic NMR exchange fluid the pore connectivity analysis includes pore types selected from the group consisting of a nanopore water volume, a micropore water volume, a macropore water volume, and any combination thereof, wherein the NMR measurement is $^1$H $T_2$ relaxation times measured with low-field and/or intermediate-field NMR and the comparison is a change in an area under a $^1$H $T_2$ relaxation time spectrum for one selected from the group consisting of 0.1 ms≤$T_2$<1.5 ms for the nanopore volumes, 1.5 ms≤$T_2$<30 ms for the micropore volumes, 30 ms≤$T_2$<300 ms for the macropore volumes, and any combination thereof.

Another example method of the present disclosure for analyzing pore connectivity can include determining a porosity of a core sample, wherein the core sample has a permeability of 10 mD or less; taking a first NMR measurement of fluid in the core sample that is saturated; diffusionally exchanging a first fluid in the core sample in a first NMR exchange fluid, wherein (1) the first fluid is a hydrophobic fluid and the first NMR exchange fluid is a hydrophobic NMR exchange fluid or (2) the first fluid is a hydrophilic fluid and the second NMR exchange fluid is a hydrophilic NMR exchange fluid; taking a first plurality NMR measurement over time of the fluid in the core sample during diffusional exchange with the first NMR exchange fluid; analyzing a pore connectivity based on the porosity, a NMR signal to fluid volume calibration, and a comparison between the first NMR measurement and the first plurality of NMR measurements, wherein when using the hydrophobic NMR exchange fluid the pore connectivity analysis includes pore types selected from the group consisting of a nanopore oil volume, a micropore oil volume, a macropore oil volume, and any combination thereof, and wherein when using the hydrophilic NMR exchange fluid the pore connectivity analysis includes pore types selected from the group consisting of a nanopore water volume, a micropore water volume, a macropore water volume, and any combination thereof, wherein the NMR measurement is a $^1H$ $T_1/T_2$ ratio measured with low-field and/or intermediate-field NMR and the comparison is a change in the $^1H$ $T_1/T_2$ ratio for one selected from the group consisting of $10 \le {}^1H\, T_1/T_2 < 100$ for the nanopore volumes, $3 \le {}^1H\, T_1/T_2 < 10$ for the micropore volumes, $1 \le {}^1H\, T_1/T_2 < 3$ for the macropore volumes, and any combination thereof.

Yet another example method of the present disclosure for analyzing pore connectivity can include determining a porosity of a core sample, wherein the core sample has a permeability of 10 mD or less; taking a first NMR measurement of fluid in the core sample that is saturated; diffusionally exchanging a first fluid in the core sample in a first NMR exchange fluid, wherein (1) the first fluid is a hydrophobic fluid and the first NMR exchange fluid is a hydrophobic NMR exchange fluid or (2) the first fluid is a hydrophilic fluid and the second NMR exchange fluid is a hydrophilic NMR exchange fluid; taking a first plurality NMR measurement over time of the fluid in the core sample during diffusional exchange with the first NMR exchange fluid; analyzing a pore connectivity based on the porosity, a NMR signal to fluid volume calibration, and a comparison between the first NMR measurement and the first plurality of NMR measurements, wherein when using the hydrophobic NMR exchange fluid the pore connectivity analysis includes pore types selected from the group consisting of a nanopore oil volume, a micropore oil volume, a macropore oil volume, and any combination thereof, and wherein when using the hydrophilic NMR exchange fluid the pore connectivity analysis includes pore types selected from the group consisting of a nanopore water volume, a micropore water volume, a macropore water volume, and any combination thereof, wherein the NMR measurement is $^1H$ $T_1$-$T_2$ 2-dimensional correlation map measured with low-field and/or intermediate-field NMR and the comparison a change in an area under the $^1H$ $T_1$-$T_2$ 2-dimensional correlation map for one selected from the group consisting of $0.1\, ms \le T_2 < 1.5\, ms$ for the nanopore volumes, $1.5\, ms \le T_2 < 30\, ms$ for the micropore volumes, $30\, ms \le T_2 < 300\, ms$ for the macropore volumes, and any combination thereof.

Another example method of the present disclosure for analyzing pore connectivity can include determining a porosity of a core sample, wherein the core sample has a permeability of 10 mD or less; taking a first NMR measurement of fluid in the core sample that is saturated; diffusionally exchanging a first fluid in the core sample in a first NMR exchange fluid, wherein (1) the first fluid is a hydrophobic fluid and the first NMR exchange fluid is a hydrophobic NMR exchange fluid or (2) the first fluid is a hydrophilic fluid and the second NMR exchange fluid is a hydrophilic NMR exchange fluid; taking a first plurality NMR measurement over time of the fluid in the core sample during diffusional exchange with the first NMR exchange fluid; analyzing a pore connectivity based on the porosity, a NMR signal to fluid volume calibration, and a comparison between the first NMR measurement and the first plurality of NMR measurements, wherein when using the hydrophobic NMR exchange fluid the pore connectivity analysis includes pore types selected from the group consisting of a nanopore oil volume, a micropore oil volume, a macropore oil volume, and any combination thereof, and wherein when using the hydrophilic NMR exchange fluid the pore connectivity analysis includes pore types selected from the group consisting of a nanopore water volume, a micropore water volume, a macropore water volume, and any combination thereof, wherein the NMR measurement is diffusometry and the comparison is a change a $T_2$- and $T_1$-relaxation corrected area under a diffusion spectrum for $1\times10^{-14}\, m^2/s < $ diffusion rate $\le 1\times10^{-11}\, m^2/s$ for nanopore volumes and/or for $1\times10^{-11}\, m^2/s < $ diffusion rate $\le 1\times10^{-9}\, m^2/s$ for micropore volumes.

Yet another example method of the present disclosure for analyzing pore connectivity can include determining a porosity of a core sample, wherein the core sample has a permeability of 10 mD or less; taking a first NMR measurement of fluid in the core sample that is saturated; diffusionally exchanging a first fluid in the core sample in a first NMR exchange fluid, wherein (1) the first fluid is a hydrophobic fluid and the first NMR exchange fluid is a hydrophobic NMR exchange fluid or (2) the first fluid is a hydrophilic fluid and the second NMR exchange fluid is a hydrophilic NMR exchange fluid; taking a first plurality NMR measurement over time of the fluid in the core sample during diffusional exchange with the first NMR exchange fluid; analyzing a pore connectivity based on the porosity, a NMR signal to fluid volume calibration, and a comparison between the first NMR measurement and the first plurality of NMR measurements, wherein when using the hydrophobic NMR exchange fluid the pore connectivity analysis includes pore types selected from the group consisting of a nanopore oil volume, a micropore oil volume, a macropore oil volume, and any combination thereof, and wherein when using the hydrophilic NMR exchange fluid the pore connectivity analysis includes pore types selected from the group consisting of a nanopore water volume, a micropore water volume, a macropore water volume, and any combination thereof, wherein the NMR measurement is $T_2$-weighted imaging and the comparison is for a change in a $T_2$- and $T_1$-relaxation corrected signal for the fluids within spatial boundaries of the core sample where the $T_2$-weight is $0.1\, ms \le T_2 < 1.5\, ms$ for the nanopore volumes, where the $T_2$-weight is $1.5\, ms \le T_2 < 30\, ms$ for the micropore volumes, and where the $T_2$-weight is for $30\, ms \le T_2 < 300\, ms$ for the macropore volumes.

Calibrating NMR Logs

One or more of the core sample attributes described herein (e.g., a porosity, a mobile oil volume, a mobile water volume, an immobile fluid volume, a nanopore oil volume, a micropore oil volume, a macropore oil volume, a nanopore water volume, a micropore water volume, a macropore water volume, a producible hydrocarbon volume, a producible oil volume, and a producible gas volume, described herein) can be used to calibrate a NMR log of a wellbore. For example, one or more core samples taken from known locations along a wellbore can be analyzed for one or more core sample attributes. Further, a NMR log of the wellbore can be measured. The NMR log data can be provided as raw data or processed data. The processed data can, for example, be provided in the form of a $T_1$-$T_2$ correlation map, hydrocarbon in place as a function of distance along the wellbore, water in place as a function of distance along the wellbore, porosity a function of distance along the wellbore, or combinations thereof. Then, the locations along the wellbore where the core samples and NMR log correspond can be identified. At those locations, the NMR data or properties derived therefrom (e.g., porosity, hydrocarbon in place, water in place, and the like) can be corrected to match the corresponding properties described herein of the core samples. Further, core sample properties not derived from the NMR log data can be added to the NMR log. For example, NMR log data for hydrocarbon in place can be calibrated to hydrocarbon concentration in the core samples using the NMR analyses described herein and then further correlated to a mobile hydrocarbon volume, which is a property that cannot be derived from NMR logs.

In another nonlimiting example, the NMR log can be used to derive a formation porosity as a function of length of the wellbore. Then, for example, the NMR log-derived formation porosity can be compared to the core sample-derived porosity at locations along the wellbore where the core samples were taken. If the two porosities are within a threshold (e.g., about 5%) for some minimum number of location then the NMR log-derived formation porosity may be considered within calibration. However, when outside a threshold at some minimum number of locations, then using some or all of the locations, a calibration factor or equation can be derived and applied to the NMR log-derived formation porosity to bring them within the threshold.

The number of core samples analyzed as a function of distance along the wellbore is dependent number of strata within the formation and the desired level of quality for the calibration. By way of nonlimiting example, 2-3 core samples per strata may provide a balance between cost (retrieval of core samples and subsequent analysis) and time and accuracy. However, as few as 1 or as many as 50 or more core samples can be taken from the strata of interest.

Artificial NMR Logs

One or more of the core sample attributes described herein (e.g., a porosity, a mobile oil volume, a mobile water volume, an immobile fluid volume, a nanopore oil volume, a micropore oil volume, a macropore oil volume, a nanopore water volume, a micropore water volume, a macropore water volume, a producible hydrocarbon volume, a producible oil volume, and a producible gas volume, described herein) can be used to produce an artificial NMR log. Here, a plurality of core samples are extracted from the formation and analyzed for one or more of the core sample attributes. The results can be plotted as the core sample attribute as a function of length along the wellbore. Then, trendlines or other modeling algorithms can be used to estimate the formation properties (or a range of formation properties) between the core sample attribute data points. The resultant plot is an artificial NMR log. Since many of the core sample attributes described herein are not measureable by conventional NMR logging techniques, these artificial NMR logs can provide additional valuable information to engineers as drilling, enhanced oil recovery, and production strategies are developed.

Any number of core samples (e.g., 2 to 100 core samples) can used to produce artificial NMR logs. Typically, when core samples are taken, a single trip downhole can yield 10 to 20 sidewall core samples and/or 1 to 5 vertical core samples. Generally, 6 to 10 core samples per 2000 ft of wellbore is suitable for producing artificial NMR logs. Although more or less core samples could also be used.

Exemplary Embodiments

A first nonlimiting exemplary embodiment is a method comprising: submerging a core sample in a NMR saturation fluid, wherein the core sample has a permeability of 10 mD or less; exposing the fluid to a vacuum while the core sample is submerged the NMR saturation fluid for a sufficient period of time to saturate the core sample; removing the vacuum while maintaining the core sample submerged the NMR saturation fluid; taking a NMR measurement of fluids in the core sample; and determining a porosity of the core sample based on a correlation between the NMR measurement and a NMR signal to fluid volume calibration. This example embodiment can optionally further include one or more of the following: Element 1: wherein the NMR measurement is $^1H$ $T_2$ relaxation times measured with low-field and/or intermediate-field NMR and the correlation is between an area under a $^1H$ $T_2$ relaxation time spectrum from 0.1 ms to 300 ms and the NMR signal to fluid volume calibration; Element 2: wherein the NMR measurement is $^1H$ $T_1/T_2$ ratio measured with low-field and/or intermediate-field NMR and the correlation is between an area under a $^1H$ $T_1/T_2$ ratio of $1 < ^1H$ $T_1/T_2$ ratio $\leq 100$ and the NMR signal to fluid volume calibration; Element 3: wherein the NMR measurement is $^1H$ $T_1$-$T_2$ 2-dimensional correlation map measured with low-field and/or intermediate-field NMR and the correlation is between an area under a $^1H$ $T_1$-$T_2$ relaxation time plot for $T_2$ of 0.1 ms to 300 ms and $T_1$ of 0.1 ms to 300 ms and the NMR signal to fluid volume calibration; Element 4: wherein the NMR measurement is imaging measured with intermediate-field and/or high-field NMR and the correlation is between a $T_2$- and $T_1$-relaxation corrected signal for the fluids within spatial boundaries of the core sample and the NMR signal to fluid volume calibration; Element 5: wherein the NMR measurement is $T_2$ NMR signal intensity as a function of refocusing delay and the correlation is between a y-value at a y-intercept of an extrapolation of the $T_2$ NMR signal intensity including x=0 and the NMR signal to fluid volume calibration; Element 6: wherein the NMR saturation fluid is a hydrophobic; Element 7: wherein the NMR saturation fluid comprises dodecane; Element 8: wherein the NMR saturation fluid comprises a mixture of synthetic paraffins; Element 9: wherein the NMR saturation fluid is a hydrophilic; Element 10: the method further comprising: taking a mass of the core sample before and after being submerging in the NMR saturation fluid; Element 11: wherein exposing the fluid to the vacuum while the core sample is submerged in the fluid is for 1 hour to 6 hours; Element 12: wherein submerging the core sample after removing the vacuum and before taking the NMR measurement is 10 minutes to 4 days; Element 13: the method further comprising: collecting the gas that elutes from the core sample while under vacuum; Element 14: the method further comprising: measuring a volume of the gas that elutes from the core sample while under vacuum; Element 15: the method further comprising: performing compositional analysis on the gas that elutes from the core sample; Element 16: the method further comprising: deriving a core sample property based on at least the porosity and the NMR measurement, wherein the core sample property is one or more selected from the group consisting of: a pore type distribution, a nanopore volume, a micropore volume, a macropore volume, and any combination thereof; Element 17: wherein the NMR measurement is a first NMR measurement; diffusionally exchanging a fluid in the core sample with a NMR exchange fluid; taking a second NMR measurement of the core sample after diffusional exchange; and deriving a core sample property based on at least the porosity and a comparison between the first NMR measurement and the second NMR measurement, wherein the core sample property is one or more selected from the group consisting of: mobile oil volume, mobile water volume, immobile hydrocarbon volume, immobile water volume, and immobile fluid volume; Element 18: the method further comprising: providing a NMR log having porosity data of a wellbore from which the core sample was extracted; calibrating the porosity data of the NMR log based on a comparison of the porosity data at a corresponding length along the wellbore to the porosity of the core sample; Element 19: the method further comprising: performing the method for a plurality of core samples; corresponding the core sample properties to the lengths along a wellbore from which the corresponding core samples were taken; and estimating a formation property corresponding to the core sample property at lengths along the wellbore between where the plurality of core samples were taken; and Element 20: the method further comprising: performing the method for a plurality of core samples; corresponding the porosities to the lengths along a wellbore from which the corresponding core samples were taken; and estimating a formation porosity at lengths along the wellbore between where the plurality of core samples were taken to produce an artificial NMR log. Examples of combinations can include, but are not limited to, two or more of Elements 1-5 in combination; two or more of Elements 6-8 in combination; Element 10 in combination with Element 9 or one or more of Elements 6-8; two or more of Elements 11-15 in combination; two or more of Elements 16-20 in combination; one or more of Elements 1-5 in combination with one or more of Elements 6-20; one or more of Elements 11-15 in combination with Element 9 or one or more of Elements 6-8; one or more of Elements 16-20 in combination with Element 9 or one or more of Elements 6-8; and one or more of Elements 11-150 in combination with one or more of Elements 16-20 and optionally in further combination with Element 9 or one or more of Elements 6-8.

A second nonlimiting exemplary embodiment is a method comprising: determining a porosity of a core sample, wherein the core sample has a permeability of 10 mD or less; saturating the core sample with a NMR saturation fluid; taking a first NMR measurement of fluids in the core sample; diffusionally exchanging a hydrophobic fluid or a hydrophilic fluid in the core sample in a hydrophobic NMR exchange fluid or a hydrophilic NMR exchange fluid, respectively; taking a second NMR measurement of the fluid in the core sample after diffusional exchange; and deriving a property of the core sample based on the porosity, a NMR signal to fluid volume calibration, a comparison between the first NMR measurement and the second NMR measurement, wherein the property of the core sample is selected from a first group consisting of a mobile oil volume, an immobile hydrocarbon volume, and a combination thereof when using the hydrophobic NMR exchange fluid or is selected from the second group consisting of a mobile water volume, an immobile water volume, and a combination thereof when using the hydrophilic NMR exchange fluid. Optionally, determining the porosity of the core sample can be according to the first nonlimiting example embodiment optionally including one or more of Elements 1-20. The second nonlimiting example embodiment optionally in combination with the first nonlimiting example embodiment can further include one or more of the following: Element 6; Element 7; Element 8; Element 9; Element 10; Element 21: wherein the NMR measurements are $^1$H $T_2$ relaxation times with low-field and/or intermediate-field NMR and the comparison is a change in an area under a $^1$H $T_2$ relaxation time spectrum from 0.1 ms to 300 ms; Element 22: wherein the NMR measurements are $^1$H $T_1/T_2$ ratio measured with low-field and/or intermediate-field NMR and the comparison is a change in an area under a $^1$H $T_1/T_2$ ratio of $1<^1$H $T_1/T_2$ ratio$<100$; Element 23: wherein the NMR measurements are $^1$H $T_1$-$T_2$ 2-dimensional correlation map measured with low-field and/or intermediate-field NMR and the comparison is a change in an area under a $^1$H $T_1$-$T_2$ relaxation time plot from $T_2$ of 0.1 ms to 300 ms and $T_1$ of 0.1 ms to 300 ms; Element 24: wherein the NMR measurements are $T_2$ NMR signal intensity as a function of refocusing delay and the comparison is in a y-value at a y-intercept of an extrapolation of the $T_2$ NMR signal intensity including x=0; Element 25: wherein the NMR measurements are imaging measured with intermediate-field and/or high-field NMR the comparison is a change in a $T_2$- and $T_1$-relaxation corrected signal for a fluid within spatial boundaries of the core sample; Element 26: wherein the hydrophobic NMR exchange fluid is diffusionally exchanged for the hydrophobic fluid in the core sample, and the method further comprise: diffusionally exchanging the hydrophilic fluid in the core sample in the hydrophilic NMR exchange fluid; taking a fourth NMR measurement of the fluid in the core sample after diffusional exchange with the hydrophilic NMR exchange fluid; deriving the mobile water volume, the immobile water volume, a mobile fluid volume, and/or an immobile fluid volume based on the porosity, the NMR signal to fluid volume calibration, and a comparison between the second NMR measurement and the fourth NMR measurement; Element 27: wherein the hydrophilic NMR exchange fluid is diffusionally exchanged for the hydrophilic fluid in the core sample, and the method further comprises diffusionally exchanging the hydrophobic fluid in the core sample in the hydrophobic NMR exchange fluid; taking a fourth NMR measurement of the fluid in the core sample after diffusional exchange with the hydrophobic NMR exchange fluid; and deriving the mobile oil volume, the immobile hydrocarbon volume, a mobile fluid volume, and/or an immobile fluid volume based on the porosity, the NMR signal to fluid volume calibration, and a comparison between the second NMR measurement and the fourth NMR measurement; Element 28: Element 26 or Element 27 and the method further comprising: determining a total volume of oil eluted from the core sample between extraction from a formation and being brought to ambient conditions; and deriving a producible oil volume based on the producible oil volume equaling the sum of the mobile oil volume and the total volume of the oil eluted from the core sample; Element 29: Element 28 and the method further comprising: measuring a gas to oil ratio in a produced fluid from a zone of a formation from which the core sample was extracted; and deriving a producible gas volume based on the producible oil volume and the gas to oil ratio; Element 30: Element 26 or Element 27 the method further comprising: determining a portion of a total volume of oil eluted from the core sample between extraction from a formation and being brought to ambient conditions; and deriving a minimum producible oil volume based on the producible oil volume equaling the sum of the mobile oil volume and the portion of the total volume of the oil eluted from the core sample; Element 31: Element 30 and the method further comprising: measuring a gas to oil ratio in a produced fluid from a zone of a formation from which the core sample was extracted; and deriving a minimum producible gas volume based on the minimum producible oil volume and the gas to oil ratio; Element 32: Element 26 or Element 27 the method further comprising: determining a total volume of water eluted from the core sample between extraction from a formation and being brought to ambient conditions; and deriving a producible water volume based on the producible water volume equaling the sum of the mobile water volume and the total volume of the water eluted from the core sample; Element 33: Element 26 or Element 27 the method further comprising: determining a portion of a total volume of water eluted from the core sample between extraction from a formation and being brought to ambient conditions; and deriving a minimum producible water volume based on the producible water volume equaling the sum of the mobile water volume and the portion of the total volume of the water eluted from the core sample; Element 34: the method further comprising:

determining a total volume of gas eluted from the core sample between extraction from a formation and being brought to ambient conditions, wherein the total volume of gas eluted is the producible gas volume; Element 35: wherein diffusionally exchanging involves submerging the core sample in at least 3 pore volumes of the hydrophobic NMR exchange fluid or the hydrophilic NMR exchange fluid for at least 5 days; Element 36: wherein diffusionally exchanging involves submerging the core sample in at least 5 pore volumes of the hydrophobic NMR exchange fluid or the hydrophilic NMR exchange fluid for at least 10 days; Element 37: wherein the hydrophobic NMR exchange fluid is selected from the group consisting of: deuterated $C_5$-$C_{20}$ hydrocarbons, chlorinated $C_5$-$C_{20}$ hydrocarbons, fluorinated $C_5$-$C_{20}$ hydrocarbons, and any combination thereof; Element 38: wherein the hydrophilic NMR exchange fluid is selected from the group consisting of: deuterated water, deuterated alcohols, deuterated glycols, chlorinated alcohols, chlorinated glycols, fluorinated alcohols, fluorinated glycols, and any combination thereof; and Element 39: the method further comprising: performing the method for a plurality of core samples; corresponding the mobile oil volume and/or the mobile water volume to the lengths along a wellbore from which the corresponding core samples were taken; and estimating a formation mobile oil volume and/or a formation mobile water volume at lengths along the wellbore between where the plurality of core samples were taken to produce an artificial NMR log. Examples of combinations can include, but are not limited to, Element 10 in combination with Element 9 or one or more of Elements 6-8; two or more of Elements 21-25 in combination; one or more of Elements 21-25 in combination with Element 9 or one or more of Elements 6-8 and optionally in further combination with Element 10; one or more of Elements 21-25 in combination with one or more of Elements 26-39; Element 26 or Element 27 in combination with one or more of Elements 28-34 and optionally in further combination with one or more of Elements 35-39; and Element 26 or Element 27 in combination with one or more of Elements 35-39.

A third nonlimiting exemplary embodiment is a method comprising: determining a porosity of a core sample, wherein the core sample has a permeability of 10 mD or less; saturating the core sample with a NMR saturation fluid to achieve a saturated core sample; taking a NMR measurement of fluids in the saturated core sample; and deriving a volume for a pore type based on the porosity based on a correlation between the NMR measurement and a NMR signal to fluid volume calibration, wherein the pore type is selected from the group consisting of a nanopore, a micropore, a macropore, and any combination thereof. Optionally, determining the porosity of the core sample can be according to the first nonlimiting example embodiment optionally including one or more of Elements 1-20. The second nonlimiting example embodiment optionally in combination with the first nonlimiting example embodiment can further include one or more of the following: Element 6; Element 7; Element 8; Element 9; Element 10; Element 40: wherein the NMR measurement is $^1$H $T_1/T_2$ ratio measured with low-field and/or intermediate-field NMR and the correlation is between the NMR signal to fluid volume calibration and the $^1$H $T_1/T_2$ ratio for one selected from the group consisting of $10 \leq {}^1$H $T_1/T_2 < 100$ for the nanopores, $3 \leq {}^1$H $T_1/T_2 < 10$ for the micropores, $1 \leq {}^1$H $T_1/T_2 < 3$ for the macropores, and any combination thereof; Element 41: wherein the NMR measurement is $^1$H $T_2$ relaxation times measured with low-field and/or intermediate-field NMR and the correlation is between the NMR signal to fluid volume calibration and an area under a $^1$H $T_2$ relaxation time spectrum for one selected from the group consisting of $0.1$ ms$\leq T_2 < 1.5$ ms for the nanopores, $1.5$ ms$\leq T_2 < 30$ ms for the micropores, $30$ ms$\leq T_2 < 300$ ms for the macropores, and any combination thereof; Element 42: wherein the NMR measurement is $^1$H $T_1$-$T_2$ 2-dimensional correlation map measured with low-field and/or intermediate-field NMR and the correlation is between the NMR signal to fluid volume calibration and an area under the $^1$H $T_1$-$T_2$ 2-dimensional correlation map for one selected from the group consisting of $0.1$ ms$\leq T_2 < 1.5$ ms for the nanopores, $1.5$ ms$\leq T_2 < 30$ ms for the micropores, $30$ ms$\leq T_2 < 300$ ms for the macropores, and any combination thereof; Element 43: wherein the NMR measurement is diffusometry and the correlation is between the NMR signal to fluid volume calibration and a $T_2$- and $T_1$-relaxation corrected area under a diffusion spectrum for $1\times10^{-14}$ m$^2$/s$<$diffusion rate$\leq 1\times10^{-11}$ m$^2$/s for nanopores and/or for $1\times10^{-11}$ m$^2$/s$<$diffusion rate$\leq 1\times10^{-9}$ m$^2$/s for micropores; Element 44: wherein the NMR measurement is $T_2$-weighted imaging and the correlation is between the NMR signal to fluid volume calibration and a $T_2$- and $T_1$-relaxation corrected signal for the fluids within spatial boundaries of the core sample where the $T_2$-weight is $0.1$ ms$\leq T_2 < 1.5$ ms for the nanopores, where the $T_2$-weight is $1.5$ ms$\leq T_2 < 30$ ms for the micropores, and where the $T_2$-weight is for $30$ ms$\leq T_2 < 300$ ms for the macropores; and Element 45: the method further comprising: performing the method for a plurality of core samples; corresponding the nanopore oil volume, the micropore oil volume, the macropore oil volume, the nanopore water volume, the micropore water volume, the macropore water volume, or any combination thereof to the lengths along a wellbore from which the corresponding core samples were taken; and estimating a formation nanopore oil volume, a formation micropore oil volume, a formation macropore oil volume, a formation nanopore water volume, a formation micropore water volume, a formation macropore water volume, or any combination thereof at lengths along the wellbore between where the plurality of core samples were taken to produce an artificial NMR log. Examples of combinations include, but are not limited to, Element 10 in combination with Element 9 or one or more of Elements 6-8; two or more of Elements 40-44 in combination; one or more of Elements 40-44 in combination with Element 9 or one or more of Elements 6-8 and optionally in further combination with Element 10; and Element 45 in combination with one or more of Elements 40-44 optionally in further combination with Element 9 or one or more of Elements 6-8 and optionally in further combination with Element 10.

A fourth nonlimiting exemplary embodiment is a method comprising: determining a porosity of a core sample, wherein the core sample has a permeability of 10 mD or less; taking a first NMR measurement of fluid in the core sample that is saturated; diffusionally exchanging a first fluid in the core sample in a first NMR exchange fluid, wherein (1) the first fluid is a hydrophobic fluid and the first NMR exchange fluid is a hydrophobic NMR exchange fluid or (2) the first fluid is a hydrophilic fluid and the second NMR exchange fluid is a hydrophilic NMR exchange fluid; taking a first plurality NMR measurement over time of the fluid in the core sample during diffusional exchange with the first NMR exchange fluid; analyzing a pore connectivity based on the porosity, a NMR signal to fluid volume calibration, and a comparison between the first NMR measurement and the first plurality of NMR measurements, wherein when using the hydrophobic NMR exchange fluid the pore connectivity analysis includes pore types selected from the group consisting of a nanopore oil volume, a micropore oil volume, a macropore oil volume, and any combination thereof, and wherein when using the hydrophilic NMR exchange fluid the pore connectivity analysis includes pore types selected from the group consisting of a nanopore water volume, a micropore water volume, a macropore water volume, and any combination thereof. Optionally, determining the porosity of the core sample can be according to the first nonlimiting example embodiment optionally including one or more of Elements 1-20. The second nonlimiting example embodiment optionally in combination with the first nonlimiting example embodiment can further include one or more of the following: Element 6; Element 7; Element 8; Element 9; Element 10; Element 35; Element 36; Element 37; Element 38; Element 46: wherein the NMR measurements are a $^1$H $T_1/T_2$ ratio measured with low-field and/or intermediate-field NMR and the comparison is a change in the $^1$H $T_1/T_2$ ratio for one selected from the group consisting of $10 \leq {}^1$H $T_1/T_2 < 100$ for the nanopore volumes, $3 \leq {}^1$H $T_1/T_2 < 10$ for the micropore volumes, $1 \leq {}^1$H $T_1/T_2 < 3$ for the macropore volumes, and any combination thereof; Element 47: wherein the NMR measurements are $^1$H $T_2$ relaxation times measured with low-field and/or intermediate-field NMR and the comparison is a change in an area under a $^1$H $T_2$ relaxation time spectrum for one selected from the group consisting of $0.1 \text{ ms} \leq T_2 < 1.5 \text{ ms}$ for the nanopore volumes, $1.5 \text{ ms} \leq T_2 < 30$ ms for the micropore volumes, $30 \text{ ms} \leq T_2 < 300$ ms for the macropore volumes, and any combination thereof; Element 48: wherein the NMR measurements are $^1$H $T_1$-$T_2$ 2-dimensional correlation map measured with low-field and/or intermediate-field NMR and the comparison a change in an area under the $^1$H $T_1$-$T_2$ 2-dimensional correlation map for one selected from the group consisting of $0.1 \text{ ms} \leq T_2 < 1.5$ ms for the nanopore volumes, $1.5 \text{ ms} \leq T_2 < 30$ ms for the micropore volumes, $30 \text{ ms} \leq T_2 < 300$ ms for the macropore volumes, and any combination thereof; Element 49: wherein the NMR measurements are diffusometry and the comparison is a change a $T_2$- and $T_1$-relaxation corrected area under a diffusion spectrum for $1 \times 10^{-14} \text{ m}^2/\text{s} <$ diffusion rate $\leq 1 \times 10^{-11} \text{ m}^2/\text{s}$ for nanopore volumes and/or for $1 \times 10^{-11} \text{ m}^2/\text{s} <$ diffusion rate $\leq 1 \times 10^{-9} \text{ m}^2/\text{s}$ for micropore volumes; Element 50: wherein the NMR measurements are $T_2$-weighted imaging and the comparison is for a change in a $T_2$- and $T_1$-relaxation corrected signal for the fluids within spatial boundaries of the core sample where the $T_2$-weight is $0.1 \text{ ms} \leq T_2 < 1.5$ ms for the nanopore volumes, where the $T_2$-weight is $1.5 \text{ ms} \leq T_2 < 30$ ms for the micropore volumes, and where the $T_2$-weight is for $30 \text{ ms} \leq T_2 < 300$ ms for the macropore volumes; Element 51: wherein the hydrophobic NMR exchange fluid is diffusionally exchanged for the hydrophobic fluid in the core sample, and the method further comprises: diffusionally exchanging the hydrophilic fluid in the core sample in the hydrophilic NMR exchange fluid; taking a second plurality of NMR measurements of the fluid in the core sample during diffusional exchange with the hydrophilic fluid; and deriving the pore connectivity analysis that further includes pore types selected from the group consisting of a nanopore water volume, a micropore water volume, a macropore water volume, and any combination thereof based on the porosity and a comparison between at least one of the first plurality of NMR measurements and the second plurality of NMR measurements; Element 52: wherein the hydrophilic NMR exchange fluid is diffusionally exchanged for the hydrophilic fluid in the core sample, and the method further comprises: diffusionally exchanging the hydrophobic fluid in the core sample in the hydrophobic NMR exchange fluid; taking a second plurality of NMR measurements of the fluid in the core sample during diffusional exchange with the hydrophobic fluid; and deriving the pore connectivity analysis that further includes pore types selected from the group consisting of a nanopore oil volume, a micropore oil volume, a macropore oil volume, and any combination thereof based on the porosity and a comparison between at least one of the first plurality of NMR measurements and the second plurality of NMR measurements; and Element 53: performing the method for a plurality of core samples; corresponding the pore connectivity analysis to the lengths along a wellbore from which the corresponding core samples were taken; and estimating a formation pore connectivity at lengths along the wellbore between where the plurality of core samples were taken to produce an artificial NMR log. Examples of combinations include, but are not limited to, Element 10 in combination with Element 9 or one or more of Elements 6-8; two or more of Elements 46-50 in combination; one or more of Elements 46-50 in combination with Element 9 or one or more of Elements 6-8 and optionally in further combination with Element 10; two or more of Elements 35-38 in combination; one or more of Elements 46-50 in combination with one or more of Elements 35-38 in combination; one or more of Elements 35-38 in in combination with Element 9 or one or more of Elements 6-8 and optionally in further combination with Element 10; Element 51 or Element 52 in combination with one or more of Elements 35-38 in combination; Element 51 or Element 52 in in combination with Element 9 or one or more of Elements 6-8 and optionally in further combination with Element 10; Element 51 or Element 52 in combination with one or more of Elements 46-50; Element 53 in combination with one or more of Elements 35-38 in combination; Element 53 in in combination with Element 9 or one or more of Elements 6-8 and optionally in further combination with Element 10; and Element 53 in combination with one or more of Elements 46-50.

A fifth nonlimiting exemplary embodiment is a method comprising: determining a porosity of a core sample, wherein the core sample has a permeability of 100 mD or less; saturating the core sample with a NMR saturation fluid to achieve a saturated core sample; taking a first NMR measurement of the fluid in the saturated core sample; diffusionally exchanging a first fluid in the core sample in a first NMR exchange fluid, wherein (1) the first fluid is a hydrophobic fluid and the first NMR exchange fluid is a hydrophobic NMR exchange fluid or (2) the first fluid is a hydrophilic fluid and the second NMR exchange fluid is a hydrophilic NMR exchange fluid; taking a second NMR measurement of the fluid in the core sample after diffusional exchange; and deriving a property of the core sample based on the porosity, a NMR signal to fluid volume calibration, and a comparison between the first NMR measurement and the second NMR measurement, wherein when using the hydrophobic NMR exchange fluid the property is selected from the group consisting of a mobile nanopore oil volume, an immobile nanopore oil volume, a mobile micropore oil volume, an immobile micropore oil volume, a mobile macropore oil volume, an immobile macropore oil volume, and any combination thereof, and wherein when using a hydrophilic NMR exchange fluid the property is selected from the group consisting of a mobile nanopore water volume, an immobile nanopore water volume, a mobile micropore water volume, an immobile micropore water volume, a mobile macropore water volume, an immobile macropore water volume, and any combination thereof. Optionally, determining the porosity of the core sample can be according to the first nonlimiting example embodiment optionally including one or more of Elements 1-20. The second nonlimiting example embodiment optionally in combination with the first nonlimiting example embodiment can further include one or more of the following: Element 6; Element 7; Element 8; Element 9; Element 10; Element 35; Element 36; Element 37; Element 38; Element 54: wherein the NMR measurements are a $^1H$ $T_1/T_2$ ratio measured with low-field and/or intermediate-field NMR and the comparison is a change in the $^1H$ $T_1/T_2$ ratio for one selected from the group consisting of $10 \leq {}^1H$ $T_1/T_2 < 100$ for the nanopore volumes, $3 \leq {}^1H$ $T_1/T_2 < 10$ for the micropore volumes, $1 \leq {}^1H$ $T_1/T_2 < 3$ for the macropore volumes, and any combination thereof; Element 55: wherein the NMR measurements are $^1H$ $T_2$ relaxation times measured with low-field and/or intermediate-field NMR and the comparison is a change in an area under a $^1H$ $T_2$ relaxation time spectrum for one selected from the group consisting of 0.1 ms$\leq T_2 <$1.5 ms for the nanopore volumes, 1.5 ms$\leq T_2 <$30 ms for the micropore volumes, 30 ms$\leq T_2 <$300 ms for the macropore volumes, and any combination thereof; Element 56: wherein the NMR measurements are $^1H$ $T_1$-$T_2$ 2-dimensional correlation map measured with low-field and/or intermediate-field NMR and the comparison a change in an area under the $^1H$ $T_1$-$T_2$ 2-dimensional correlation map for one selected from the group consisting of 0.1 ms$\leq T_2 <$1.5 ms for the nanopore volumes, 1.5 ms$\leq T_2 <$30 ms for the micropore volumes, 30 ms$\leq T_2 <$300 ms for the macropore volumes, and any combination thereof; Element 57: wherein the NMR measurements are diffusometry and the comparison is a change a $T_2$- and $T_1$-relaxation corrected area under a diffusion spectrum for $1 \times 10^{-14}$ m$^2$/s<diffusion rate$\leq 1 \times 10^{-11}$ m$^2$/s for nanopore volumes and/or for $1 \times 10^{-11}$ m$^2$/s<diffusion rate$\leq 1 \times 10^{-9}$ m$^2$/s for micropore volumes; Element 58: wherein the NMR measurements are $T_2$-weighted imaging and the comparison is for a change in a $T_2$- and $T_1$-relaxation corrected signal for the fluids within spatial boundaries of the core sample where the $T_2$-weight is 0.1 ms$\leq T_2 <$1.5 ms for the nanopore volumes, where the $T_2$-weight is 1.5 ms$\leq T_2 <$30 ms for the micropore volumes, and where the $T_2$-weight is for 30 ms$\leq T_2 <$300 ms for the macropore volumes; Element 59: wherein the hydrophobic NMR exchange fluid is diffusionally exchanged for the hydrophobic fluid in the core sample, and wherein the method further comprises: diffusionally exchanging the hydrophilic fluid in the core sample in the hydrophilic NMR exchange fluid; taking a third NMR measurement of the fluid in the core sample during diffusional exchange with the hydrophilic fluid; and deriving the property is selected from the group consisting of the mobile nanopore water volume, the immobile nanopore water volume, the mobile micropore water volume, the immobile micropore water volume, the mobile macropore water volume, the immobile macropore water volume, and any combination thereof based on the porosity, the NMR signal to fluid volume calibration, and a comparison between the second NMR measurements and the third NMR measurement; and Element 60: wherein the hydrophilic NMR exchange fluid is diffusionally exchanged for the hydrophilic fluid in the core sample, and the method further comprises: diffusionally exchanging the hydrophobic fluid in the core sample in the hydrophobic NMR exchange fluid; taking a third NMR measurement of the fluid in the core sample during diffusional exchange with the hydrophobic fluid; and deriving the property is selected from the group consisting of the mobile nanopore oil volume, the immobile nanopore oil volume, the mobile micropore oil volume, the immobile micropore oil volume, the mobile macropore oil volume, the immobile macropore oil volume, and any combination thereof based on the porosity, the NMR signal to fluid volume calibration, and a comparison between at least one of the first NMR measurement and the third NMR measurement. Examples of combinations include, but are not limited to, Element 10 in combination with Element 9 or one or more of Elements 6-8; two or more of Elements 54-58 in combination; one or more of Elements 54-58 in combination with Element 9 or one or more of Elements 6-8 and optionally in further combination with Element 10; two or more of Elements 35-38 in combination; one or more of Elements 54-58 in combination with one or more of Elements 35-38 in combination; one or more of Elements 35-38 in in combination with Element 9 or one or more of Elements 6-8 and optionally in further combination with Element 10; Element 59 or Element 60 in combination with one or more of Elements 35-38 in combination; Element 59 or Element 60 in in combination with Element 9 or one or more of Elements 6-8 and optionally in further combination with Element 10; and Element 59 or Element 60 in combination with one or more of Elements 54-58.

Embodiment A1 is a method comprising: submerging a core sample in a NMR saturation fluid, wherein the core sample has a permeability of 10 mD or less; pulling a vacuum on the fluid while the core sample is submerged the NMR saturation fluid for a sufficient period of time to saturate the core sample; removing the vacuum while maintaining the core sample submerged the NMR saturation fluid; taking a NMR measurement of fluids in the core sample; and determining a porosity of the core sample based on a correlation between the NMR measurement and a NMR signal to fluid volume calibration. Embodiment A2 is the method of Embodiment A1, wherein the NMR measurement is $^1H$ $T_2$ relaxation times measured with low-field and/or intermediate-field NMR and the correlation is between an area under a $^1H$ $T_2$ relaxation time spectrum from 0.1 ms to 300 ms and the NMR signal to fluid volume calibration. Embodiment A3 is the method of Embodiment A1, wherein the NMR measurement is $^1H$ $T_1/T_2$ ratio measured with low-field and/or intermediate-field NMR and the correlation is between an area under a $^1H$ $T_1/T_2$ ratio of $1 \leq {}^1H$ $T_1/T_2$ ratio<100 and the NMR signal to fluid volume calibration. Embodiment A4 is the method of Embodiment A1, wherein the NMR measurement is $^1H$ $T_1$-$T_2$ 2-dimensional correlation map measured with low-field and/or intermediate-field NMR and the correlation is between an area under a $^1H$ $T_1$-$T_2$ relaxation time plot for $T_2$ of 0.1 ms to 300 ms and $T_1$ of 0.1 ms to 300 ms and the NMR signal to fluid volume calibration. Embodiment A5 is the method of Embodiment A1, wherein the NMR measurement is imaging measured with intermediate-field and/or high-field NMR and the correlation is between a $T_2$- and $T_1$-relaxation corrected signal for the fluids within spatial boundaries of the core sample and the NMR signal to fluid volume calibration. Embodiment A6 is the method of Embodiment A1, wherein the NMR measurement is $T_2$ NMR signal intensity as a function of refocusing delay and the correlation is between a y-value at a y-intercept of an extrapolation of the $T_2$ NMR signal intensity including x=0 and the NMR signal to fluid volume calibration. Embodiment A7 is the method of any preceding Embodiment A#, wherein the NMR saturation fluid comprises dodecane. Embodiment A8 is the method of any preceding Embodiment A#, wherein the NMR saturation fluid comprises a mixture of synthetic paraffins. Embodiment A9 is the method of any preceding Embodiment A#, wherein the NMR saturation fluid is hydrophobic. Embodiment A10 is the method of one of Embodiments A1-A6, wherein the NMR saturation fluid is hydrophilic. Embodiment A11 is the method of any preceding Embodiment A# further comprising: taking a mass of the core sample before and after being submerging in the NMR saturation fluid. Embodiment A12 is the method of any preceding Embodiment A#, wherein pulling the vacuum while the core sample is submerged in the fluid is for 1 hour to 6 hours. Embodiment A13 is the method of any preceding Embodiment A#, wherein submerging the core sample after removing the vacuum and before taking the NMR measurement is 10 minutes to 4 days. Embodiment A14 is the method of any preceding Embodiment A# further comprising: collecting the gas that elutes from the core sample while under vacuum. Embodiment A15 is the method of any preceding Embodiment A# further comprising: measuring a volume of the gas that elutes from the core sample while under vacuum. Embodiment A16 is the method of any preceding Embodiment A# further comprising: performing compositional analysis on the gas that elutes from the core sample. Embodiment A17 is the method of any preceding Embodiment A# further comprising: deriving a core sample property based on at least the porosity and the NMR measurement, wherein the core sample property is one or more selected from the group consisting of: a pore type distribution, a nanopore volume, a micropore volume, a macropore volume, and any combination thereof. Embodiment A18 is the method of any preceding Embodiment A# further comprising: wherein the NMR measurement is a first NMR measurement; diffusionally exchanging a fluid in the core sample with a NMR exchange fluid; taking a second NMR measurement of the core sample after diffusional exchange; and deriving a core sample property based on at least the porosity and a comparison between the first NMR measurement and the second NMR measurement, wherein the core sample property is one or more selected from the group consisting of: mobile oil volume, mobile water volume, immobile hydrocarbon volume, immobile water volume, and immobile fluid volume. Embodiment A19 is the method of any preceding Embodiment A# further comprising: providing an NMR log having porosity data of a wellbore from which the core sample was extracted; and calibrating the porosity data of the NMR log based on a comparison of the porosity data at a corresponding length along the wellbore to the porosity of the core sample. Embodiment A20 is the method of Embodiment A19 further comprising: performing the method for a plurality of core samples; corresponding the core sample properties to the lengths along a wellbore from which the corresponding core samples were taken; and estimating a formation property corresponding to the core sample property at lengths along the wellbore between where the plurality of core samples were taken. Embodiment A21 is the method of any preceding Embodiment A# further comprising: performing the method for a plurality of core samples; corresponding the porosities to the lengths along a wellbore from which the corresponding core samples were taken; and estimating a formation porosity at lengths along the wellbore between where the plurality of core samples were taken to produce an artificial NMR log.

Embodiment B1 is a method comprising: determining a porosity of a core sample, wherein the core sample has a permeability of 10 mD or less; saturating the core sample with a NMR saturation fluid; taking a first NMR measurement of fluids in the core sample; diffusionally exchanging a hydrophobic fluid or a hydrophilic fluid in the core sample in a hydrophobic NMR exchange fluid or a hydrophilic NMR exchange fluid, respectively; taking a second NMR measurement of the fluid in the core sample after diffusional exchange; deriving a property of the core sample based on the porosity, a NMR signal to fluid volume calibration, a comparison between the first NMR measurement and the second NMR measurement, wherein the property of the core sample is selected from a first group consisting of a mobile oil volume, an immobile hydrocarbon volume, and a combination thereof when using the hydrophobic NMR exchange fluid or is selected from the second group consisting of a mobile water volume, an immobile water volume, and a combination thereof when using the hydrophilic NMR exchange fluid. Embodiment B2 is the method of Embodiment B1, wherein the NMR measurement is $^1H$ $T_2$ relaxation times with low-field and/or intermediate-field NMR and the comparison is a change in an area under a $^1H$ $T_2$ relaxation time spectrum from 0.1 ms to 300 ms. Embodiment B3 is the method of Embodiment B1, wherein the NMR measurement is $^1H$ $T_1/T_2$ ratio measured a with low-field and/or intermediate-field NMR and the comparison is a change in an area under a $^1H$ $T_1/T_2$ ratio of $1 \leq {}^1H$ $T_1/T_2$ ratio<100. Embodiment B4 is the method of Embodiment B1, wherein the NMR measurement is $^1H$ $T_1$-$T_2$ 2-dimensional correlation map measured with low-field and/or intermediate-field NMR and the comparison is a change in an area under a $^1H$ $T_1$-$T_2$ relaxation time plot from $T_2$ of 0.1 ms to 300 ms and $T_1$ of 0.1 ms to 300 ms. Embodiment B5 is the method of Embodiment B1, wherein the NMR measurement is $T_2$ NMR signal intensity as a function of refocusing delay and the comparison is in a y-value at a y-intercept of an extrapolation of the $T_2$ NMR signal intensity including x=0. Embodiment B6 is the method of Embodiment B1, wherein the NMR measurement is imaging measured with intermediate-field and/or high-field NMR the comparison is a change in a $T_2$- and $T_1$-relaxation corrected signal for a fluid within spatial boundaries of the core sample. Embodiment B7 is the method of any preceding Embodiments B#, wherein determining the porosity of the core sample comprises: submerging the core sample in a saturation fluid; pulling a vacuum on the fluid while the core sample is submerged the fluid for a sufficient period of time where visible bubbles of gas no longer elutes from the core sample; removing the vacuum while maintaining the core sample submerged the fluid; taking a third NMR measurement of the core sample; and correlating the third NMR measurement to a porosity of the core sample. Embodiment B8 is the method of one of Embodiments B1-B7, wherein the hydrophobic NMR exchange fluid is diffusionally exchanged for the hydrophobic fluid in the core sample. Embodiment B9 is the method of Embodiment B8 further comprising: diffusionally exchanging the hydrophilic fluid in the core sample in the hydrophilic NMR exchange fluid; taking a fourth NMR measurement of the fluid in the core sample after diffusional exchange with the hydrophilic NMR exchange fluid; deriving the mobile water volume, the immobile water volume, a mobile fluid volume, and/or an immobile fluid volume based on the porosity, the NMR signal to fluid volume calibration, and a comparison between the second NMR measurement and the fourth NMR measurement. Embodiment B10 is the method of one of Embodiments B1-B7 further comprising: wherein the hydrophilic NMR exchange fluid is diffusionally exchanged for the hydrophilic fluid in the core sample. Embodiment B11 is the method of Embodiment B10 further comprising: diffusionally exchanging the hydrophobic fluid in the core sample in the hydrophobic NMR exchange fluid; taking a fourth NMR measurement of the fluid in the core sample after diffusional exchange with the hydrophobic NMR exchange fluid; and deriving the mobile oil volume, the immobile hydrocarbon volume, a mobile fluid volume, and/or an immobile fluid volume based on the porosity, the NMR signal to fluid volume calibration, and a comparison between the second NMR measurement and the fourth NMR measurement. Embodiment B12 is the method of Embodiment B9 or B11 further comprising: determining a total volume of oil eluted from the core sample between extraction from a formation and being brought to ambient conditions; and deriving a producible oil volume based on the producible oil volume equaling the sum of the mobile oil volume and the total volume of the oil eluted from the core sample. Embodiment B13 is the method of Embodiment B12 further comprising: measuring a gas to oil ratio in a produced fluid from a zone of a formation from which the core sample was extracted; and deriving a producible gas volume based on the producible oil volume and the gas to oil ratio. Embodiment B14 is the method of Embodiment B9 or B11 further comprising: determining a portion of a total volume of oil eluted from the core sample between extraction from a formation and being brought to ambient conditions; and deriving a minimum producible oil volume based on the producible oil volume equaling the sum of the mobile oil volume and the portion of the total volume of the oil eluted from the core sample. Embodiment B15 is the method of Embodiment B14 further comprising: measuring a gas to oil ratio in a produced fluid from a zone of a formation from which the core sample was extracted; and deriving a minimum producible gas volume based on the minimum producible oil volume and the gas to oil ratio. Embodiment B16 is the method of Embodiment B9 or B11 further comprising: determining a total volume of water eluted from the core sample between extraction from a formation and being brought to ambient conditions; and deriving a producible water volume based on the producible water volume equaling the sum of the mobile water volume and the total volume of the water eluted from the core sample. Embodiment B17 is the method of Embodiment B9 or B11 further comprising: determining a portion of a total volume of water eluted from the core sample between extraction from a formation and being brought to ambient conditions; and deriving a minimum producible water volume based on the producible water volume equaling the sum of the mobile water volume and the portion of the total volume of the water eluted from the core sample. Embodiment B18 is the method of any preceding Embodiment B# further comprising: determining a total volume of gas eluted from the core sample between extraction from a formation and being brought to ambient conditions, wherein the total volume of gas eluted is the producible gas volume. Embodiment B19 is the method of any preceding Embodiment B#, wherein diffusionally exchanging involves submerging the core sample in at least 3 pore volumes of the hydrophobic NMR exchange fluid or the hydrophilic NMR exchange fluid for at least 5 days. Embodiment B20 is the method of any preceding Embodiment B#, wherein diffusionally exchanging involves submerging the core sample in at least 5 pore volumes of the hydrophobic NMR exchange fluid or the hydrophilic NMR exchange fluid for at least 10 days. Embodiment B21 is the method of any preceding Embodiment B#, wherein the hydrophobic NMR exchange fluid is selected from the group consisting of: deuterated $C_5$-$C_{20}$ hydrocarbons, chlorinated $C_5$-$C_{20}$ hydrocarbons, fluorinated $C_5$-$C_{20}$ hydrocarbons, and any combination thereof. Embodiment B22 is the method of any preceding Embodiment B# further comprising: performing the method for a plurality of core samples; corresponding the mobile oil volume and/or the mobile water volume to the lengths along a wellbore from which the corresponding core samples were taken; and estimating a formation mobile oil volume and/or a formation mobile water volume at lengths along the wellbore between where the plurality of core samples were taken to produce an artificial NMR log.

Embodiment C1 is a method comprising: determining a porosity of a core sample, wherein the core sample has a permeability of 10 milliDarcy (mD) or less; saturating the core sample with a nuclear magnetic resonance (NMR) saturation fluid to achieve a saturated core sample; taking a NMR measurement of fluids in the saturated core sample; and deriving a volume for a pore type based on the porosity based on a correlation between the NMR measurement and a NMR signal to fluid volume calibration, wherein the pore type is selected from the group consisting of a nanopore, a micropore, a macropore, and any combination thereof. Embodiment C2 is the method of Embodiment C1, wherein the NMR measurement is $^1H$ $T_1/T_2$ ratio measured with low-field and/or intermediate-field NMR and the correlation is between the NMR signal to fluid volume calibration and the $^1H$ $T_1/T_2$ ratio for one selected from the group consisting of 10≤$^1H$ $T_1/T_2$<100 for the nanopores, 3≤$^1H$ $T_1/T_2$<10 for the micropores, 1≤$^1H$ $T_1/T_2$<3 for the macropores, and any combination thereof. Embodiment C4 is the method of Embodiment C1, wherein the NMR measurement is $^1H$ $T_2$ relaxation times measured with low-field and/or intermediate-field NMR and the correlation is between the NMR signal to fluid volume calibration and an area under a $^1H$ $T_2$ relaxation time spectrum for one selected from the group consisting of 0.1 ms≤$T_2$<1.5 ms for the nanopores, 1.5 ms≤$T_2$<30 ms for the micropores, 30 ms≤$T_2$<300 ms for the macropores, and any combination thereof. Embodiment C5 is the method of Embodiment C1, wherein the NMR measurement is $^1H$ $T_1$-$T_2$ 2-dimensional correlation map measured with low-field and/or intermediate-field NMR and the correlation is between the NMR signal to fluid volume calibration and an area under the $^1H$ $T_1$-$T_2$ 2-dimensional correlation map for one selected from the group consisting of 0.1 ms≤$T_2$<1.5 ms for the nanopores, 1.5 ms≤$T_2$<30 ms for the micropores, 30 ms≤$T_2$<300 ms for the macropores, and any combination thereof. Embodiment C6 is the method of Embodiment C1, wherein the NMR measurement is diffusometry and the correlation is between the NMR signal to fluid volume calibration and a $T_2$- and $T_1$-relaxation corrected area under a diffusion spectrum for $1 \times 10^{-14}$ $m^2/s$<diffusion rate≤$1 \times 10^{-11}$ $m^2/s$ for nanopores and/or for $1 \times 10^{-11}$ $m^2/s$<diffusion rate≤$1 \times 10^{-9}$ $m^2/s$ for micropores. Embodiment C7 is the method of Embodiment C1, wherein the NMR measurement is $T_2$-weighted imaging and the correlation is between the NMR signal to fluid volume calibration and a $T_2$- and $T_1$-relaxation corrected signal for the fluids within spatial boundaries of the core sample where the $T_2$-weight is 0.1 ms≤$T_2$<1.5 ms for the nanopores, where the $T_2$-weight is 1.5 ms≤$T_2$<30 ms for the micropores, and where the $T_2$-weight is for 30 ms≤$T_2$<300 ms for the macropores. Embodiment C8 is the method of any preceding Embodiment C# further comprising: performing the method for a plurality of core samples; corresponding the nanopore oil volume, the micropore oil volume, the macropore oil volume, the nanopore water volume, the micropore water volume, the macropore water volume, or any combination thereof to the lengths along a wellbore from which the corresponding core samples were taken; and estimating a formation nanopore oil volume, a formation micropore oil volume, a formation macropore oil volume, a formation nanopore water volume, a formation micropore water volume, a formation macropore water volume, or any combination thereof at lengths along the wellbore between where the plurality of core samples were taken to produce an artificial NMR log. Embodiment C9 is the method of any preceding Embodiment, wherein the NMR saturation fluid comprises dodecane. Embodiment C10 is the method of any preceding Embodiment C#, wherein the NMR saturation fluid comprises a mixture of synthetic paraffins. Embodiment C11 is the method of any preceding Embodiment C#, wherein the NMR saturation fluid is hydrophobic. Embodiment C12 is the method of any one of Embodiments C1-C8, wherein the NMR saturation fluid is hydrophilic. Embodiment C13 is a method comprising: determining a porosity of a core sample, wherein the core sample has a permeability of 10 milliDarcy (mD) or less; taking a first nuclear magnetic resonance (NMR) measurement of fluid in the core sample that is saturated; diffusionally exchanging a first fluid in the core sample in a first NMR exchange fluid, wherein (1) the first fluid is a hydrophobic fluid and the first NMR exchange fluid is a hydrophobic NMR exchange fluid or (2) the first fluid is hydrophilic fluid and the second NMR exchange fluid is hydrophilic NMR exchange fluid; taking a first plurality NMR measurement over time of the fluid in the core sample during diffusional exchange with the first NMR exchange fluid; analyzing a pore connectivity based on the porosity, a NMR signal to fluid volume calibration, and a comparison between the first NMR measurement and the first plurality of NMR measurements, wherein when using the hydrophobic NMR exchange fluid the pore connectivity analysis includes pore types selected from the group consisting of a nanopore oil volume, a micropore oil volume, a macropore oil volume, and any combination thereof, and wherein when using the hydrophilic NMR exchange fluid the pore connectivity analysis includes pore types selected from the group consisting of a nanopore water volume, a micropore water volume, a macropore water volume, and any combination thereof. Embodiment C14 is the method of Embodiment C13, wherein the NMR measurement is a $^1$H $T_1/T_2$ ratio measured with low-field and/or intermediate-field NMR and the comparison is a change in the $^1$H $T_1/T_2$ ratio for one selected from the group consisting of $10 \leq {}^1$H $T_1/T_2 <100$ for the nanopore volumes, $3 \leq {}^1$H $T_1/T_2 <10$ for the micropore volumes, $1 \leq {}^1$H $T_1/T_2 <3$ for the macropore volumes, and any combination thereof. Embodiment C15 is the method of Embodiment C13, wherein the NMR measurement is $^1$H $T_2$ relaxation times measured with low-field and/or intermediate-field NMR and the comparison is a change in an area under a $^1$H $T_2$ relaxation time spectrum for one selected from the group consisting of 0.1 ms$\leq T_2 <$1.5 ms for the nanopore volumes, 1.5 ms$\leq T_2 <$30 ms for the micropore volumes, 30 ms$\leq T_2 <$300 ms for the macropore volumes, and any combination thereof. Embodiment C16 is the method of Embodiment C13, wherein the NMR measurement is $^1$H $T_1$-$T_2$ 2-dimensional correlation map measured with low-field and/or intermediate-field NMR and the comparison a change in an area under the $^1$H $T_1$-$T_2$ 2-dimensional correlation map for one selected from the group consisting of 0.1 ms$\leq T_2 <$1.5 ms for the nanopore volumes, 1.5 ms$\leq T_2 <$30 ms for the micropore volumes, 30 ms$\leq T_2 <$300 ms for the macropore volumes, and any combination thereof. Embodiment C17 is the method of Embodiment C13, wherein the NMR measurement is diffusometry and the comparison is a change a $T_2$- and $T_1$-relaxation corrected area under a diffusion spectrum for $1\times 10^{-14}$ m$^2$/s$<$diffusion rate$\leq 1\times 10^{-11}$ m$^2$/s for nanopore volumes and/or for $1\times 10^{-11}$ m$^2$/s$<$diffusion rate$\leq 1\times 10^{-9}$ m$^2$/s for micropore volumes. Embodiment C18 is the method of Embodiment C13, wherein the NMR measurement is $T_2$-weighted imaging and the comparison is for a change in a $T_2$- and $T_1$-relaxation corrected signal for the fluids within spatial boundaries of the core sample where the $T_2$-weight is 0.1 ms$\leq T_2 <$1.5 ms for the nanopore volumes, where the $T_2$-weight is 1.5 ms$\leq T_2 <$30 ms for the micropore volumes, and where the $T_2$-weight is for 30 ms$\leq T_2 <$300 ms for the macropore volumes. Embodiment C19 is the method of one of Embodiments C13-C18, wherein the hydrophobic NMR exchange fluid is diffusionally exchanged for the hydrophobic fluid in the core sample. Embodiment C20 is the method of Embodiment C19 further comprising: diffusionally exchanging the hydrophilic fluid in the core sample in the hydrophilic NMR exchange fluid; taking a second plurality of NMR measurements of the fluid in the core sample during diffusional exchange with the hydrophilic fluid; deriving the pore connectivity analysis that further includes pore types selected from the group consisting of a nanopore water volume, a micropore water volume, a macropore water volume, and any combination thereof based on the porosity and a comparison between at least one of the first plurality of NMR measurements and the second plurality of NMR measurements. Embodiment C21 is the method of one of Embodiments C13-C18 further comprising: wherein the hydrophilic NMR exchange fluid is diffusionally exchanged for the hydrophilic fluid in the core sample. Embodiment C22 is the method of Embodiment C21 further comprising: diffusionally exchanging the hydrophobic fluid in the core sample in the hydrophobic NMR exchange fluid; taking a second plurality of NMR measurements of the fluid in the core sample during diffusional exchange with the hydrophobic fluid; and deriving the pore connectivity analysis that further includes pore types selected from the group consisting of a nanopore oil volume, a micropore oil volume, a macropore oil volume, and any combination thereof based on the porosity and a comparison between at least one of the first plurality of NMR measurements and the second plurality of NMR measurements. Embodiment C23 is the method of one of Embodiments C13-C22 further comprising: performing the method for a plurality of core samples; corresponding the pore connectivity analysis to the lengths along a wellbore from which the corresponding core samples were taken; and estimating a formation pore connectivity at lengths along the wellbore between where the plurality of core samples were taken to produce an artificial NMR log. Embodiment C24 is a method comprising: determining a porosity of a core sample, wherein the core sample has a permeability of 100 mD or less; saturating the core sample with a NMR saturation fluid to achieve a saturated core sample; taking a first NMR measurement of the fluid in the saturated core sample; diffusionally exchanging a first fluid in the core sample in a first NMR exchange fluid, wherein (1) the first fluid is a hydrophobic fluid and the first NMR exchange fluid is a hydrophobic NMR exchange fluid or (2) the first fluid is hydrophilic fluid and the second NMR exchange fluid is hydrophilic NMR exchange fluid; taking a second NMR measurement of the fluid in the core sample after diffusional exchange; deriving a property of the core sample based on the porosity, a NMR signal to fluid volume calibration, and a comparison between the first NMR measurement and the second NMR measurement, wherein when using the hydrophobic NMR exchange fluid the property is selected from the group consisting of a mobile nanopore oil volume, an immobile nanopore oil volume, a mobile micropore oil volume, an immobile micropore oil volume, a mobile macropore oil volume, an immobile macropore oil volume, and any combination thereof, and wherein when using a hydrophilic NMR exchange fluid the property is selected from the group consisting of a mobile nanopore water volume, an immobile nanopore water volume, a mobile micropore water volume, an immobile micropore water volume, a mobile macropore water volume, an immobile macropore water volume, and any combination thereof. Embodiment C25 is the method of Embodiment C24, wherein the NMR measurement is a $^1$H $T_1/T_2$ ratio measured with low-field and/or intermediate-field NMR and the comparison is a change in the $^1$H $T_1/T_2$ ratio for one selected from the group consisting of $10 \leq {}^1\text{H } T_1/T_2 < 100$ for the nanopore volumes, $3 \leq {}^1\text{H } T_1/T_2 < 10$ for the micropore volumes, $1 \leq {}^1\text{H } T_1/T_2 < 3$ for the macropore volumes, and any combination thereof. Embodiment C26 is the method of Embodiment C24, wherein the NMR measurement is $^1$H $T_2$ relaxation times measured with low-field and/or intermediate-field NMR and the comparison is a change in an area under a $^1$H $T_2$ relaxation time spectrum for one selected from the group consisting of $0.1 \text{ ms} \leq T_2 < 1.5 \text{ ms}$ for the nanopore volumes, $1.5 \text{ ms} \leq T_2 \leq 30 \text{ ms}$ for the micropore volumes, $30 \text{ ms} \leq T_2 < 300 \text{ ms}$ for the macropore volumes, and any combination thereof. Embodiment C27 is the method of Embodiment C24, wherein the NMR measurement is $^1$H $T_1$-$T_2$ 2-dimensional correlation map measured with low-field and/or intermediate-field NMR and the comparison a change in an area under the $^1$H $T_1$-$T_2$ 2-dimensional correlation map for one selected from the group consisting of $0.1 \text{ ms} \leq T_2 < 1.5 \text{ ms}$ for the nanopore volumes, $1.5 \text{ ms} \leq T_2 < 30 \text{ ms}$ for the micropore volumes, $30 \text{ ms} \leq T_2 < 300 \text{ ms}$ for the macropore volumes, and any combination thereof. Embodiment C28 is the method of Embodiment C24, wherein the NMR measurement is diffusometry and the comparison is a change a $T_2$- and $T_1$-relaxation corrected area under a diffusion spectrum for $1 \times 10^{-14} \text{ m}^2/\text{s} < \text{diffusion rate} \leq 1 \times 10^{-11} \text{ m}^2/\text{s}$ for nanopore volumes and/or for $1 \times 10^{-11} \text{ m}^2/\text{s} < \text{diffusion rate} \leq 1 \times 10^{-9} \text{ m}^2/\text{s}$ for micropore volumes. Embodiment C29 is the method of Embodiment C24, wherein the NMR measurement is $T_2$-weighted imaging and the comparison is for a change in a $T_2$- and $T_1$-relaxation corrected signal for the fluids within spatial boundaries of the core sample where the $T_2$-weight is $0.1 \text{ ms} \leq T_2 < 1.5 \text{ ms}$ for the nanopore volumes, where the $T_2$-weight is $1.5 \text{ ms} \leq T_2 < 30 \text{ ms}$ for the micropore volumes, and where the $T_2$-weight is for $30 \text{ ms} \leq T_2 < 300 \text{ ms}$ for the macropore volumes. Embodiment C30 is the method of one of Embodiments C24-C29, wherein the hydrophobic NMR exchange fluid is diffusionally exchanged for the hydrophobic fluid in the core sample. Embodiment C31 is the method of Embodiment C30 further comprising: diffusionally exchanging the hydrophilic fluid in the core sample in the hydrophilic NMR exchange fluid; taking a third NMR measurement of the fluid in the core sample during diffusional exchange with the hydrophilic fluid; and deriving the property is selected from the group consisting of the mobile nanopore water volume, the immobile nanopore water volume, the mobile micropore water volume, the immobile micropore water volume, the mobile macropore water volume, the immobile macropore water volume, and any combination thereof based on the porosity, the NMR signal to fluid volume calibration, and a comparison between the second NMR measurements and the third NMR measurement. Embodiment C32 is the method of one of Embodiments C24-C29, wherein the hydrophilic NMR exchange fluid is diffusionally exchanged for the hydrophilic fluid in the core sample. Embodiment C33 is the method of Embodiment C32 further comprising: diffusionally exchanging the hydrophobic fluid in the core sample in the hydrophobic NMR exchange fluid; taking a third NMR measurement of the fluid in the core sample during diffusional exchange with the hydrophobic fluid; and deriving the property is selected from the group consisting of the mobile nanopore oil volume, the immobile nanopore oil volume, the mobile micropore oil volume, the immobile micropore oil volume, the mobile macropore oil volume, the immobile macropore oil volume, and any combination thereof based on the porosity, the NMR signal to fluid volume calibration, and a comparison between at least one of the first NMR measurement and the third NMR measurement.

Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention. At the very least, and not as an attempt to limit the application of the doctrine of equivalents to the scope of the claim, each numerical parameter should at least be construed in light of the number of reported significant digits and by applying ordinary rounding techniques.

One or more illustrative embodiments incorporating the invention embodiments disclosed herein are presented herein. Not all features of a physical implementation are described or shown in this application for the sake of clarity. It is understood that in the development of a physical embodiment incorporating the embodiments of the present invention, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for those of ordinary skill in the art and having benefit of this disclosure.

While compositions and methods are described herein in terms of "comprising" various components or steps, the compositions and methods can also "consist essentially of" or "consist of" the various components and steps.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. The invention illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

The invention claimed is:

1. A method comprising:
   determining a porosity of a core sample, wherein the core sample has a permeability of 10 milliDarcy (mD) or less;
   saturating the core sample with a nuclear magnetic resonance (NMR) saturation fluid;
   taking a first NMR measurement of fluids in the core sample;
   diffusionally exchanging a hydrophobic fluid or a hydrophilic fluid in the core sample in a hydrophobic NMR exchange fluid or a hydrophilic NMR exchange fluid, respectively;
   taking a second NMR measurement of the fluid in the core sample after diffusional exchange; and
   deriving a property of the core sample based on the porosity, a NMR signal to fluid volume calibration, a comparison between the first NMR measurement and a second NMR measurement, wherein the property of the core sample is selected from a first group consisting of a mobile oil volume, an immobile hydrocarbon volume, and a combination thereof when using the hydrophobic NMR exchange fluid or is selected from the second group consisting of a mobile water volume, an immobile water volume, and a combination thereof when using the hydrophilic NMR exchange fluid.

2. The method of claim 1, wherein the NMR measurements are $^1H$ $T_2$ relaxation times with low-field and/or intermediate-field NMR and the comparison is a change in an area under a $^1H$ $T_2$ relaxation time spectrum from 0.1 ms to 300 ms.

3. The method of claim 1, wherein the NMR measurements are $^1H$ $T_1/T_2$ ratio measured with low-field and/or intermediate-field NMR and the comparison is a change in an area under a $^1H$ $T_1/T_2$ ratio of $1 < ^1H$ $T_1/T_2$ ratio $\leq 100$.

4. The method of claim 1, wherein the NMR measurements are $^1H$ $T_1$-$T_2$ 2-dimensional correlation map measured with low-field and/or intermediate-field NMR and the comparison is a change in an area under a $^1H$ $T_1$-$T_2$ relaxation time plot from $T_2$ of 0.1 ms to 300 ms and $T_1$ of 0.1 ms to 300 ms.

5. The method of claim 1, wherein the NMR measurements are $T_2$ NMR signal intensity as a function of refocusing delay and the comparison is in a y-value at a y-intercept of an extrapolation of the $T_2$ NMR signal intensity including x=0.

6. The method of claim 1, wherein the NMR measurements are imaging measured with intermediate-field and/or high-field NMR and the comparison is a change in a $T_2$- and $T_1$-relaxation corrected signal for a fluid within spatial boundaries of the core sample.

7. The method of claim 1, wherein determining the porosity of the core sample comprises:
   submerging the core sample in a saturation fluid;
   exposing the fluid to a vacuum while the core sample is submerged in the fluid for a sufficient period of time where visible bubbles of gas no longer elutes from the core sample;
   removing the vacuum while maintaining the core sample submerged in the fluid;
   taking a third NMR measurement of the core sample; and
   correlating the third NMR measurement to the porosity of the core sample.

8. The method of claim 1, wherein the hydrophobic NMR exchange fluid is diffusionally exchanged for the hydrophobic fluid in the core sample.

9. The method of claim 8 further comprising:
   diffusionally exchanging the hydrophilic fluid in the core sample in the hydrophilic NMR exchange fluid;
   taking a fourth NMR measurement of the fluid in the core sample after diffusional exchange with the hydrophilic NMR exchange fluid;
   deriving the mobile water volume, the immobile water volume, a mobile fluid volume of the fluid, and/or an immobile fluid volume of the fluid based on the porosity, the NMR signal to fluid volume calibration, and a comparison between the second NMR measurement and the fourth NMR measurement.

10. The method of claim 9 further comprising:
    determining a total volume of oil eluted from the core sample between extraction from a formation and being brought to ambient conditions; and
    deriving a producible oil volume based on the producible oil volume equaling the sum of the mobile oil volume and the total volume of the oil eluted from the core sample.

11. The method of claim 10 further comprising:
    measuring a gas to oil ratio in a produced fluid from a zone of a formation from which the core sample was extracted; and
    deriving a producible gas volume based on the producible oil volume and the gas to oil ratio.

12. The method of claim 9 further comprising:
    determining a portion of a total volume of oil eluted from the core sample between extraction from a formation and being brought to ambient conditions; and
    deriving a minimum producible oil volume based on the producible oil volume equaling the sum of the mobile oil volume and the portion of the total volume of the oil eluted from the core sample.

13. The method of claim 12 further comprising:
    measuring a gas to oil ratio in a produced fluid from a zone of a formation from which the core sample was extracted; and
    deriving a minimum producible gas volume based on the minimum producible oil volume and the gas to oil ratio.

14. The method of claim 9 further comprising:
    determining a total volume of water eluted from the core sample between extraction from a formation and being brought to ambient conditions; and
    deriving a producible water volume based on the producible water volume equaling the sum of the mobile water volume and the total volume of the water eluted from the core sample.

15. The method of claim 9 further comprising:
    determining a portion of a total volume of water eluted from the core sample between extraction from a formation and being brought to ambient conditions; and
    deriving a minimum producible water volume based on the producible water volume equaling the sum of the mobile water volume and the portion of the total volume of the water eluted from the core sample.

16. The method of claim 1, further comprising:
    wherein the hydrophilic NMR exchange fluid is diffusionally exchanged for the hydrophilic fluid in the core sample.

17. The method of claim 16 further comprising:
diffusionally exchanging the hydrophobic fluid in the core sample in the hydrophobic NMR exchange fluid;
taking a fourth NMR measurement of the fluid in the core sample after diffusional exchange with the hydrophobic NMR exchange fluid;
deriving the mobile oil volume, the immobile hydrocarbon volume, a mobile fluid volume of the fluid, and/or an immobile fluid volume of the fluid based on the porosity, the NMR signal to fluid volume calibration, and a comparison between the second NMR measurement and the fourth NMR measurement.

18. The method of claim 1 further comprising:
determining a total volume of gas eluted from the core sample between extraction from a formation and being brought to ambient conditions, wherein the total volume of gas eluted is a producible gas volume.

19. The method of claim 1, wherein diffusionally exchanging involves submerging the core sample in at least 3 pore volumes of the hydrophobic NMR exchange fluid or the hydrophilic NMR exchange fluid for at least 5 days.

20. The method of claim 1, wherein diffusionally exchanging involves submerging the core sample in at least 5 pore volumes of the hydrophobic NMR exchange fluid or the hydrophilic NMR exchange fluid for at least 10 days.

21. The method of claim 1, wherein the hydrophobic NMR exchange fluid is selected from a group consisting of: deuterated $C_5$-$C_{20}$ hydrocarbons, chlorinated $C_5$-$C_{20}$ hydrocarbons, fluorinated $C_5$-$C_{20}$ hydrocarbons, and any combination thereof.

22. The method of claim 1 further comprising:
performing the method for a plurality of core samples;
corresponding the mobile oil volume and/or the mobile water volume to lengths along a wellbore from which the corresponding core samples were taken; and
estimating a formation mobile oil volume and/or a formation mobile water volume at the lengths along the wellbore between where the plurality of core samples were taken to produce an artificial NMR log.

* * * * *